(12) United States Patent
Koike et al.

(10) Patent No.: US 11,915,928 B2
(45) Date of Patent: Feb. 27, 2024

(54) SEMICONDUCTOR MEMORY DEVICE AND METHOD OF MANUFACTURING THE SAME

(71) Applicant: Kioxia Corporation, Tokyo (JP)

(72) Inventors: Masahiro Koike, Yokkaichi (JP); Masao Shingu, Yokkaichi (JP); Masaya Ichikawa, Yokkaichi (JP)

(73) Assignee: Kioxia Corporation, Tokyo (JP)

( * ) Notice: Subject to any disclaimer, the term of this patent is extended or adjusted under 35 U.S.C. 154(b) by 270 days.

(21) Appl. No.: 17/472,470

(22) Filed: Sep. 10, 2021

(65) Prior Publication Data

US 2022/0301869 A1    Sep. 22, 2022

(30) Foreign Application Priority Data

Mar. 22, 2021 (JP) ................. 2021-047984

(51) Int. Cl.
| | | |
|---|---|---|
| *H01L 21/02* | (2006.01) | |
| *H01L 29/26* | (2006.01) | |
| *H10B 41/10* | (2023.01) | |
| *H10B 41/35* | (2023.01) | |
| *H10B 43/10* | (2023.01) | |

(Continued)

(52) U.S. Cl.
CPC .... *H01L 21/02532* (2013.01); *H01L 21/0217* (2013.01); *H01L 21/02164* (2013.01); *H01L 21/8221* (2013.01); *H01L 29/263* (2013.01); *H10B 41/10* (2023.02); *H10B 41/27* (2023.02);

(Continued)

(58) Field of Classification Search
CPC ......... H01L 21/02532; H01L 21/02164; H01L 21/0217; H01L 21/02123; H01L 29/263; H01L 29/42324; H01L 29/4941; H01L 29/43; H01L 2924/1434; H10B 41/10; H10B 41/30; H10B 43/10; H10B 43/35; H10B 43/27; H10B 43/00; H10B 43/30; G11C 11/5621; G11C 16/02

See application file for complete search history.

(56) References Cited

U.S. PATENT DOCUMENTS 4,732,801 A    3/1988  Joshi
9,780,116 B2  10/2017  Masuda et al.
(Continued)

FOREIGN PATENT DOCUMENTS

JP    5-48935 B2    7/1993

*Primary Examiner* — Amar Movva
*Assistant Examiner* — Sandra Milena Rodriguez Villanu
(74) *Attorney, Agent, or Firm* — Oblon, McClelland, Maier & Neustadt, L.L.P.

(57) ABSTRACT

A semiconductor memory device includes a first conductive layer, a semiconductor layer extending in a first direction and being opposed to the first conductive layer, and a gate insulating film disposed between the first conductive layer and the semiconductor layer. The first conductive layer includes a first region, a second region disposed between the first region and the gate insulating film, and a third region disposed between the first region and the first interlayer insulating layer. The first to the third regions contain a metal. The third region contains silicon (Si). The first region does not contain silicon (Si) or has a lower silicon (Si) content than a silicon (Si) content in the third region. The second region does not contain silicon (Si) or has a lower silicon (Si) content than the silicon (Si) content in the third region.

7 Claims, 52 Drawing Sheets

(51) Int. Cl.
    *H10B 43/35* (2023.01)
    *H01L 21/822* (2006.01)
    *H10B 41/27* (2023.01)

(52) U.S. Cl.
    CPC .............. *H10B 41/35* (2023.02); *H10B 43/10* (2023.02); *H10B 43/35* (2023.02)

(56) References Cited

U.S. PATENT DOCUMENTS

| | | |
|---|---|---|
| 9,793,139 B2 | 10/2017 | Sharangpani et al. |
| 9,978,685 B2 | 5/2018 | Chen et al. |
| 10,930,493 B2 | 2/2021 | Roy et al. |
| 2018/0033646 A1 | 2/2018 | Sharangpani et al. |
| 2020/0083239 A1* | 3/2020 | Komiya ................ H10B 43/27 |
| 2020/0312724 A1* | 10/2020 | Moon ................ H01L 29/7926 |

* cited by examiner

SEMICONDUCTOR MEMORY DEVICE AND METHOD OF MANUFACTURING THE SAME

CROSS-REFERENCE TO RELATED APPLICATIONS

This application is based upon and claims the benefit of Japanese Patent Application No. 2021-047984, filed on Mar. 22, 2021, the entire contents of which are incorporated herein by reference.

BACKGROUND

Field

Embodiments described herein relates to a semiconductor memory device and a method of manufacturing the same.

Description of the Related Art

There has been known a semiconductor memory device that includes a plurality of conductive layers and a plurality of interlayer insulating layers alternately arranged in a first direction, a semiconductor layer extending in the first direction and opposed to a plurality of conductive layers, and a gate insulating layer disposed between the plurality of conductive layers and the semiconductor layer. The gate insulating layer includes a memory unit possible to store data of, for example, an insulating electric charge accumulating layer of, for example, silicon nitride ($Si_3N_4$), and a conductive electric charge accumulating layer, such as a floating gate.

DETAILED DESCRIPTION

Figure 1:
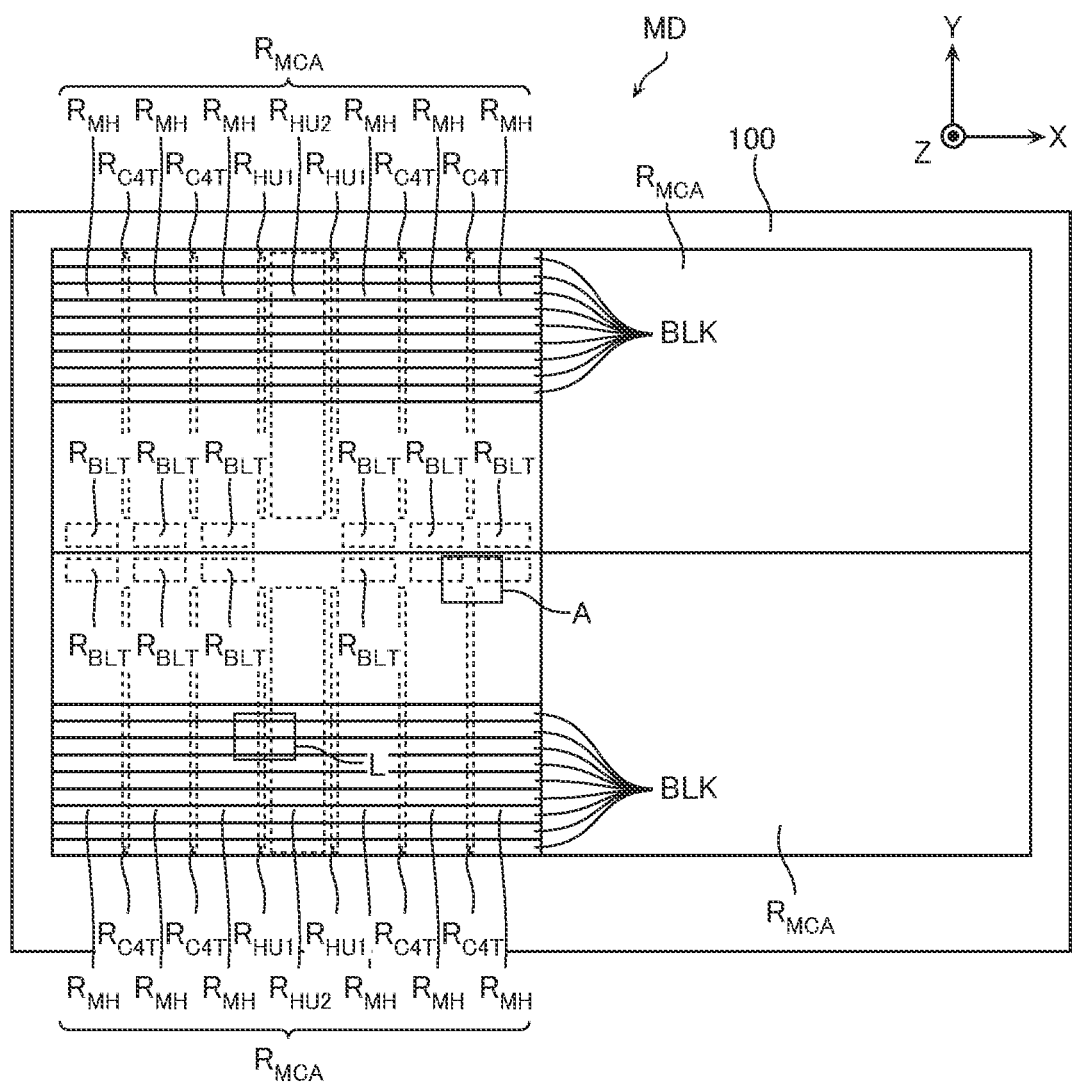
FIG. 1 is a schematic plan view of a semiconductor memory device according to a first embodiment.

A semiconductor memory device according to one embodiment comprises: a plurality of conductive layers and a plurality of interlayer insulating layers alternately arranged in a first direction; a semiconductor layer extending in the first direction and being opposed to the plurality of conductive layers; and a gate insulating film disposed between the plurality of conductive layers and the semiconductor layer. The plurality of interlayer insulating layers include a first interlayer insulating layer and a second interlayer insulating layer adjacent in the first direction. The plurality of conductive layers include a first conductive layer disposed between the first interlayer insulating layer and the second interlayer insulating layer. The first conductive layer includes: a first region; a second region disposed between the first region and the gate insulating film; and a third region disposed between the first region and the first interlayer insulating layer. The first region to the third region contain a metal. The third region contains silicon (Si). The first region does not contain silicon (Si) or has a lower silicon (Si) content than a silicon (Si) content in the third region. The second region does not contain silicon (Si) or has a lower silicon (Si) content than the silicon (Si) content in the third region.

Next, the semiconductor memory devices according to embodiments are described in detail with reference to the drawings. The following embodiments are only examples, and not described for the purpose of limiting the present invention. The following drawings are schematic, and for convenience of description, a part of a configuration and the like is sometimes omitted. Parts common in a plurality of embodiments are attached by same reference numerals and their descriptions may be omitted.

In this specification, when referring to a "semiconductor memory device", it may mean a memory die and may mean a memory system including a controller die, such as a memory chip, a memory card, and a Solid State Drive (SSD). Further, it may mean a configuration including a host computer, such as a smartphone, a tablet terminal, and a personal computer.

In this specification, a direction parallel to an upper surface of the substrate is referred to as an X-direction, a direction parallel to the upper surface of the substrate and perpendicular to the X-direction is referred to as a Y-direction, and a direction perpendicular to the upper surface of the substrate is referred to as a Z-direction.

In this specification, a direction along a predetermined plane may be referred to as a first direction, a direction along this predetermined plane and intersecting with the first direction may be referred to as a second direction, and a direction intersecting with this predetermined plane may be referred to as a third direction. These first direction, second direction, and third direction may each correspond to any of the X-direction, the Y-direction, and the Z-direction and need not correspond to these directions.

Expressions such as "above" and "below" in this specification are based on the substrate. For example, a direction away from the substrate along the Z-direction is referred to as above and a direction approaching the substrate along the Z-direction is referred to as below. A lower surface and a lower end of a certain configuration mean a surface and an end portion at the substrate side of this configuration. An upper surface and an upper end of a certain configuration mean a surface and an end portion at a side opposite to the substrate of this configuration. A surface intersecting with the X-direction or the Y-direction is referred to as a side surface and the like.

In this specification, when referring to a "width", a "length", a "thickness", or the like of a configuration, a member, or the like in a predetermined direction, this may mean a width, a length, a thickness, or the like in a cross-sectional surface or the like observed with a Scanning electron microscopy (SEM), a Transmission electron microscopy (TEM), or the like.

Also, in this specification, when referring to a "content", it may mean the ratio of atom counts constituting a certain member.

First Embodiment

[Configuration]

Figure 2:
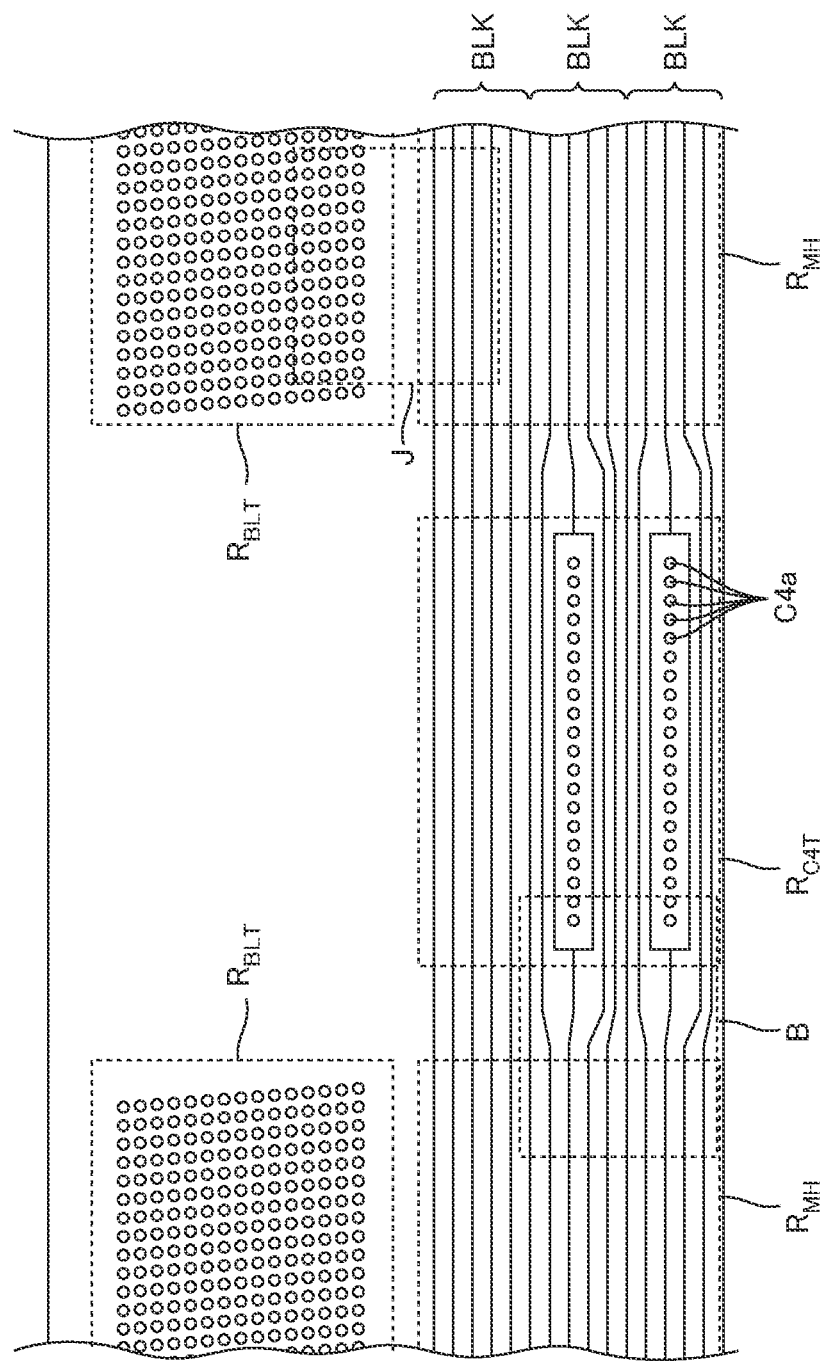
FIG. 2 is a schematic enlarged view of a part indicated by A in FIG. 1.
Figure 3:
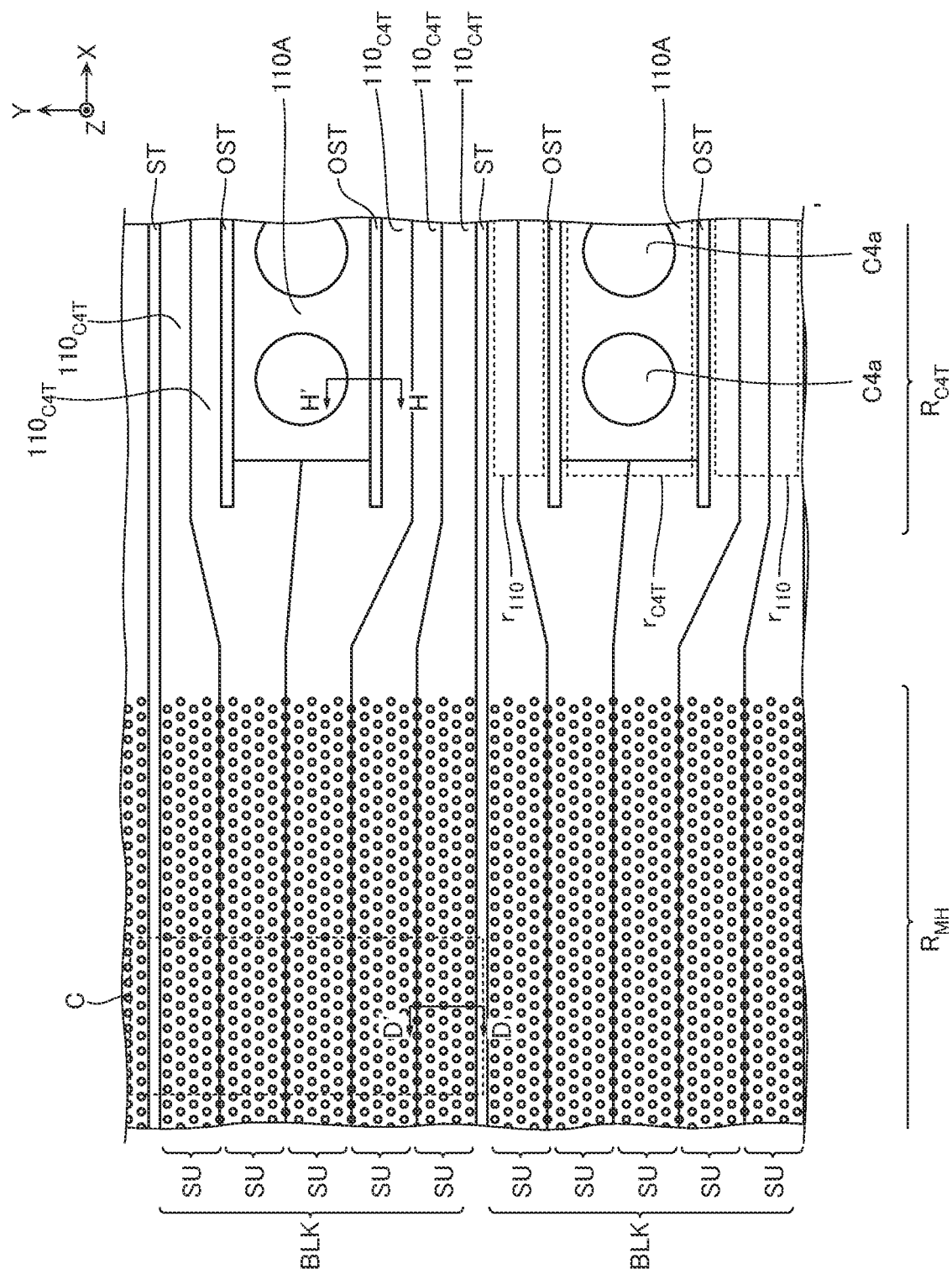
FIG. 3 is a schematic enlarged view of a part indicated by B in FIG. 2.
Figure 4:
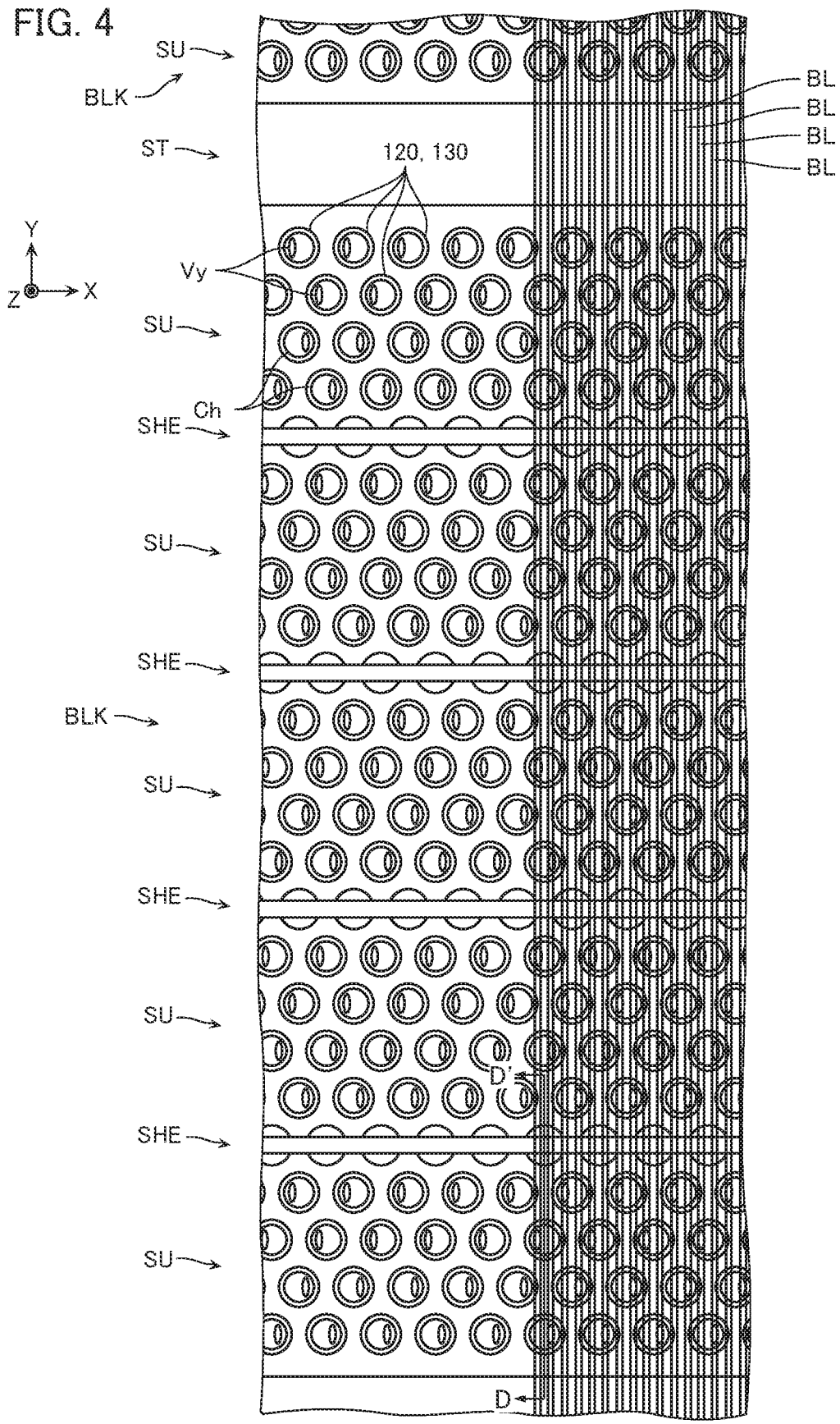
FIG. 4 is a schematic enlarged view of a part indicated by C in FIG. 3.
Figure 5:
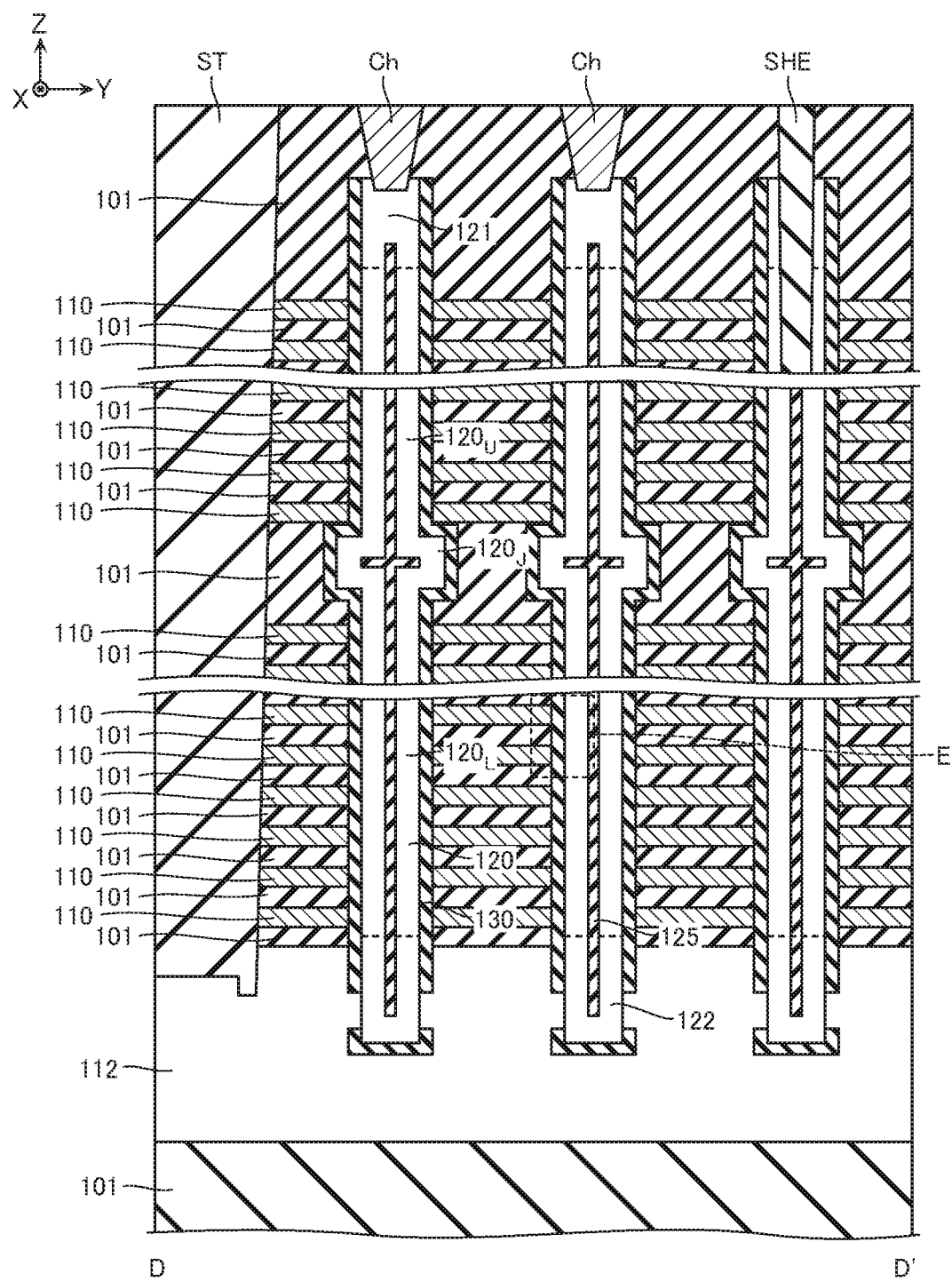
FIG. 5 is a schematic cross-sectional view of the structure illustrated in FIG. 4 taken along the line D-D' and viewed in the arrow direction.
Figure 6:
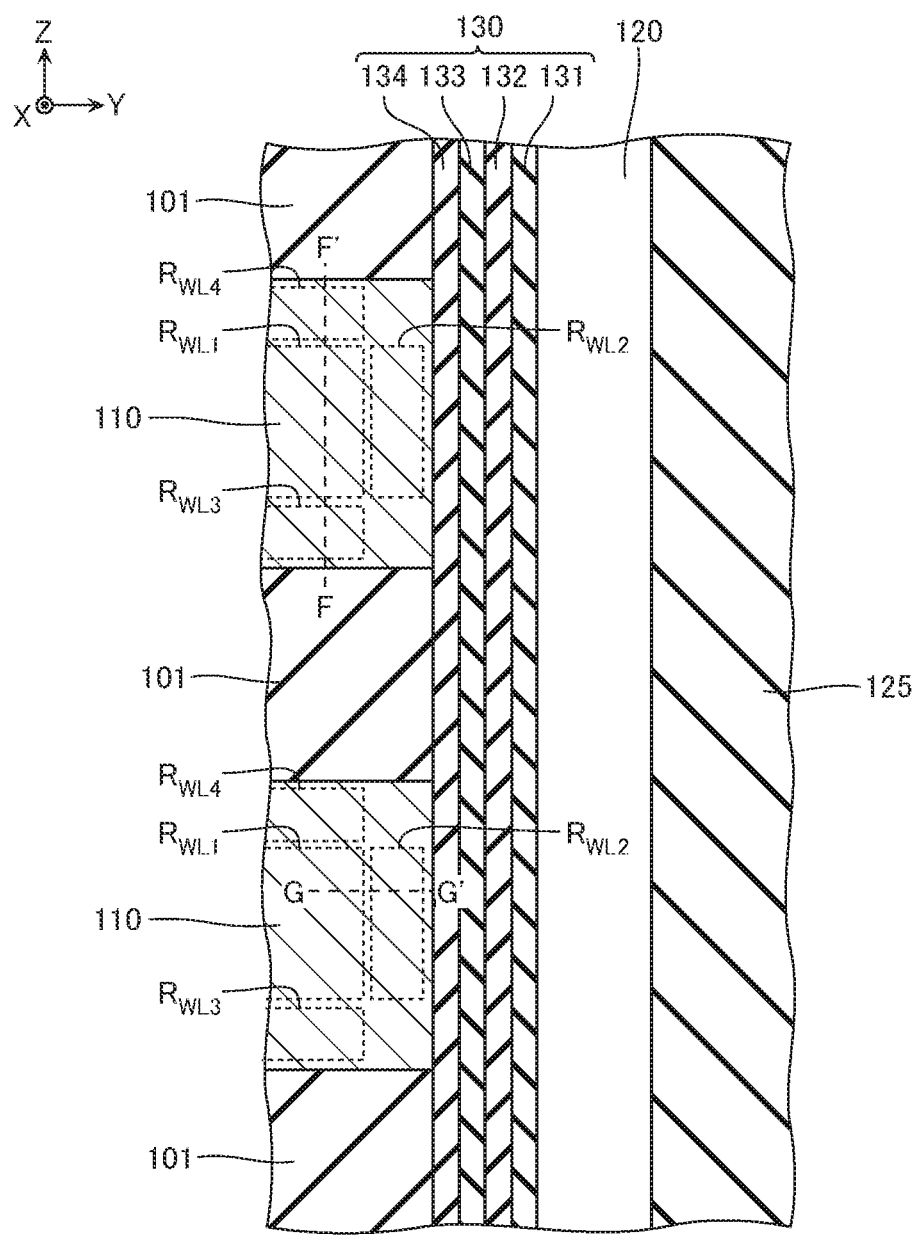
FIG. 6 is a schematic enlarged view of a part indicated by E in FIG. 5.
Figure 7:
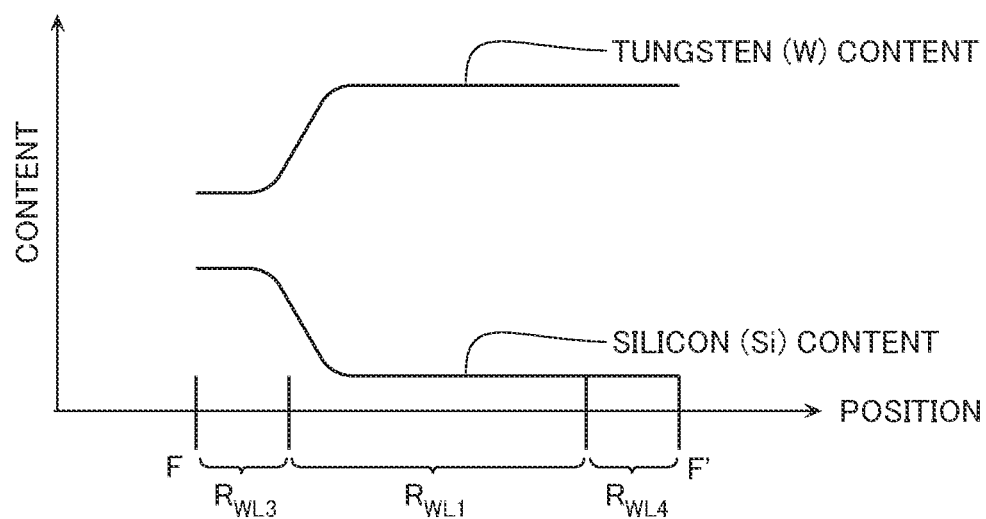
FIG. 7 is a schematic graph showing contents of components contained in a part of the structure along the line F-F' illustrated in FIG. 6.
Figure 8:
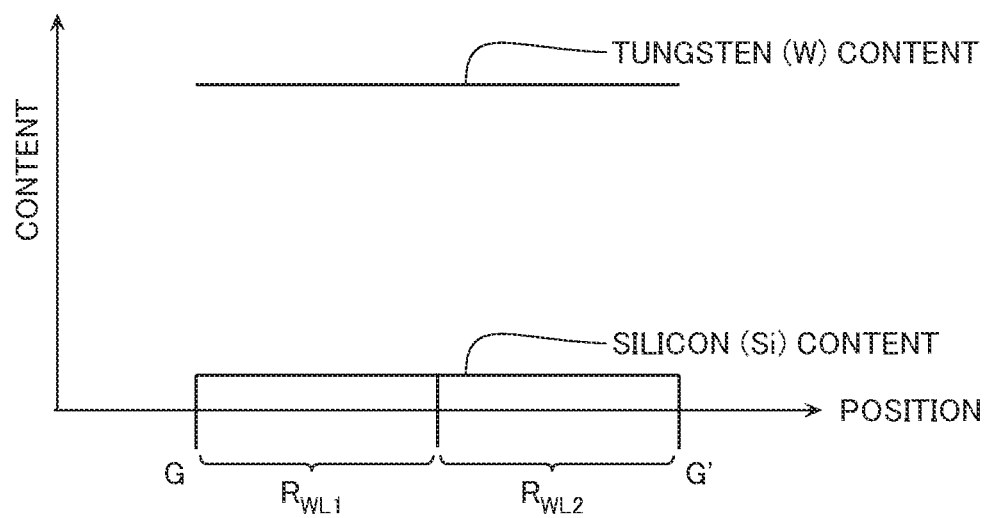
FIG. 8 is a schematic graph showing contents of components contained in a part of the structure along the line G-G' illustrated in FIG. 6.
Figure 9:
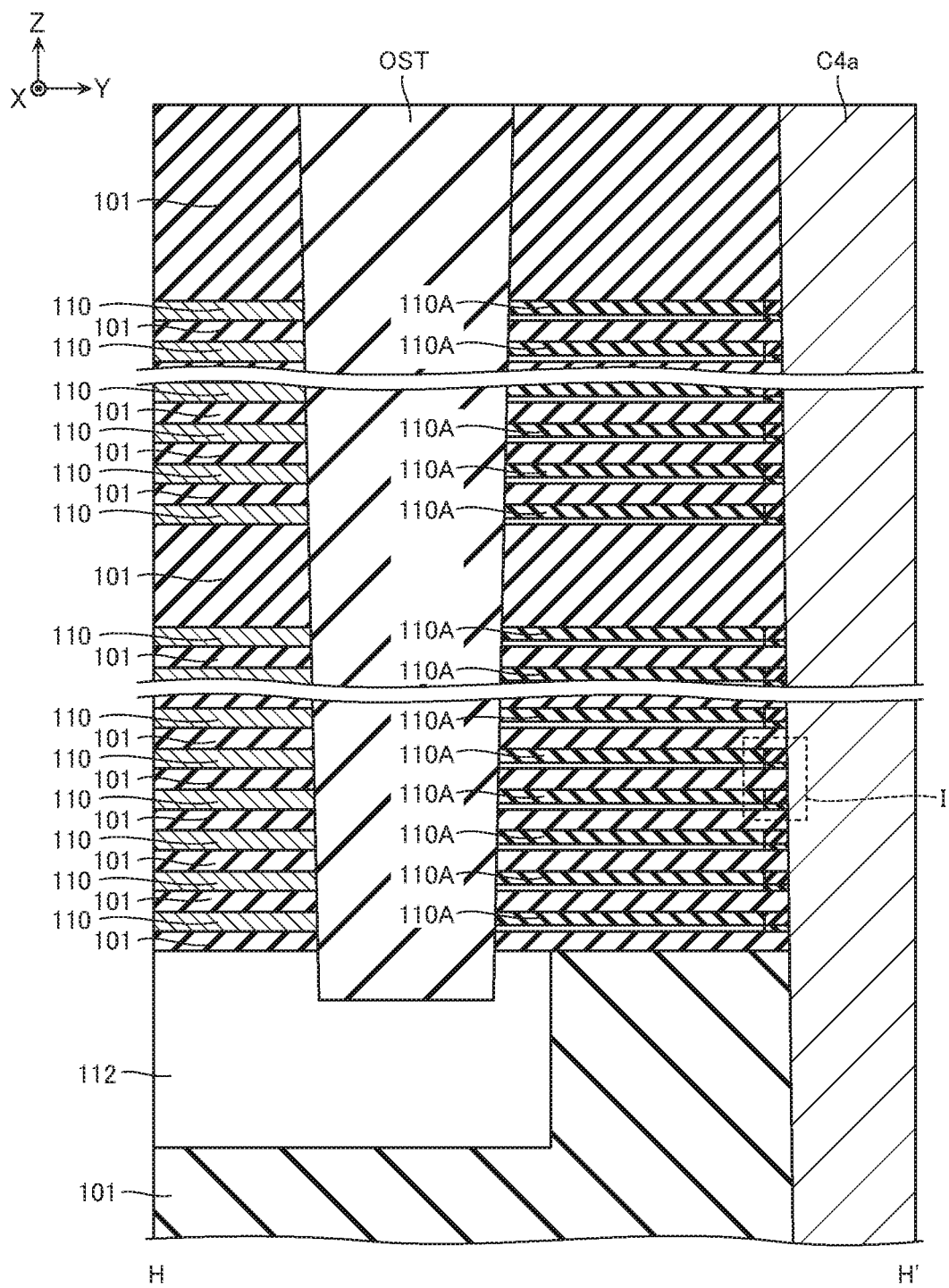
FIG. 9 is a schematic cross-sectional view of the structure illustrated in FIG. 3 taken along the line H-H' and viewed in the arrow direction.
Figure 10:
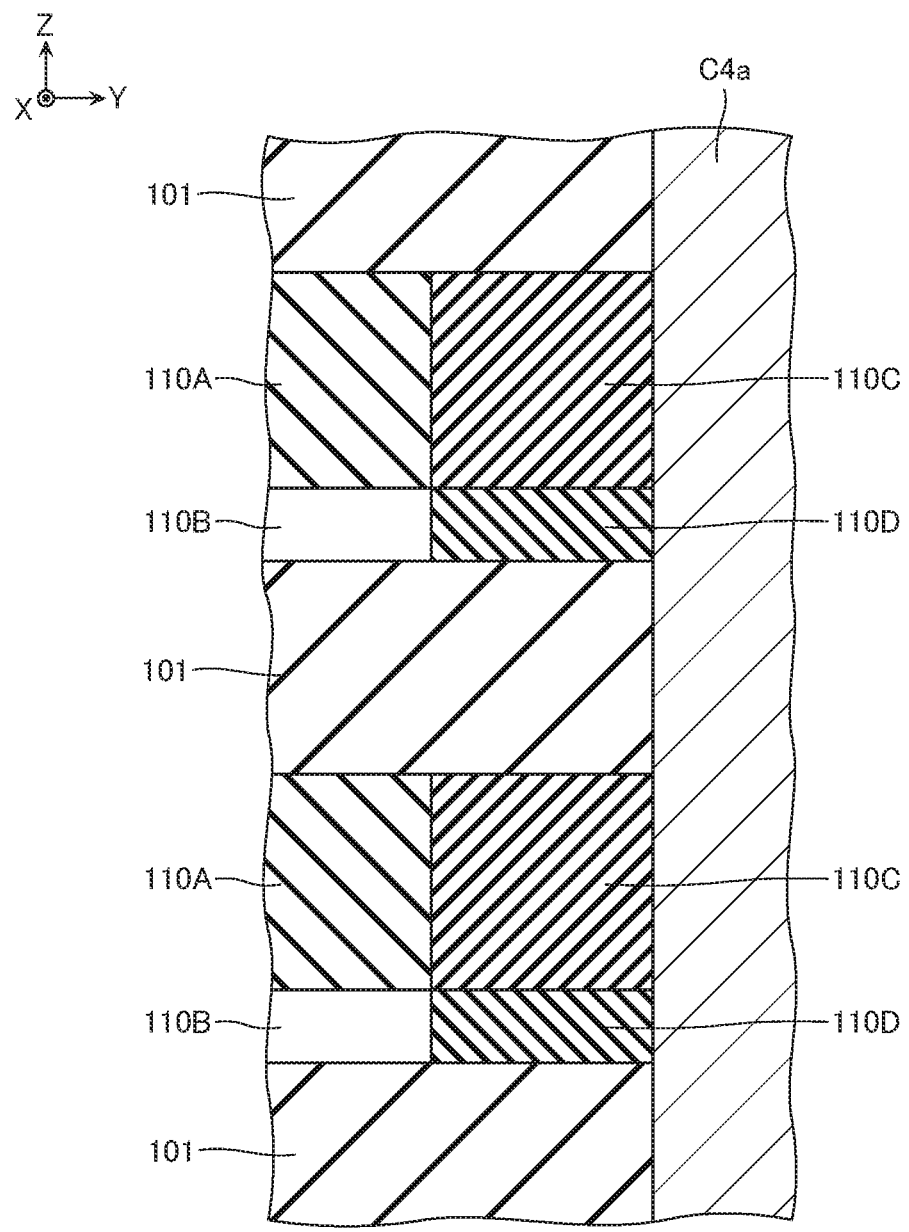
FIG. 10 is a schematic enlarged view of a part indicated by I in FIG. 9.
Figure 11:
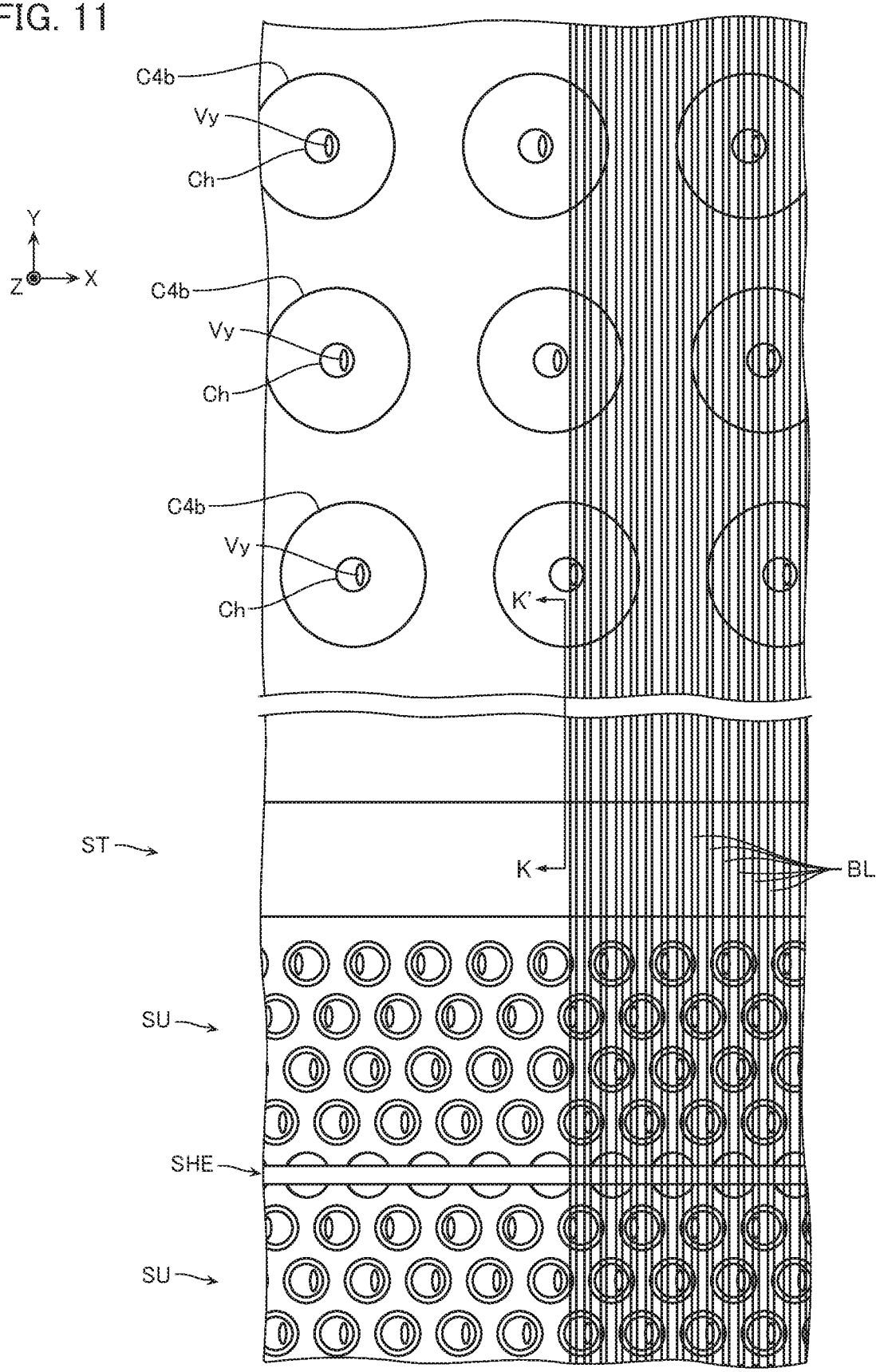
FIG. 11 is a schematic enlarged view of a part indicated by J in FIG. 2.
Figure 12:
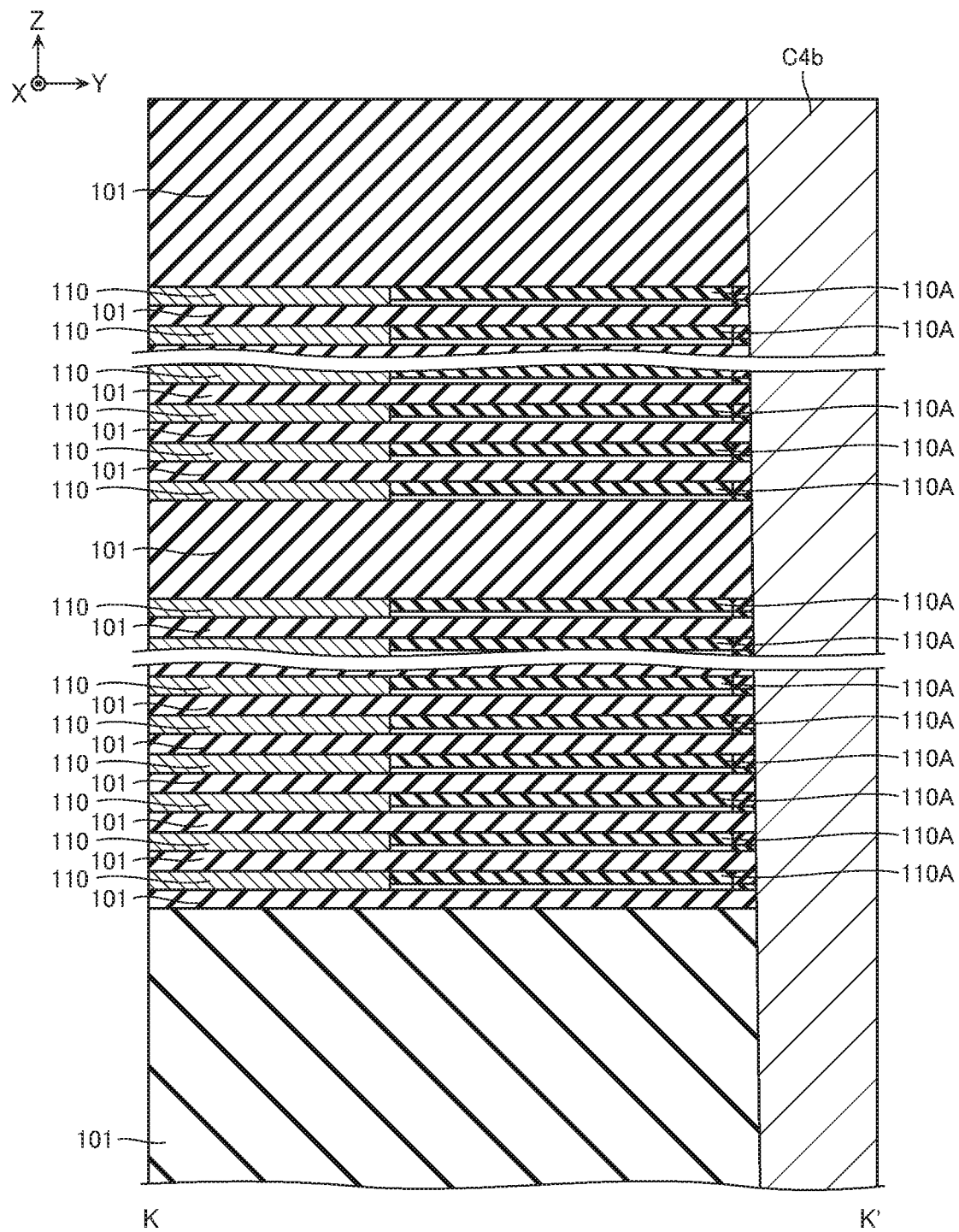
FIG. 12 is a schematic cross-sectional view of the structure illustrated in FIG. 11 taken along the line K-K' and viewed in the arrow direction.

FIG. 1 is a schematic plan view of a memory die MD. FIG. 2 is a schematic enlarged view of a part indicated by A in FIG. 1. FIG. 3 is a schematic enlarged view of a part indicated by B in FIG. 2. FIG. 4 is a schematic enlarged view of a part indicated by C in FIG. 3. FIG. 5 is a schematic cross-sectional view of the structure illustrated in FIG. 4 taken along the line D-D' and viewed in the arrow direction. FIG. 6 is a schematic enlarged view of a part indicated by E in FIG. 5. FIG. 7 is a schematic graph showing contents of components contained in a part of the structure along the line F-F' illustrated in FIG. 6. FIG. 8 is a schematic graph showing contents of components contained in a part of the structure along the line G-G' illustrated in FIG. 6. FIG. 9 is a schematic cross-sectional view of the structure illustrated in FIG. 3 taken along the line H-H' and viewed in the arrow direction. FIG. 10 is a schematic enlarged view of a part indicated by I in FIG. 9. FIG. 11 is a schematic enlarged view of a part indicated by J in FIG. 2. FIG. 12 is a schematic cross-sectional view of the structure illustrated in FIG. 11 taken along the line K-K' and viewed in the arrow direction.

Figure 13:
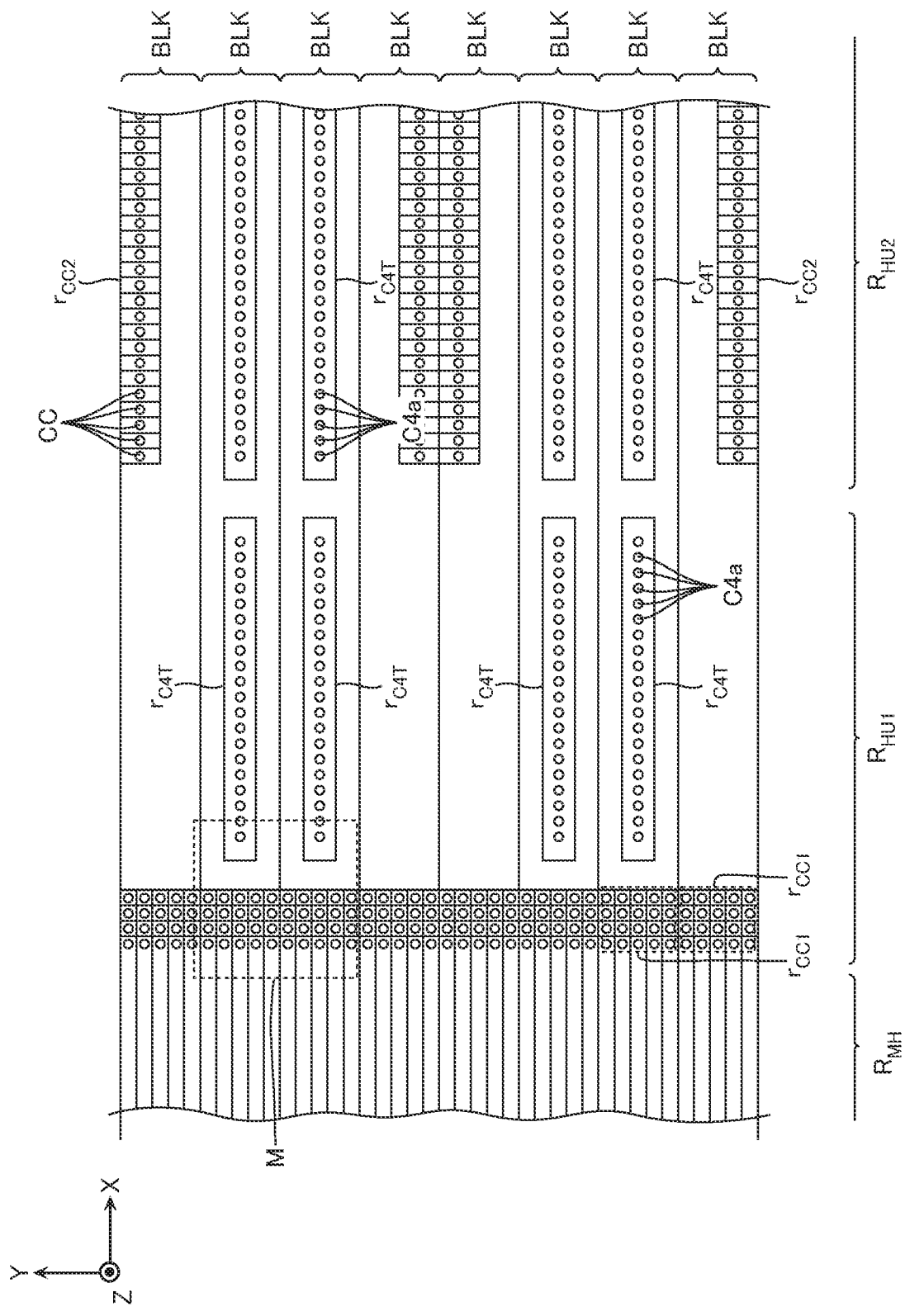
FIG. 13 is a schematic enlarged view of a part indicated by L in FIG. 1.
Figure 14:
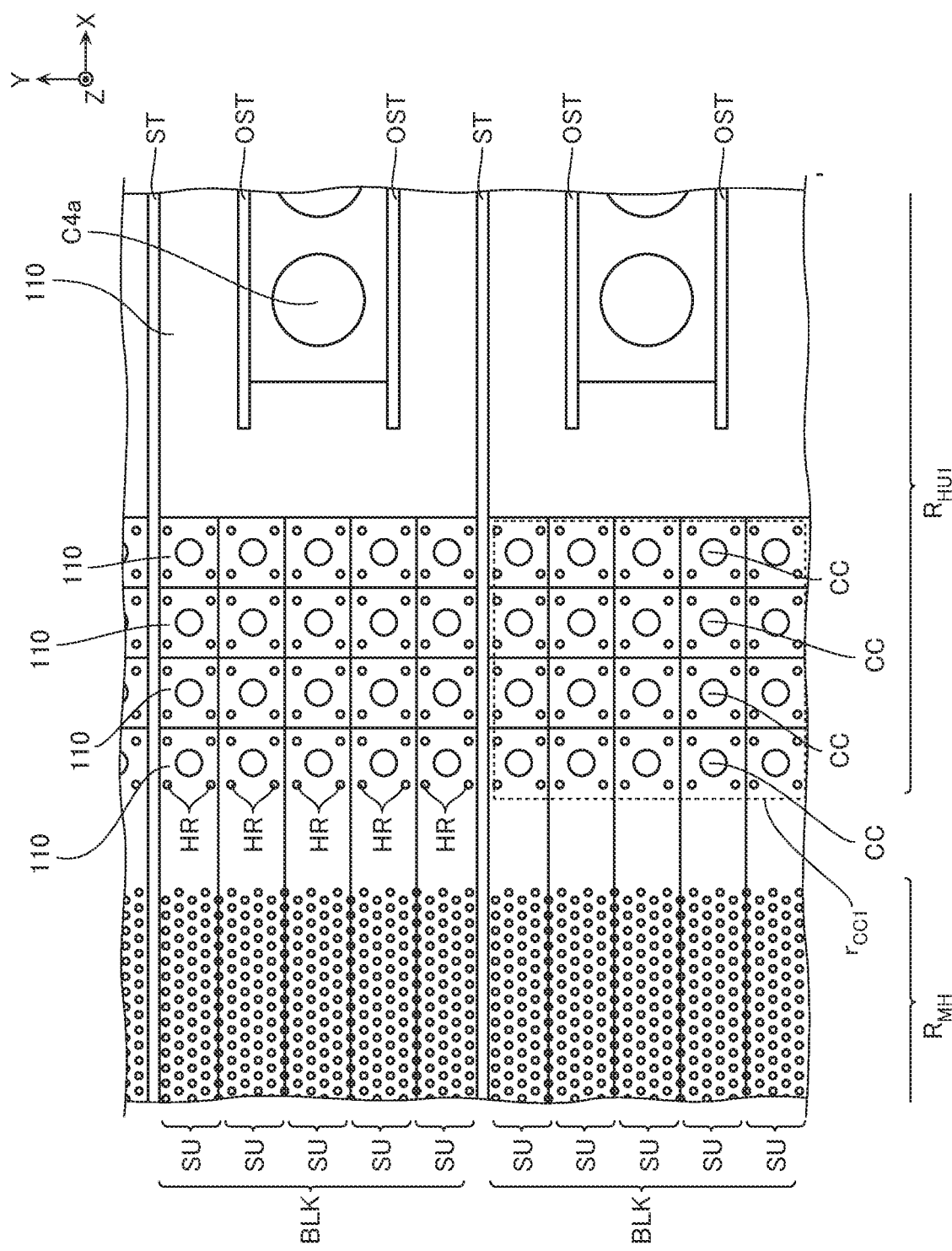
FIG. 14 is a schematic enlarged view of a part indicated by M in FIG. 13.

FIG. 13 is a schematic enlarged view of a part indicated by L in FIG. 1. FIG. 14 is a schematic enlarged view of a part indicated by M in FIG. 13.

For example, as illustrated in FIG. 1, the memory die MD includes a semiconductor substrate 100. The semiconductor substrate 100 is a semiconductor substrate formed of a P-type silicon (Si) that contains P-type impurities, such as boron (B).

In the illustrated example, the semiconductor substrate 100 includes four memory cell array regions $R_{MCA}$ arranged in the X-direction and the Y-direction. Also, the memory cell array region $R_{MCA}$ includes a plurality of memory blocks BLK arranged in the Y-direction. The memory block BLK includes, for example, as illustrated in FIG. 3, a plurality of string units SU arranged in the Y-direction. Between the two memory blocks BLK mutually adjacent in the Y-direction, an inter-block insulating layer ST of silicon oxide (SiO$_2$) or the like is disposed. For example, as illustrated in FIG. 4, between the two string units SU mutually adjacent in the Y-direction, an inter-string unit insulating layer SHE of silicon oxide (SiO$_2$) or the like is disposed.

The memory cell array region $R_{MCA}$ includes, for example, as illustrated in FIG. 1, a plurality of memory hole regions $R_{MH}$ arranged in the X-direction, and a plurality of contact connection regions $R_{C4T}$ disposed between these respective adjacent memory hole regions $R_{MH}$. At the center position of the memory cell array region $R_{MCA}$ in the X-direction, two first hook-up regions $R_{HU1}$ arranged in the X-direction and a second hook-up region $R_{HU2}$ disposed between these two first hook-up regions $R_{HU1}$ are disposed. Corresponding to the plurality of memory hole regions $R_{MH}$ arranged in the X-direction, a plurality of contact connection regions $R_{BLT}$ arranged in the X-direction are disposed at one end portions of the memory cell array regions $R_{MCA}$ in the Y-direction.

[Structure of Memory Hole Region $R_{MH}$]

The memory hole region $R_F$ of the memory block BLK includes, for example, as illustrated in FIG. 5, a plurality of conductive layers 110 arranged in the Z-direction, a plurality of semiconductor layers 120 extending in the Z-direction, and a plurality of respective gate insulating films 130 disposed between the plurality of conductive layers 110 and the respective plurality of semiconductor layers 120.

The conductive layer 110 is an approximately plate-shaped conductive layer extending in the X-direction. A part of the conductive layers 110 functions as, for example, gate electrodes of memory cells (memory transistors) and word lines. A part of the conductive layers 110 functions as, for example, gate electrodes of select transistors and select gate lines. Interlayer insulating layers 101 of silicon oxide (SiO$_2$) or the like are disposed between the respective adjacent plurality of conductive layers 110 arranged in the Z-direction.

The conductive layer 110 may contain, for example, a metal, such as tungsten (W) or molybdenum (Mo), and silicon (Si). For example, in FIG. 6, a region in the vicinity of the center in the YZ cross-section of the conductive layer 110 is indicated as a region $R_{WL1}$. A region in the vicinity of the gate insulating film 130 of the conductive layer 110 is indicated as a region $R_{WL2}$. A region in the vicinity of the lower surface of the conductive layer 110 is indicated as a region $R_{WL3}$. Also, a region in the vicinity of the upper surface of the conductive layer 110 is indicated as a region $R_{WL4}$.

Here, as illustrated in FIG. 7 and FIG. 8, in the first embodiment, the region $R_{WL3}$ has a lower tungsten (W) content than tungsten (W) contents in the regions $R_{WL1}$, $R_{WL2}$, and $R_{WL4}$. Also, the region $R_{WL3}$ has a higher silicon (Si) content than silicon (Si) contents in the regions $R_{WL1}$, $R_{WL2}$, and $R_{WL4}$.

In the illustrated example, the region $R_{WL3}$ has a higher silicon (Si) content than a silicon (Si) content in the region $R_{WL1}$. In such a case, a boundary between the region $R_{WL3}$ and the region $R_{WL1}$ may be specified in the following method, for example. That is, the component of the conductive layer 110 is analyzed along with the line F-F' in FIG. 6. Next, the maximum value of silicon (Si) content in the region $R_{WL3}$ is obtained. Also, the minimum value of silicon (Si) content in the region $R_{WL1}$ is obtained. The average of the obtained maximum value and minimum value is obtained. Also, a point on the line F-F' in FIG. 6 where the obtained silicon (Si) content becomes the average value is set as the boundary between the region $R_{WL3}$ and the region $R_{WL1}$.

In such a case, a boundary between the region $R_{WL2}$ and the region $R_{WL1}$, and a boundary between the region $R_{WL4}$ and the region $R_{WL1}$ may be specified by the method as follows. That is, the boundary between the region $R_{WL3}$ and the region $R_{WL1}$ is specified by the method as described above to obtain a distance between the position of this boundary and the lower surface of the conductive layer 110. Next, the position spaced apart by this distance from the upper surface of the conductive layer 110 is set as the boundary between the region $R_{WL4}$ and the region $R_{WL1}$. Also, the position spaced apart by this distance from the opposing surface of the conductive layer 110 with the gate insulating film 130 is set as the boundary between the region $R_{WL2}$ and the region $R_{WL1}$.

Such methods may be applicable to the case when the region $R_{WL4}$ has a higher silicon (Si) content than silicon (Si) contents in the regions $R_{WL1}$ and $R_{WL2}$.

Below the conductive layers 110, for example, as illustrated in FIG. 5, a semiconductor layer 112 is disposed. The semiconductor layer 112 functions as, for example, a part of a source line. The semiconductor layer 112 may contain, for example, a polycrystalline silicon that contains impurities, such as phosphorus (P) or boron (B). An interlayer insulating layer 101 of silicon oxide (SiO$_2$) or the like is disposed between the semiconductor layer 112 and the conductive layers 110.

The semiconductor layers 120 are, for example, as illustrated in FIG. 4, arranged in the X-direction and the Y-direction in a predetermined pattern. The semiconductor layer 120 functions as channel regions of a plurality of memory cells (memory transistors) and select transistors arranged in the Z-direction. The semiconductor layer 120 is a semiconductor layer of polycrystalline silicon (Si) or the like. The semiconductor layer 120 has, for example, as illustrated in FIG. 5, an approximately cylindrical shape, and an insulating layer 125 of silicon oxide or the like is disposed in a center portion of the semiconductor layer 120.

The semiconductor layer 120 includes a semiconductor region $120_L$ and a semiconductor region $120_L$ disposed thereabove. Also, the semiconductor layer 120 includes a semiconductor region $120_J$ connected to the upper end of the semiconductor region $120_L$ and the lower end of the semiconductor region $120_U$, an impurity region 122 connected to the lower end of the semiconductor region $120_L$, and an impurity region 121 connected to the upper end of the semiconductor region $120_U$.

The semiconductor region $120_L$ is an approximately cylindrically-shaped region extending in the Z-direction. The semiconductor region $120_L$ has an outer peripheral surface surrounded by a plurality of conductive layers 110 and is opposed to the plurality of conductive layers 110.

The semiconductor region $120_U$ is an approximately cylindrically-shaped region extending in the Z-direction. The semiconductor region $120_U$ has an outer peripheral surface surrounded by a plurality of conductive layers 110 and is opposed to the plurality of conductive layers 110.

The semiconductor region $120_T$ is disposed above the plurality of conductive layers 110 opposed to the semiconductor region $120_L$ (FIG. 5). Also, the semiconductor region $120_J$ is disposed below the plurality of conductive layers 110 opposed to the semiconductor region $120_U$. The semiconductor region $120_J$ has widths in the X-direction and the Y-direction larger than the widths of the semiconductor region $120_L$ in the X-direction and the Y-direction and the widths of the semiconductor region $120_U$ in the X-direction and the Y-direction.

The impurity regions 122 are connected to the semiconductor layer 112 described above. In the example of FIG. 5, a boundary line between the lower end portion of the semiconductor region $120_L$ and the upper end portion of the impurity region 122 is indicated by a dashed line. The impurity region 122 contains, for example, P-type impurities, such as boron (B).

The impurity region 121 contains, for example, N-type impurities, such as phosphorus (P). In the example of FIG. 5, a boundary line between the upper end portion of the semiconductor region $120_L$ and the lower end portion of the impurity region 121 is indicated by a dashed line. The impurity regions 121 are connected to bit lines BL via contacts Ch and contacts Vy (FIG. 4).

The gate insulating film 130 has an approximately closed-bottomed cylindrical shape covering the outer peripheral surface of the semiconductor layer 120. The gate insulating film 130 includes, for example, as illustrated in FIG. 6, a tunnel insulating film 131, an electric charge accumulating film 132, a block insulating film 133, and a high-dielectric-constant insulating film 134 stacked between the semiconductor layer 120 and the conductive layers 110. The tunnel insulating film 131 and the block insulating film 133 are, for example, insulating films of silicon oxide ($SiO_2$) or the like. The electric charge accumulating film 132 is, for example, a film of silicon nitride ($Si_3N_4$) or the like, which is capable of accumulating electric charges. The high-dielectric-constant insulating film 134 is, for example, a metal oxide film of alumina ($Al_2O_3$) or the like. The tunnel insulating film 131, the electric charge accumulating film 132, the block insulating film 133, and the high-dielectric-constant insulating film 134 have approximately cylindrical shapes, and extend in the Z-direction along the outer peripheral surface of the semiconductor layer 120 excluding a contact portion of the semiconductor layer 120 with the semiconductor layer 112.

[Structure of Contact Connection Region $R_{C4T}$]

The contact connection region $R_{C4T}$ of the memory blocks BLK includes, for example, as illustrated in FIG. 3, two insulating layers OST arranged in the Y-direction. Between these two insulating layers OST, a contact connection sub-region $r_{C4T}$ is disposed. Also, between the inter-block insulating layer ST and the insulating layer OST, a conductive layer connection sub-region $r_{110}$ is disposed. These regions extend in the X-direction along the inter-block insulating layer ST.

The insulating layer OST, for example, as illustrated in FIG. 9, extends in the Z-direction, and has a lower end connected to the semiconductor layer 112. The insulating layer OST contains, for example, silicon oxide ($SiO_2$).

The contact connection sub-region $r_{C4T}$ includes a plurality of insulating layers 110A arranged in the Z-direction, corresponding to the plurality of conductive layers 110, and a plurality of contacts C4a extending in the Z-direction.

The insulating layer 110A is an approximately plate-shaped insulating layer extending in the X-direction. The insulating layer 110A may include the insulating layer of silicon nitride (SiN) or the like. Between the respective adjacent plurality of insulating layers 110A arranged in the Z-direction, the interlayer insulating layers 101 of silicon oxide ($SiO_2$) or the like are disposed. Also, as illustrated in FIG. 10, each silicon layer 110B containing silicon (Si) is interposed between the lower surface of the insulating layer 110A and the upper surface of the interlayer insulating layer 101.

The main component of the silicon layer 110B may be silicon (Si). Also, the silicon layer 110B need not contain oxygen (O), or may have a lower oxygen (O) content than an oxygen (O) content of the interlayer insulating layer 101. Also, the silicon layer 110B need not contain nitrogen (N), or may have a lower nitrogen (N) content than a nitrogen (N) content of the insulating layer 110A.

The insulating layers 110A (FIG. 10) are disposed, for example, at the height positions corresponding to the regions $R_{WL1}$ and $R_{WL4}$ of the conductive layers 110 described with reference to FIG. 6. The silicon layers 110B (FIG. 10) are disposed, for example, at the height positions corresponding to the regions $R_{WL3}$ of the conductive layers 110 described with reference to FIG. 6. The interlayer insulating layers 101 inside the contact connection region $R_{C4T}$ are disposed, for example, at the height positions corresponding to the interlayer insulating layers 101 inside the memory hole region $R_{MX}$.

The plurality of contacts C4a, for example, as illustrated in FIG. 2, are arranged in the X-direction. The contacts C4a may include, for example, a stacked film of a barrier conductive film, such as titanium nitride (TiN), and a metal film, such as tungsten (W). Each of outer peripheral surfaces of the contacts C4a is surrounded by the insulating layers 110A and the interlayer insulating layers 101.

For example, as illustrated in FIG. 10, an insulating layer 110C is disposed between the contact C4a and the insulating layer 110A. Also, an insulating layer 110D is disposed between the contact C4a and the silicon layer 110B. The insulating layers 110C, 110D contain silicon oxide ($SiO_2$) or the like. The insulating layers 110C, 110D are disposed at the height positions corresponding to the insulating layers 110A and the silicon layers 110B, respectively.

The conductive layer connection sub-region $r_{110}$ includes, for example, as illustrated in FIG. 3, narrow-width portions $110_{C4T}$ of the conductive layers 110. For example, as illustrated in FIG. 2, the plurality of conductive layers 110 included in the two memory hole regions $R_{MH}$ adjacent in the X-direction are electrically conducted with one another via these narrow-width portions $110_{C4T}$.

[Structure of Contact Connection Region $R_{BLT}$]

The contact connection region $R_{BLT}$ includes, for example, as illustrated in FIG. 12, the plurality of insulating layers 110A arranged in the Z-direction, corresponding to the plurality of conductive layers 110, and a plurality of contacts C4b extending in the Z-direction.

In the contact connection region $R_{BLT}$, similarly to the contact connection sub-region $r_{C4T}$, the insulating layers 110A are disposed at the height positions corresponding to the regions $R_{WL1}$, $R_{WL4}$ of the conductive layers 110. Also, at the height positions corresponding to the regions $R_{WL3}$ of the conductive layers 110, the silicon layers 110B are disposed.

The interlayer insulating layers 101 inside the contact connection region $R_{BLT}$ are disposed, for example, at the height positions corresponding to the interlayer insulating layers 101 inside the memory hole region $R_{MH}$.

The plurality of contacts C4b, for example, as illustrated in FIG. 11, are arranged in the X-direction and the Y-direction. The contacts C4b may include, for example, a stacked film of a barrier conductive film, such as titanium nitride (TiN), and a metal film, such as of tungsten (W). Each of outer peripheral surfaces of the contacts C4b is surrounded by the insulating layers 110A and the interlayer insulating layers 101.

Between the contact C4b and the insulating layer 110A, the insulating layer 110C as described with reference to FIG. 10 is disposed. Also, between the contact C4b and the silicon layer 110B, the insulating layer 110D as described with reference to FIG. 10 is disposed. The insulating layers 110C, 110D are disposed at the height positions corresponding to the insulating layers 110A and the silicon layers 110B, respectively.

[Structure of First Hook-Up Region $R_{HU1}$]

The first hook-up region $R_{HU1}$ of the memory blocks BLK, as illustrated in FIG. 13, includes contact connection sub-regions $r_{CC1}$. Also, the first hook-up region $R_{HU1}$ of a part of the memory blocks BLK includes the contact connection sub-regions $r_{C4T}$ as described above.

As illustrated in FIG. 14, the contact connection sub-region $r_{CC1}$ includes the end portions of the plurality of conductive layers 110 in the X-direction. Also, in the contact connection sub-region $r_{CC1}$, a plurality of contacts CC arranged in a matrix when viewed in the Z-direction are disposed. These plurality of contacts CC are connected to the conductive layers 110. Also, these plurality of contacts CC are electrically connected to transistors disposed on the upper surface of the semiconductor substrate 100 via the contacts C4a inside the first hook-up region $R_{HU1}$.

Also, in the first hook-up region $R_{HU1}$, supporting structures HR are disposed in the vicinity of the contacts CC. The supporting structures HR contain, for example, silicon oxide (SiO$_2$).

[Structure of Second Hook-Up Region $R_{HU2}$]

The second hook-up region $R_{HU2}$ of the memory block BLK, as illustrated in FIG. 13, include contact connection sub-regions $r_{CC2}$. Also, the memory blocks BLK include the contact connection sub-regions $r_{C4T}$ as described above.

The contact connection sub-regions $r_{CC2}$ include parts of the plurality of conductive layers 110. Also, the contact connection sub-region $r_{CC2}$ includes the plurality of contacts CC arranged in the X-direction. These plurality of contacts CC are connected to the conductive layers 110. Also, these plurality of contacts CC are electrically connected to the transistors disposed on the upper surface of the semiconductor substrate 100 via the contacts C4a inside the second hook-up region $R_{HU2}$.

Although not illustrated, the supporting structures HR described with reference to FIG. 14 are disposed also in the second hook-up region $R_{HU2}$.

[Manufacturing Method]

Next, with reference to FIG. 15 to FIG. 39, a method of manufacturing the memory die MD is described. FIG. 15 to FIG. 39 are schematic cross-sectional views illustrating the method of manufacturing the memory die MD. FIG. 15 to FIG. 25, FIG. 28 to FIG. 33, and FIG. 35 and FIG. 37 illustrate cross-sections corresponding to FIG. 5. Also, FIG. 26, FIG. 27, FIG. 34, FIG. 36, FIG. 38, and FIG. 39 illustrate cross-sections corresponding to FIG. 9.

Figure 15:
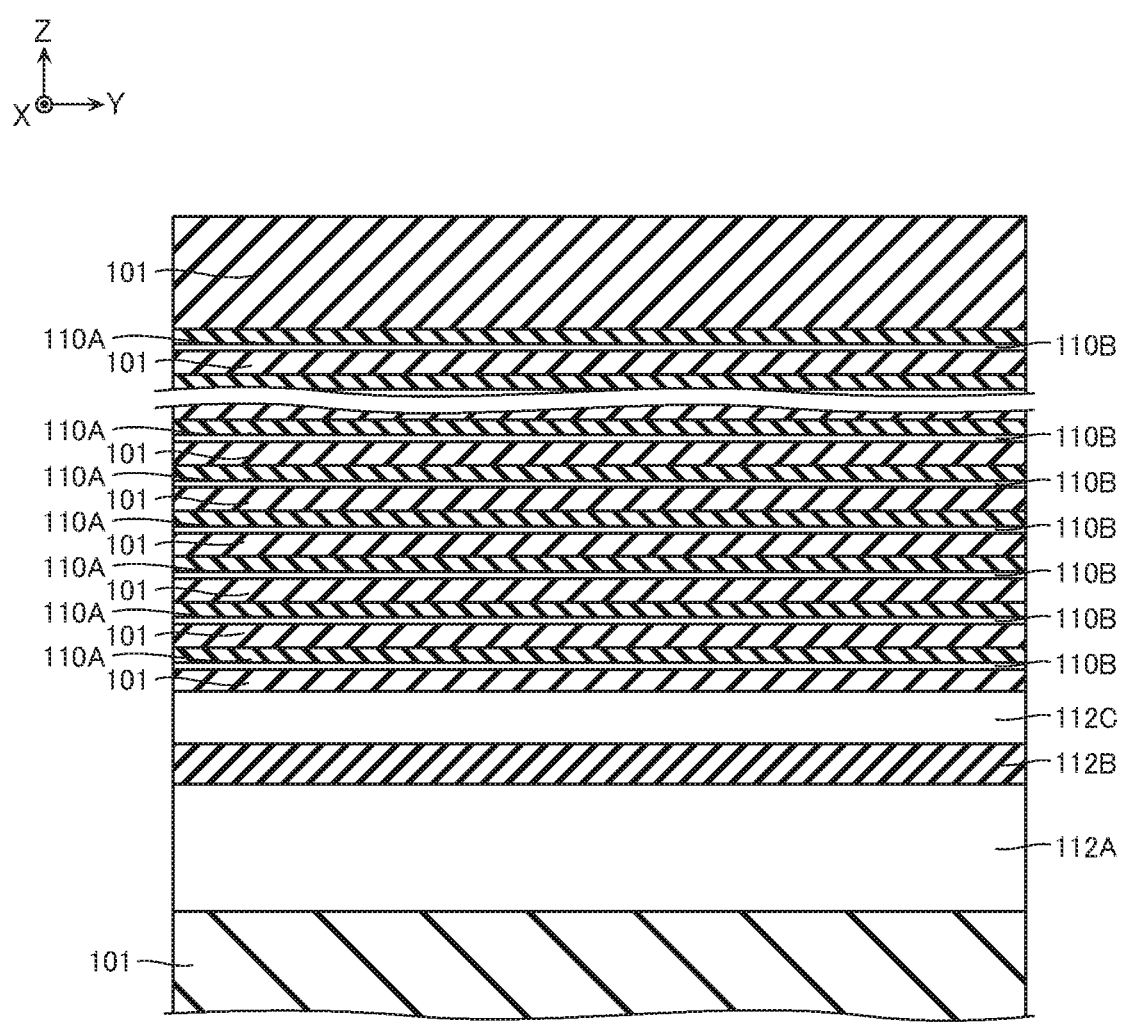
FIG. 15 is a schematic cross-sectional view illustrating a manufacturing method of the semiconductor memory device according to the first embodiment.

When manufacturing the memory die MD according to the embodiment, for example as illustrated in FIG. 15, on the interlayer insulating layer 101, a semiconductor layer 112A of, for example, silicon, a sacrifice layer 112B of, for example, silicon nitride, and a semiconductor layer 112C of, for example, silicon, are formed. Also, for example, formation of the interlayer insulating layer 101, formation of the silicon layer 110B, and formation of the insulating layer 110A are repeatedly performed. This process is performed by a method, such as Chemical Vapor Deposition (CVD).

Figure 16:
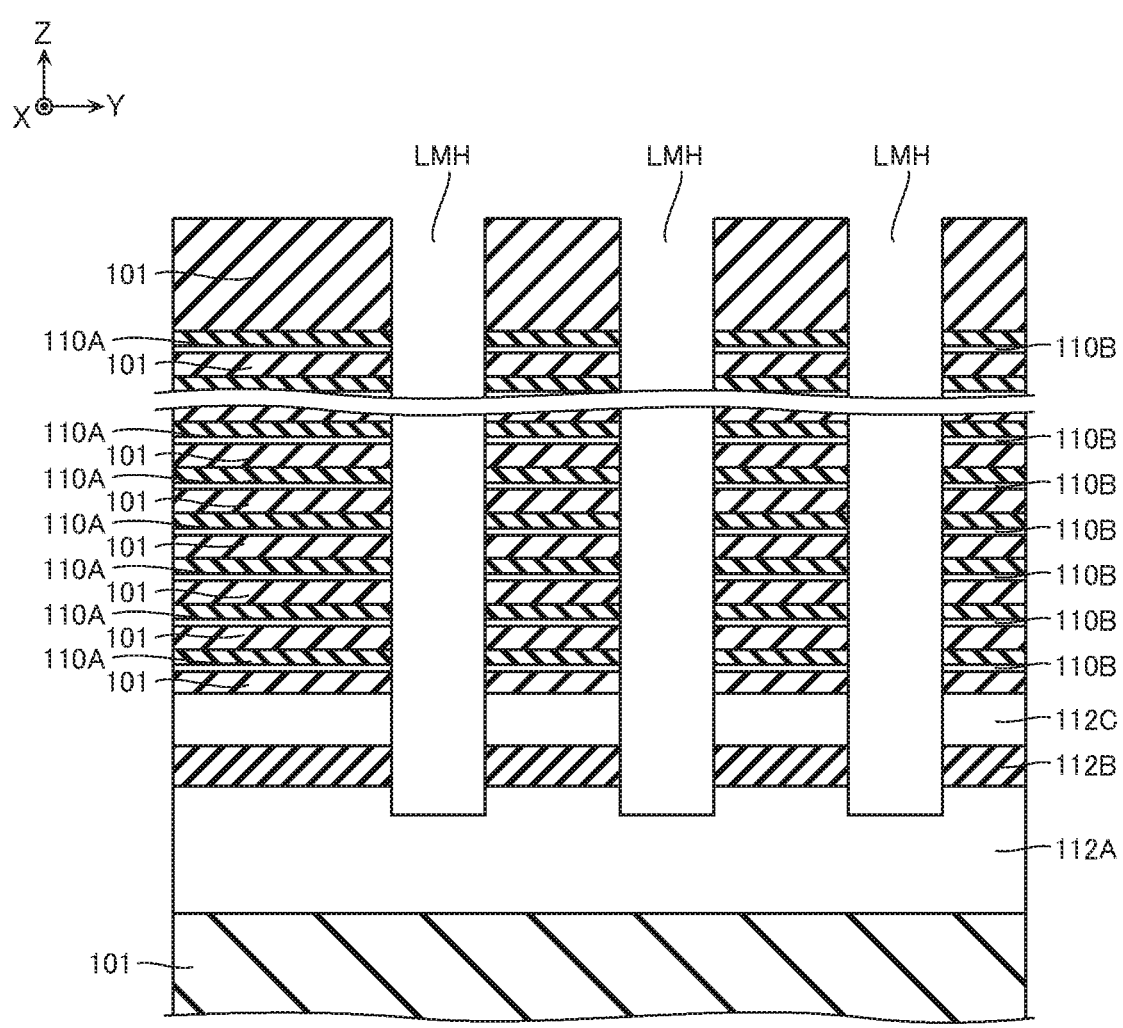
FIG. 16 is a schematic cross-sectional view for illustrating the manufacturing method.

Next, for example, as illustrated in FIG. 16, at the positions corresponding to the semiconductor layers 120, a plurality of memory holes LMH are formed. The memory hole LMH is a through-hole extending in the Z-direction, passing through the interlayer insulating layers 101, the insulating layers 110A, the silicon layers 110B, the semiconductor layer 112C, and the sacrifice layer 112B, and causing the upper surface of the semiconductor layer 112A to be exposed. This process is performed by a method, such as Reactive Ion Etching (RIE) or the like.

Figure 17:
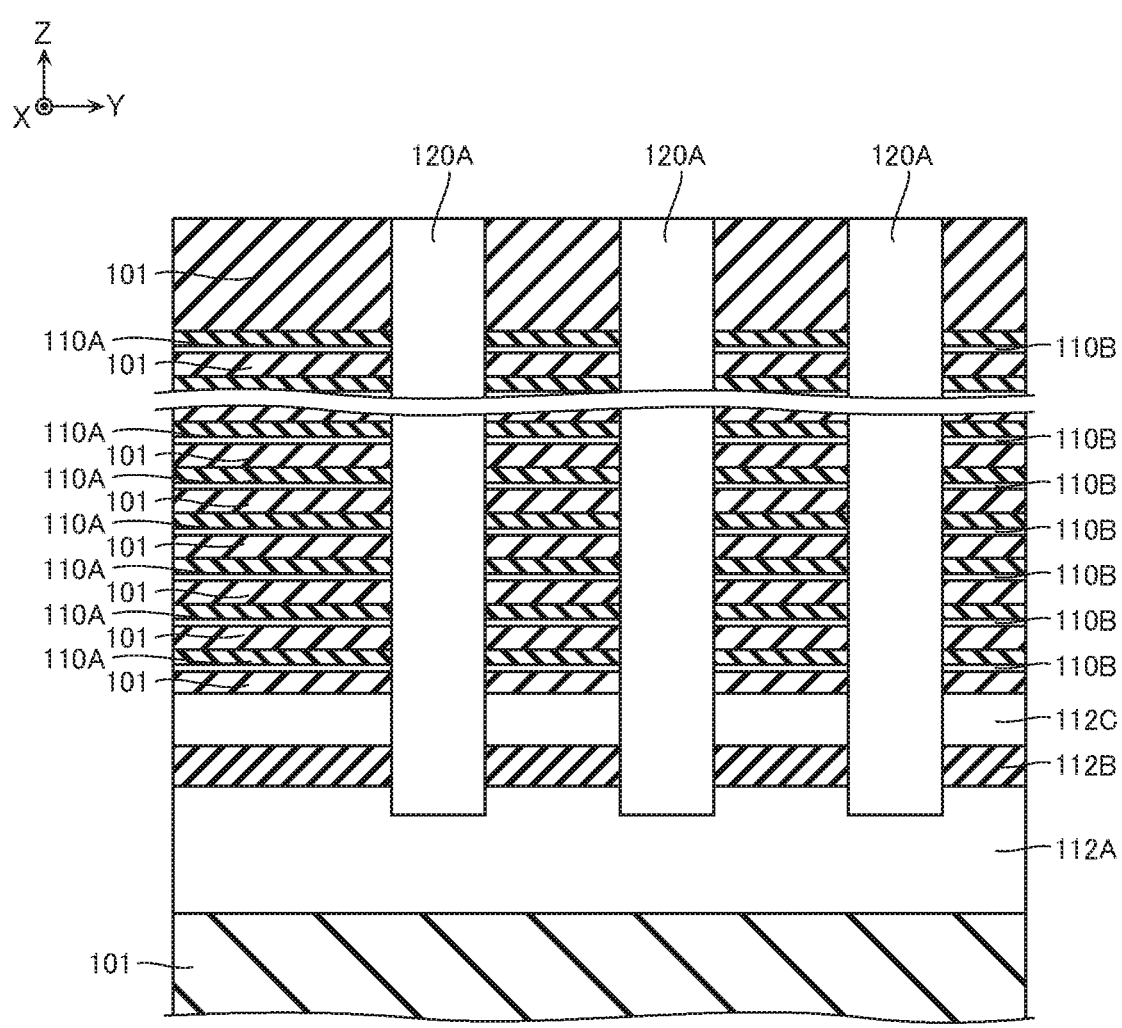
FIG. 17 is a schematic cross-sectional view for illustrating the manufacturing method.

Next, for example, as illustrated in FIG. 17, amorphous silicon films 120A are formed inside the memory holes LMH. This process is performed by a method, such as CVD or the like. In this process, insulating films of silicon oxide (SiO$_2$), silicon nitride (SiN), or the like may be formed before the amorphous silicon films 120A are formed.

Figure 18:
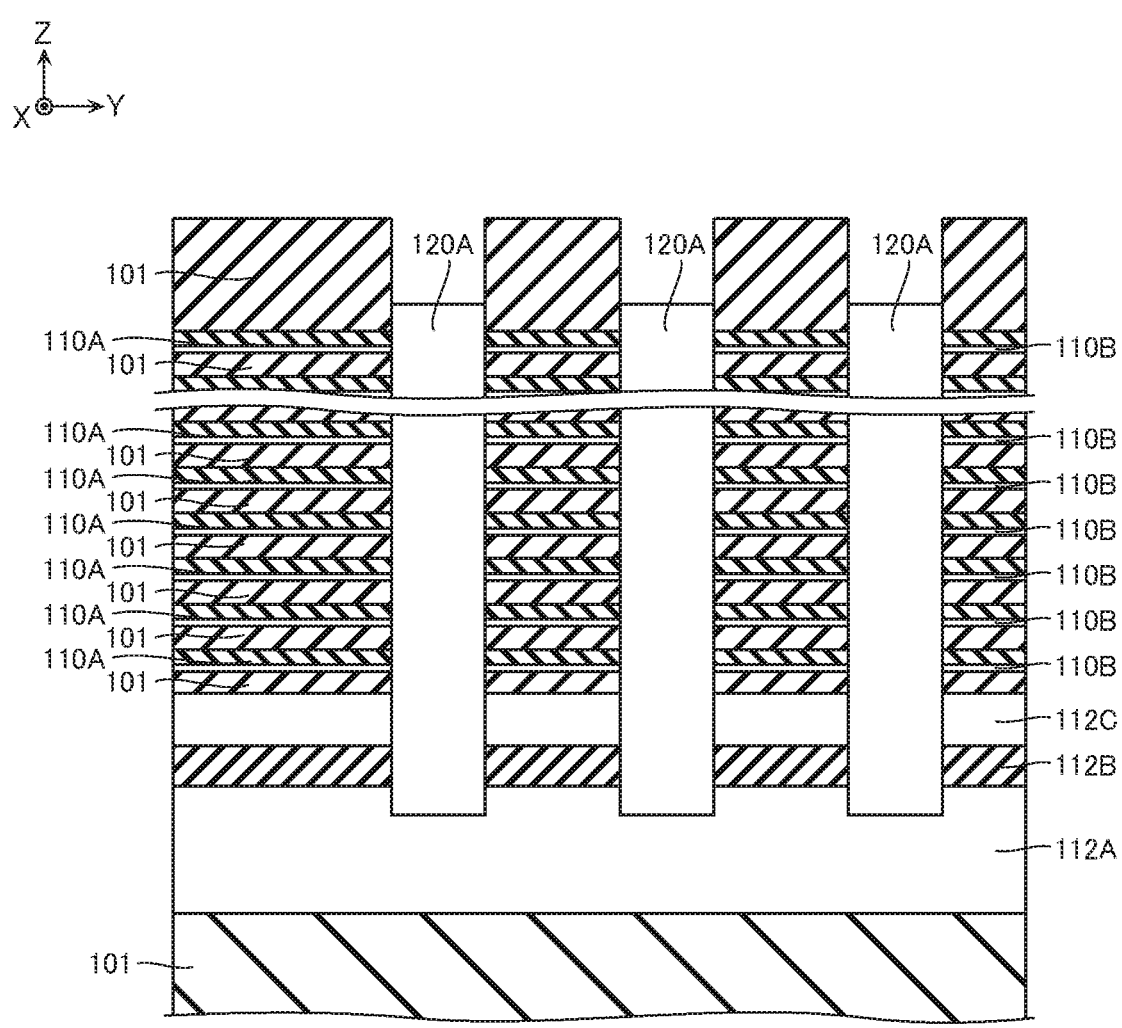
FIG. 18 is a schematic cross-sectional view for illustrating the manufacturing method.

Next, for example, as illustrated in FIG. 18, parts disposed in the vicinity of the upper ends of the memory holes LMH are removed. This process is performed by a method, such as RIE or the like.

Figure 19:
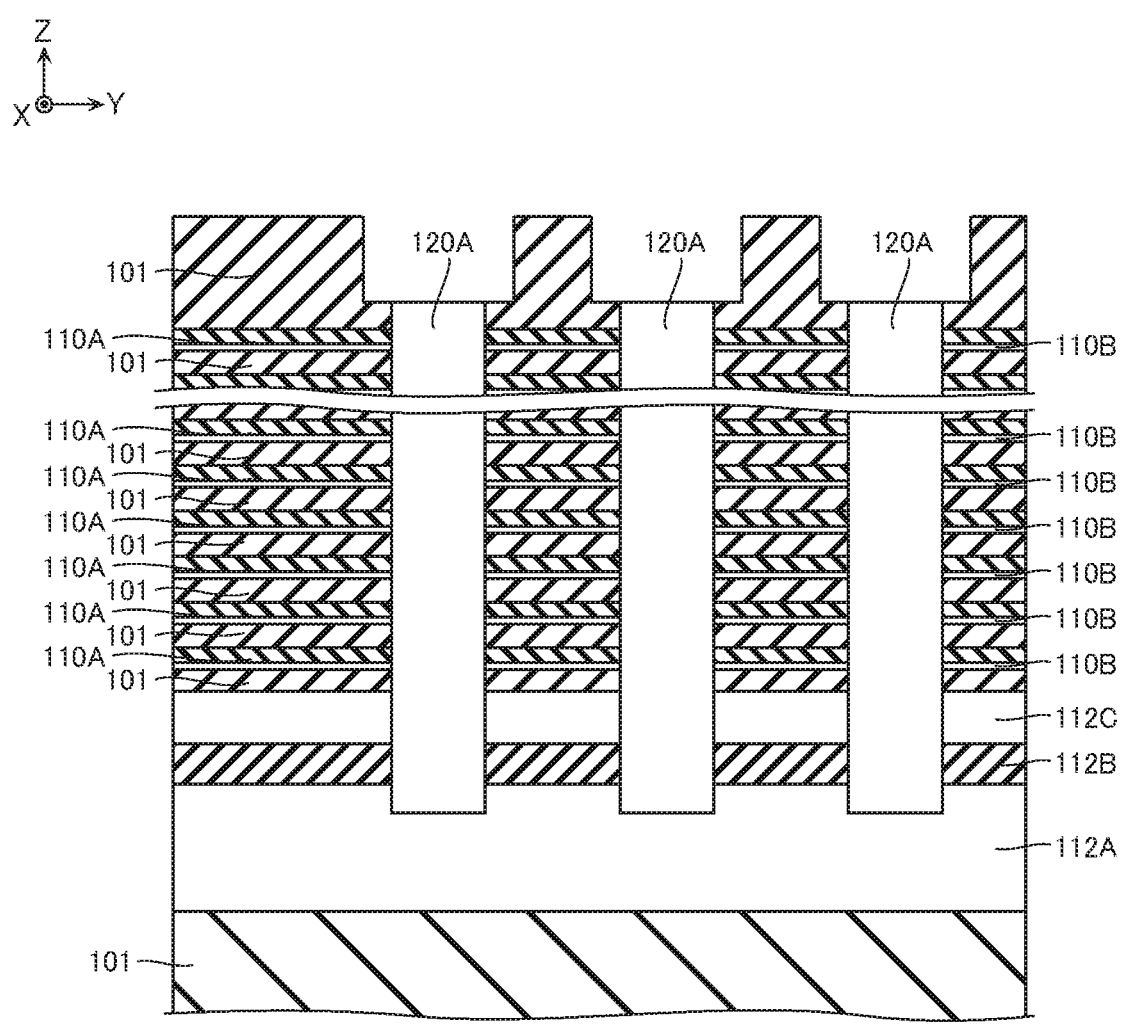
FIG. 19 is a schematic cross-sectional view for illustrating the manufacturing method.

Next, for example, as illustrated in FIG. 19, the interlayer insulating layer 101 at the uppermost layer is partially removed to expand the radii of the upper ends of the memory holes LMH. This process is performed by a method, such as wet etching or the like.

Figure 20:
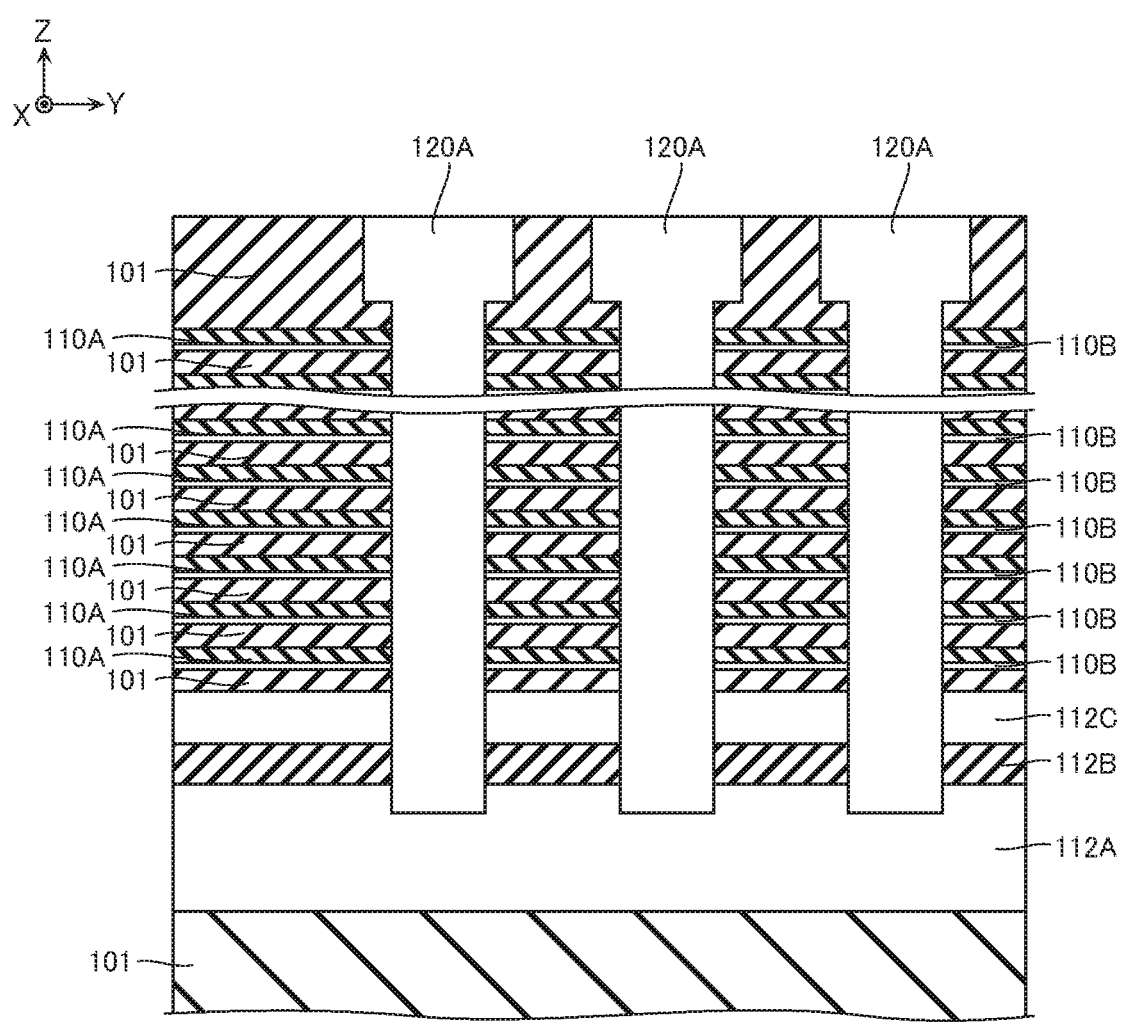
FIG. 20 is a schematic cross-sectional view for illustrating the manufacturing method.

Next, for example, as illustrated in FIG. 20, the amorphous silicon films 120A are formed in the vicinity of the upper ends of the memory holes LMH. This process is performed by a method, such as CVD or the like.

Figure 21:
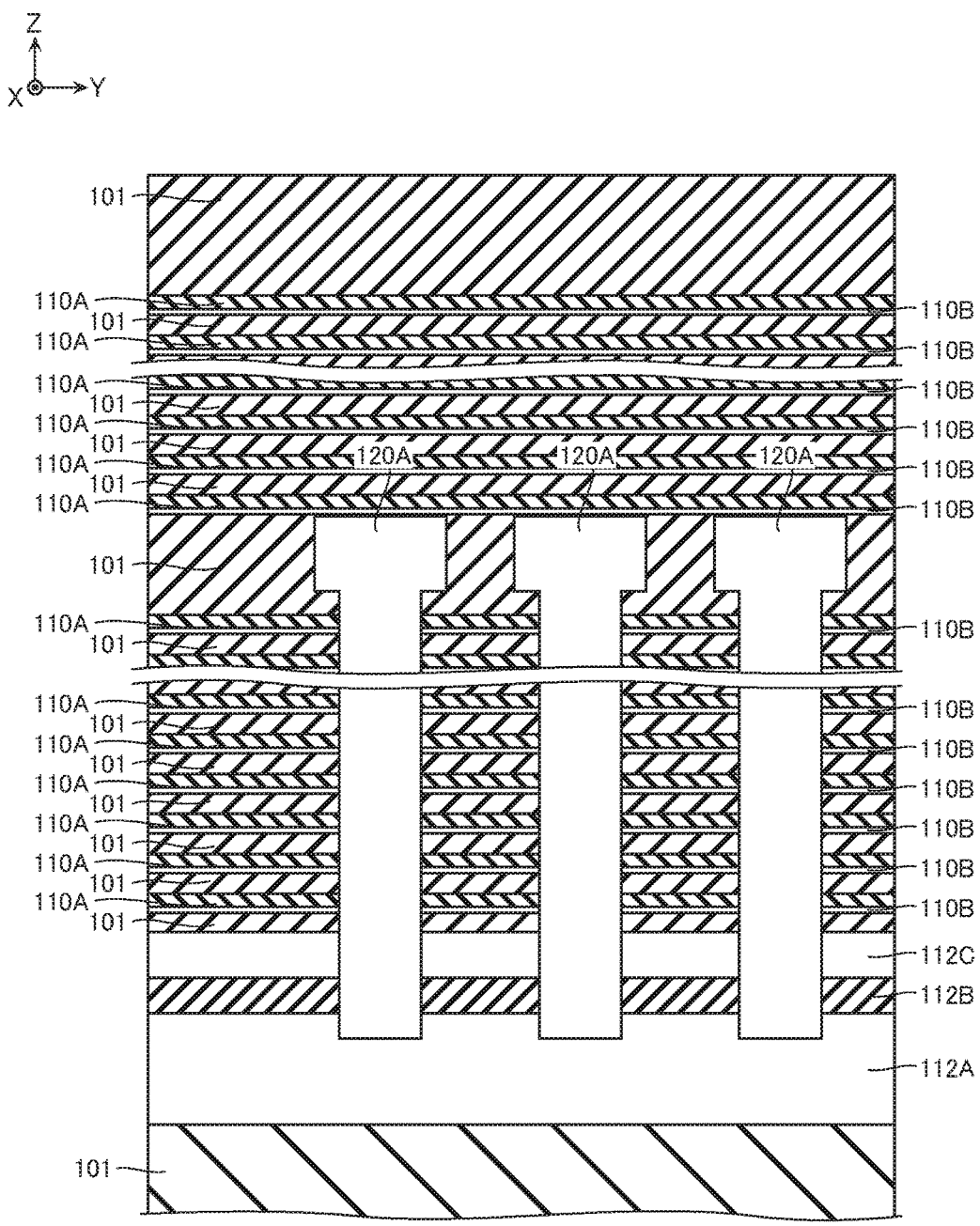
FIG. 21 is a schematic cross-sectional view for illustrating the manufacturing method.

Next, for example, as illustrated in FIG. 21, formation of the interlayer insulating layer 101, formation of the silicon layer 110B, and formation of the insulating layer 110A are repeatedly performed with respect to the upper surface of the structure described with reference to FIG. 20. This process is performed by a method, such as CVD or the like.

Figure 22:
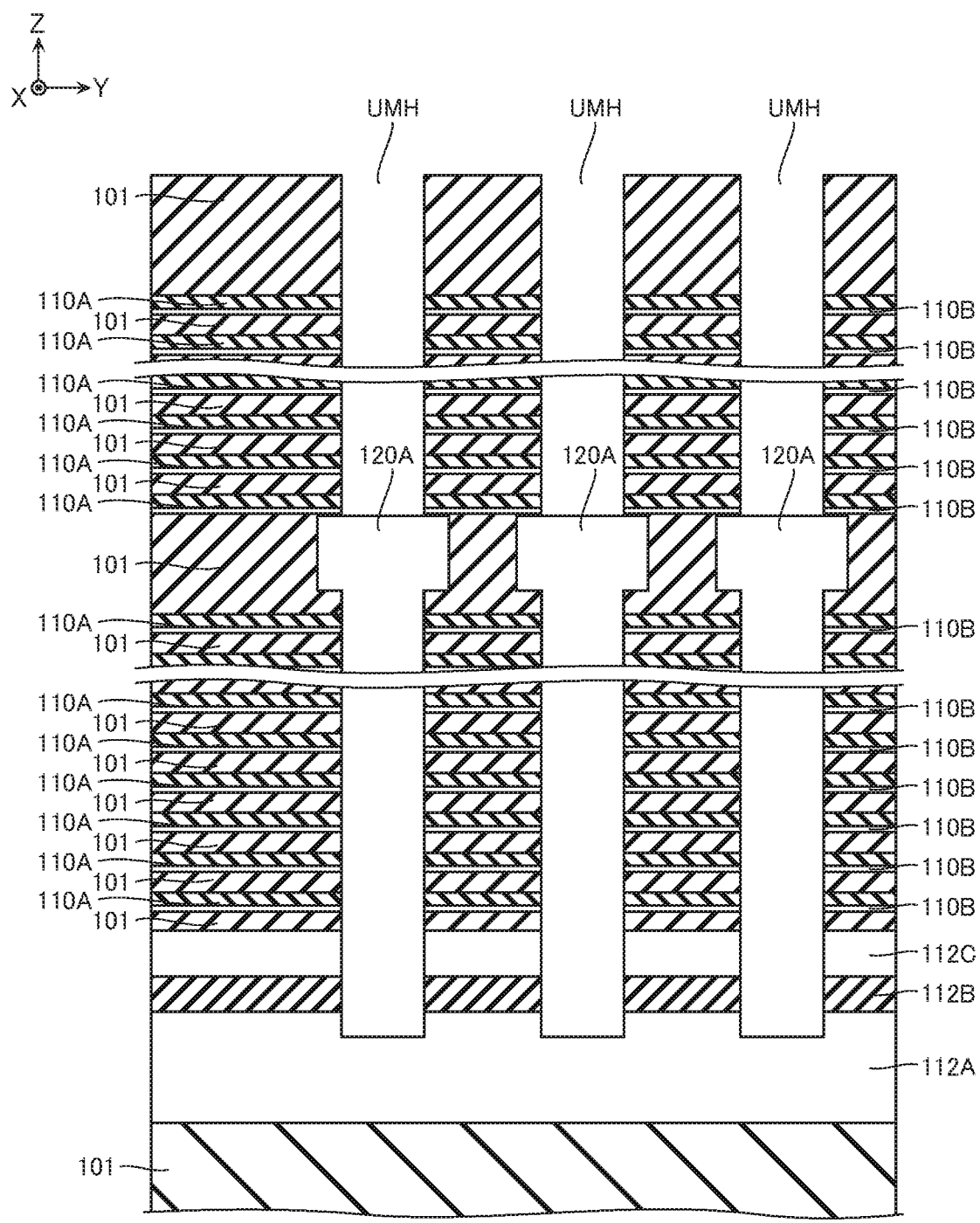
FIG. 22 is a schematic cross-sectional view for illustrating the manufacturing method.

Next, for example, as illustrated in FIG. 22, at the positions corresponding to the semiconductor layers 120, a plurality of memory holes UMH are formed. The memory holes UMH are through holes extending in the Z-direction, passing through the interlayer insulating layers 101, the insulating layers 110A, and the silicon layers 110B, and causing the upper surfaces of amorphous silicon films 120A to be exposed. This process is performed by a method, such as RIE or the like.

Figure 23:
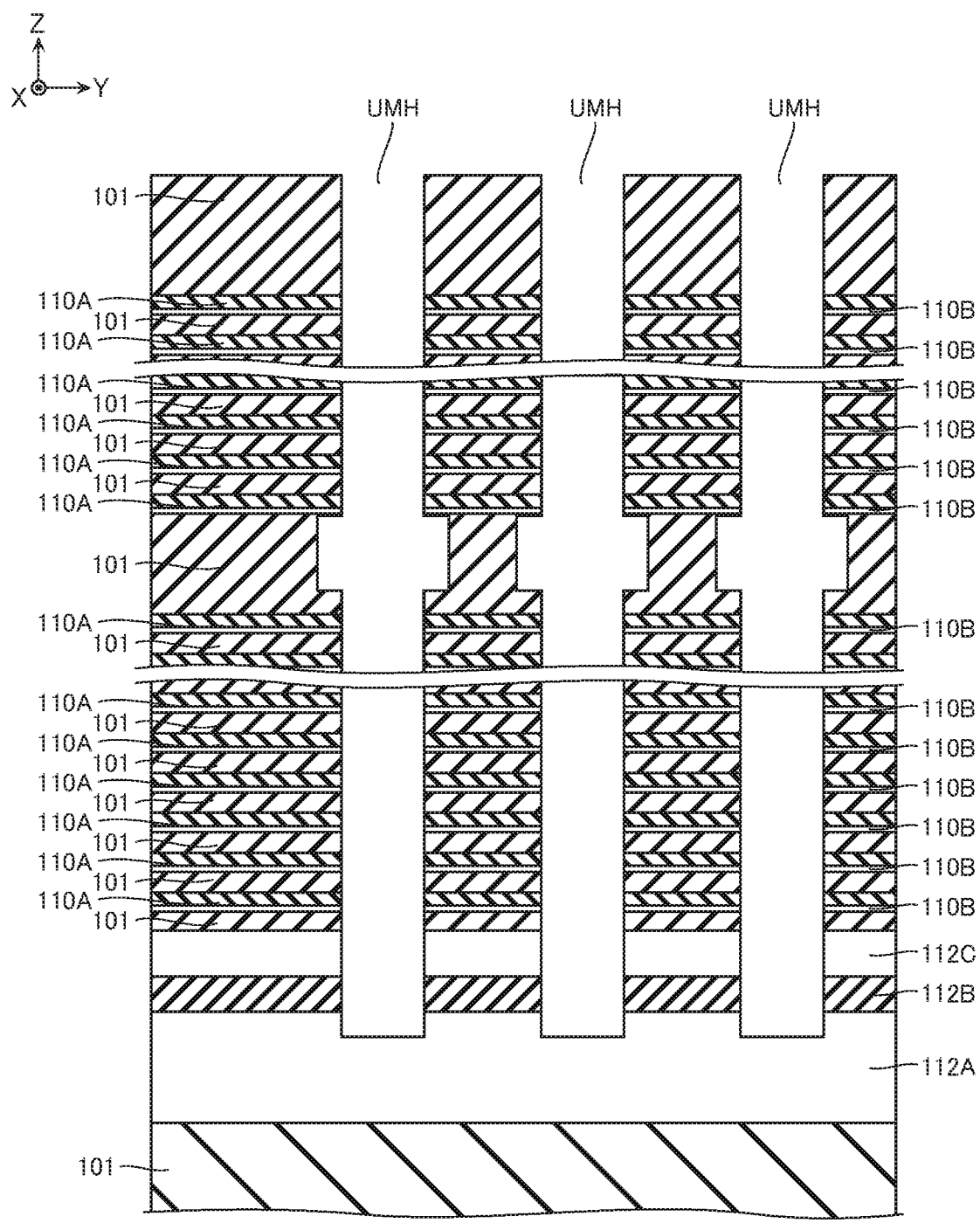
FIG. 23 is a schematic cross-sectional view for illustrating the manufacturing method.

Next, for example, as illustrated in FIG. 23, the amorphous silicon films 120A are removed. This process is performed by a method, such as wet etching or the like.

Figure 24:
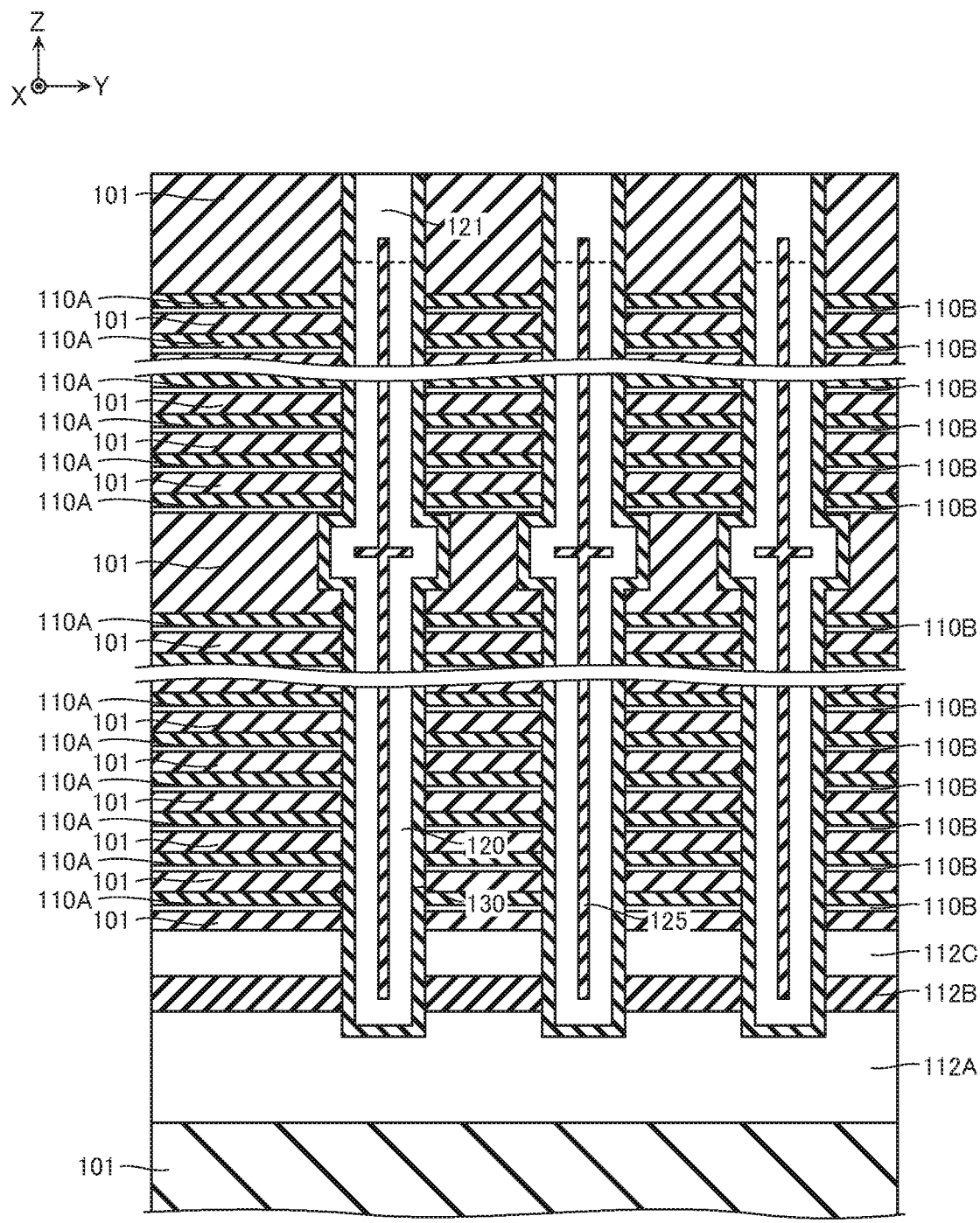
FIG. 24 is a schematic cross-sectional view for illustrating the manufacturing method.

Next, for example, as illustrated in FIG. 24, inside the memory holes LMH, UMH, the gate insulating films 130, the semiconductor layers 120, and the insulating layers 125 are formed. In this process, for example, film formation is performed by a method, such as CVD or the like, and amorphous silicon films are formed inside the memory holes LMH, UMH. Also, the crystalline structure of this amorphous silicon film is modified by, for example, the annealing process or the like.

Figure 25:
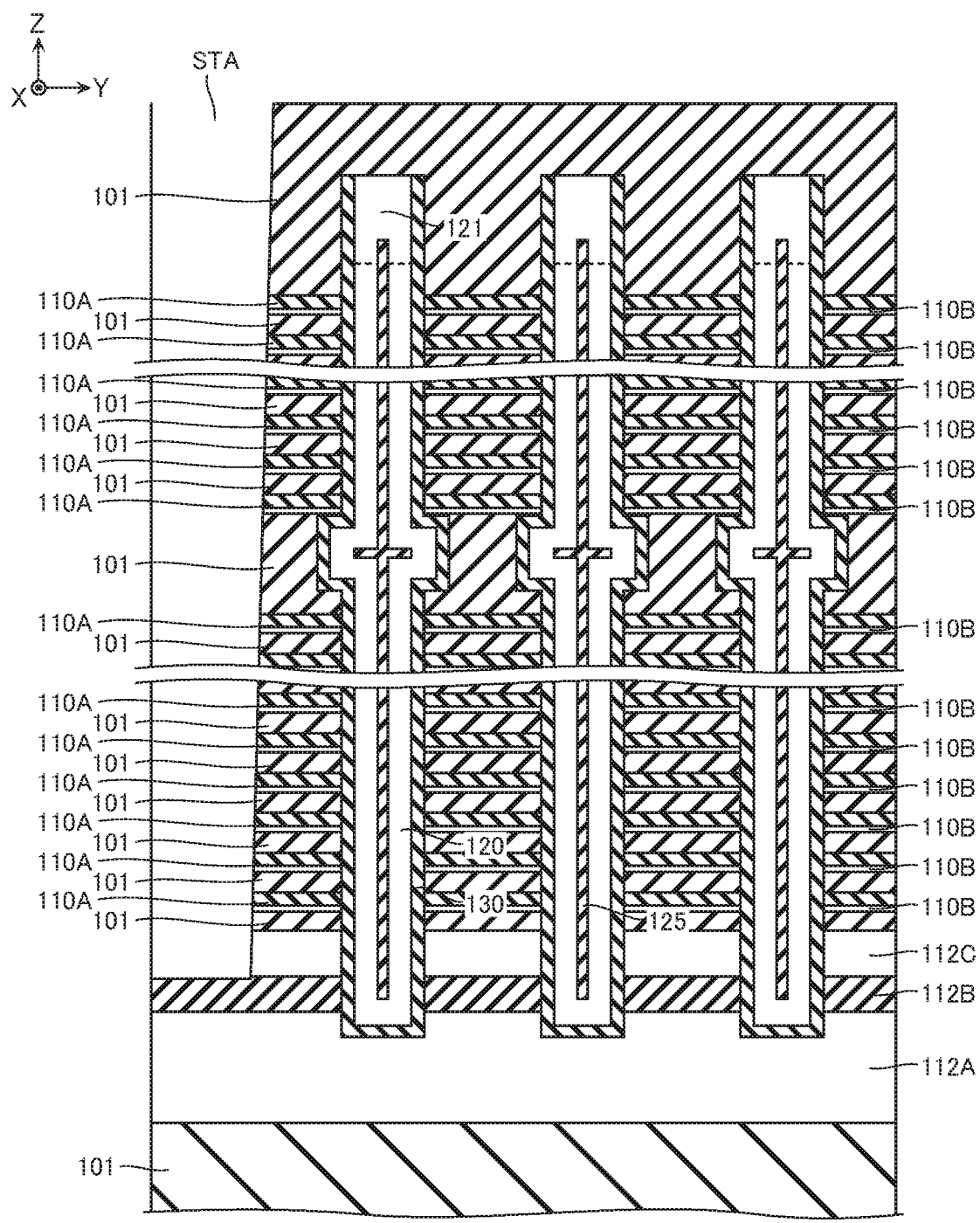
FIG. 25 is a schematic cross-sectional view for illustrating the manufacturing method.
Figure 26:
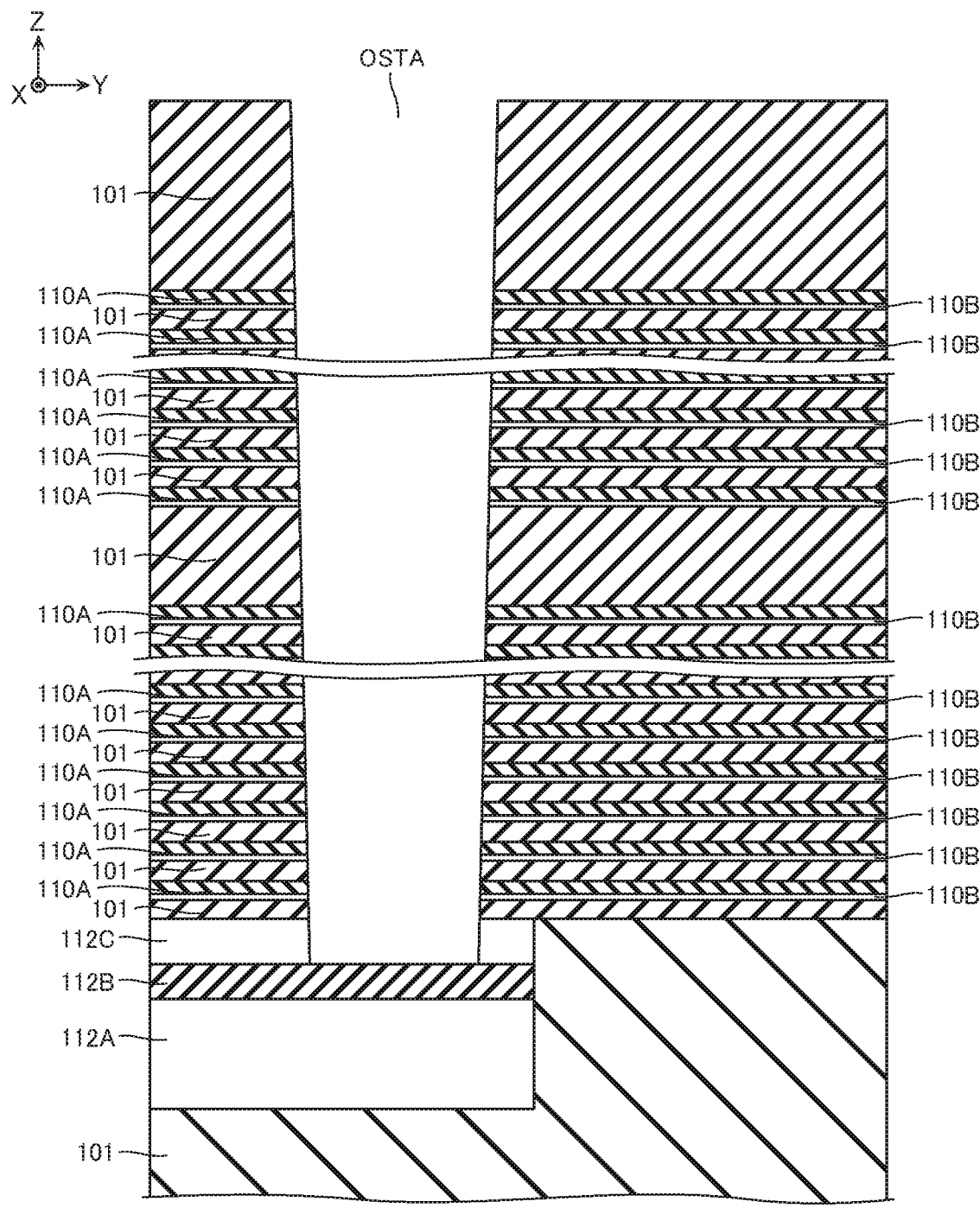
FIG. 26 is a schematic cross-sectional view for illustrating the manufacturing method.

Next, for example, as illustrated in FIG. 25 and FIG. 26, trenches STA (through-holes) are formed at the positions corresponding to the inter-block insulating layers ST, and trenches OSTA (through-hole) are formed at the positions corresponding to the insulating layers OST. The trenches STA, OSTA are trenches (through-holes) extending in the Z-direction and the X-direction, separating the interlayer insulating layers 101, the insulating layers 110A, the silicon layers 110B, and the semiconductor layer 112C in the Y-direction, and causing the upper surface of the sacrifice layer 112B to be exposed. This process is performed by a method, such as RIE or the like.

Figure 27:
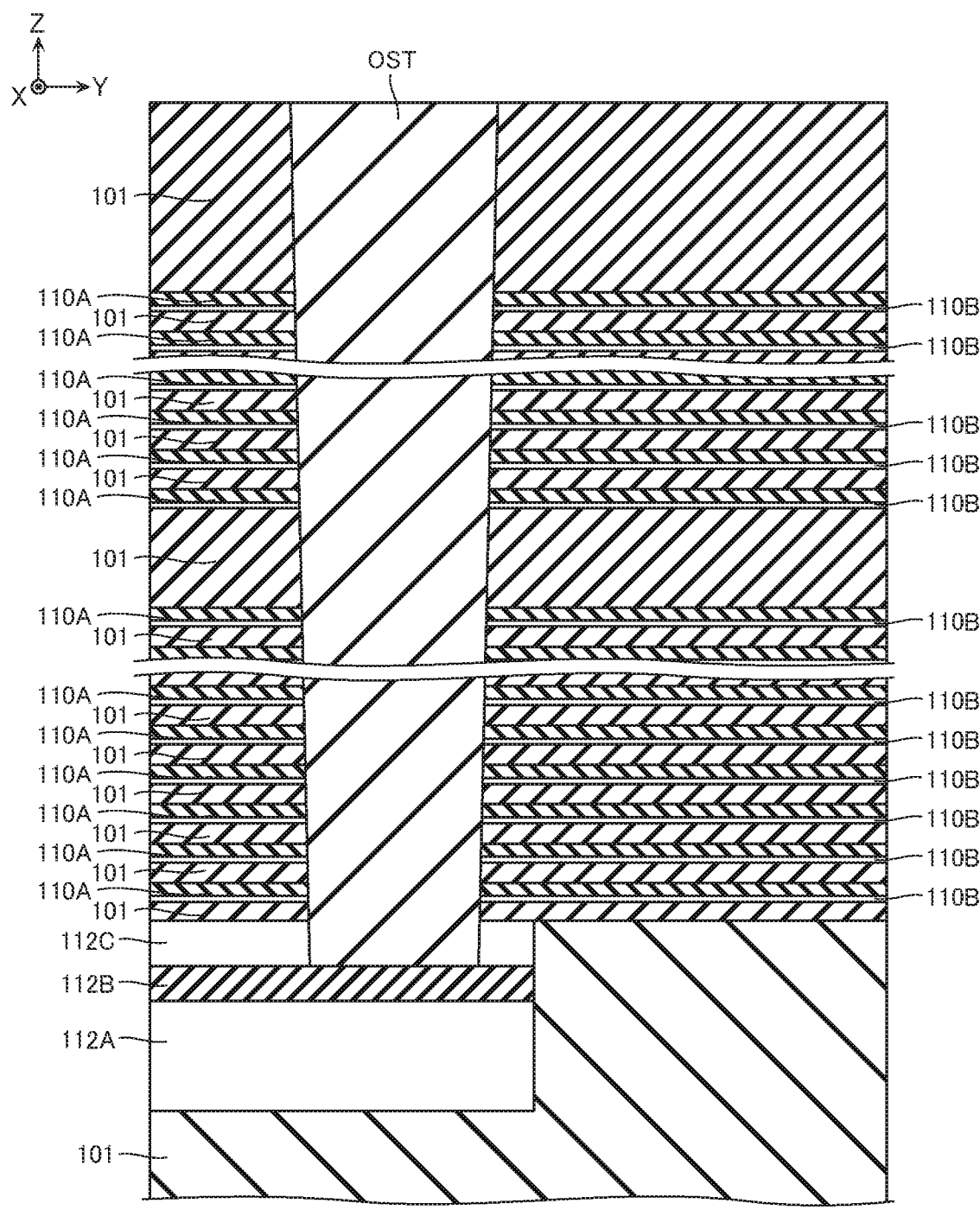
FIG. 27 is a schematic cross-sectional view for illustrating the manufacturing method.

Next, for example, as illustrated in FIG. 27, the insulating layer OST is formed inside the trench OSTA. This process is performed by a method, such as CVD or the like.

Figure 28:
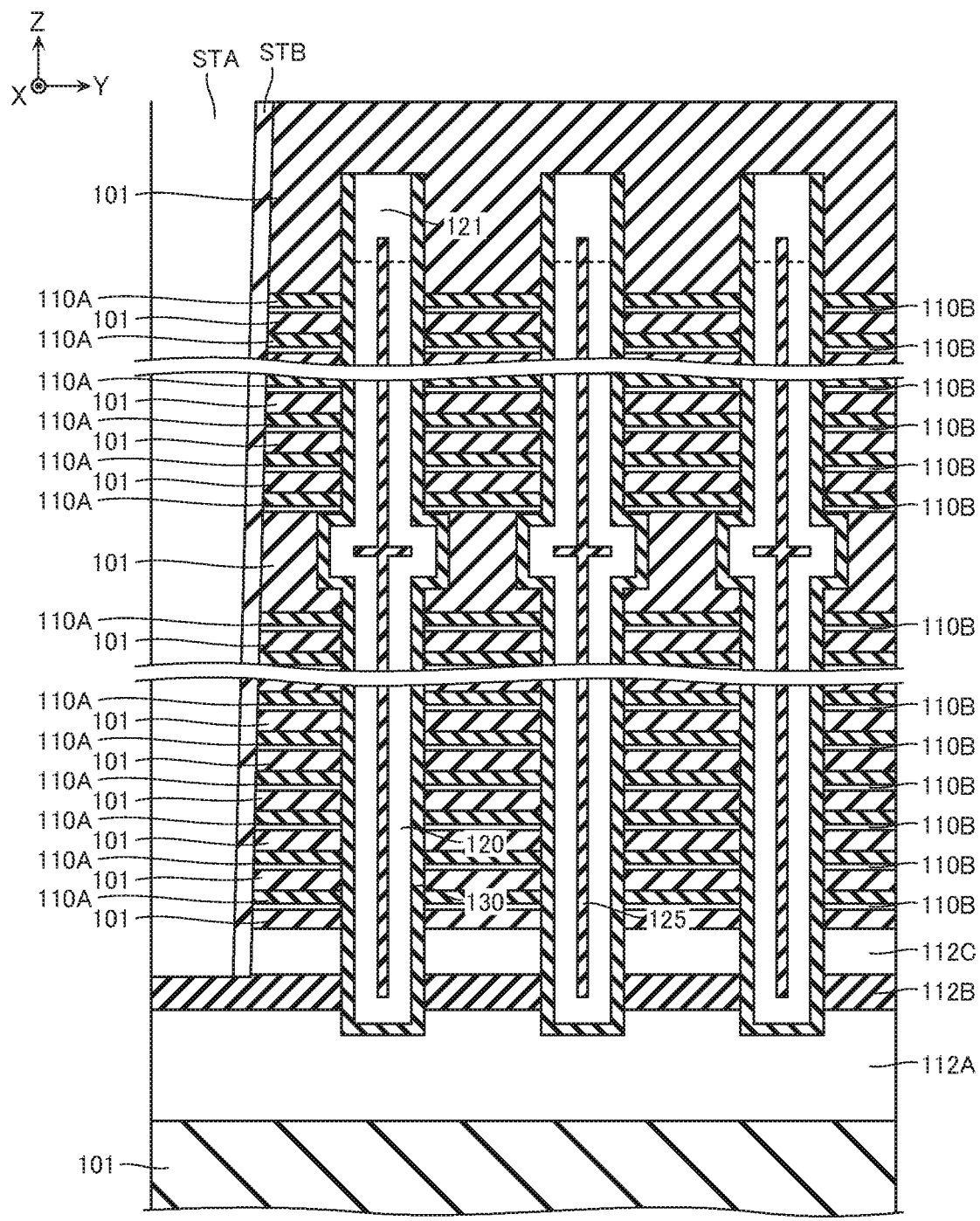
FIG. 28 is a schematic cross-sectional view for illustrating the manufacturing method.

Next, for example, as illustrated in FIG. 28, on the side surfaces of the trench STA in the Y-direction, protective films STB of silicon nitride or the like are formed. In this process, for example, an insulating films of silicon nitride or the like are formed on the side surfaces in the Y-direction and the bottom surface of the trench STA by a method, such as CVD or the like. Also, in this insulating film, the portion covering the bottom surface of the trench STA is removed by a method, such as RIE or the like.

Figure 29:
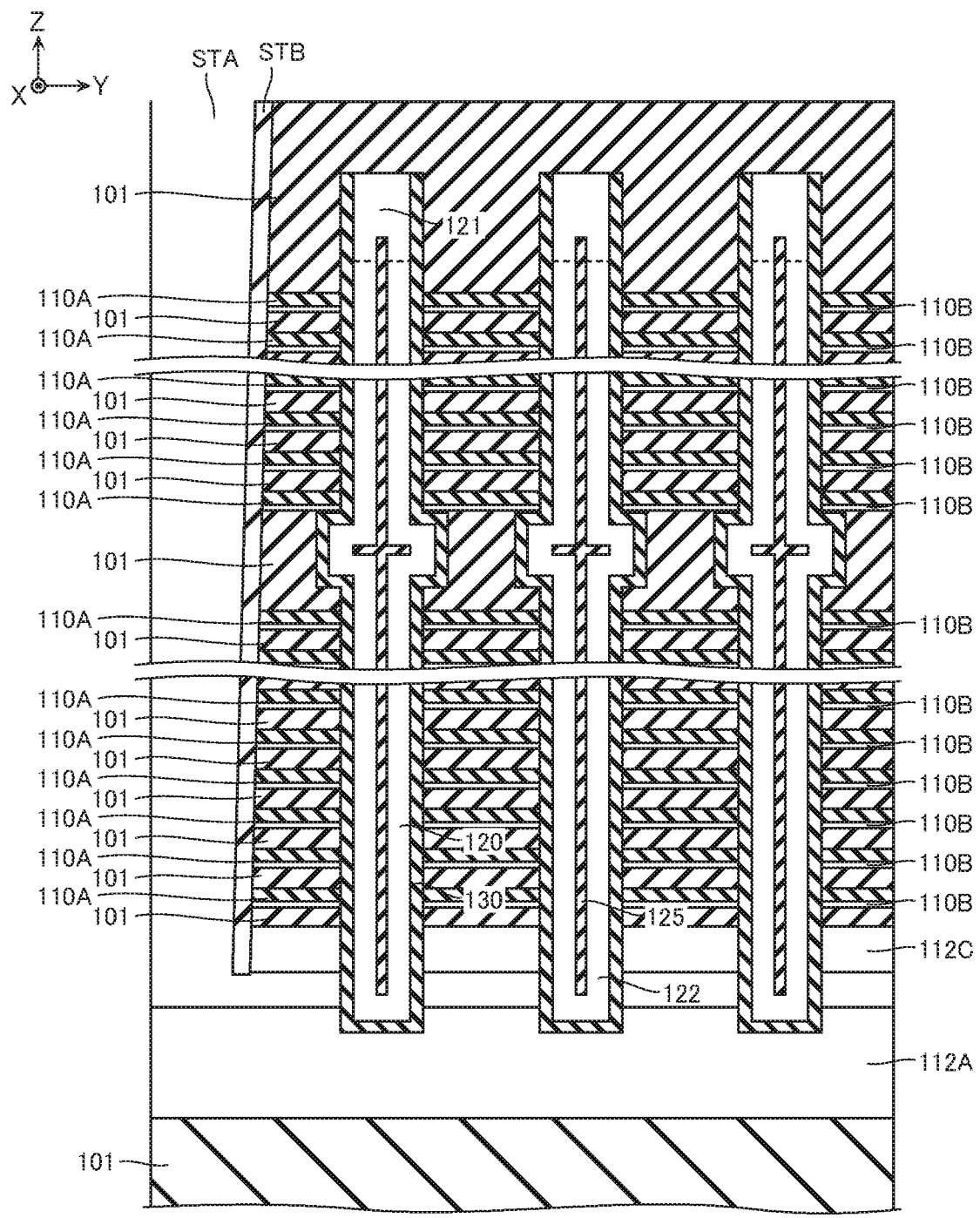
FIG. 29 is a schematic cross-sectional view for illustrating the manufacturing method.
Figure 30:
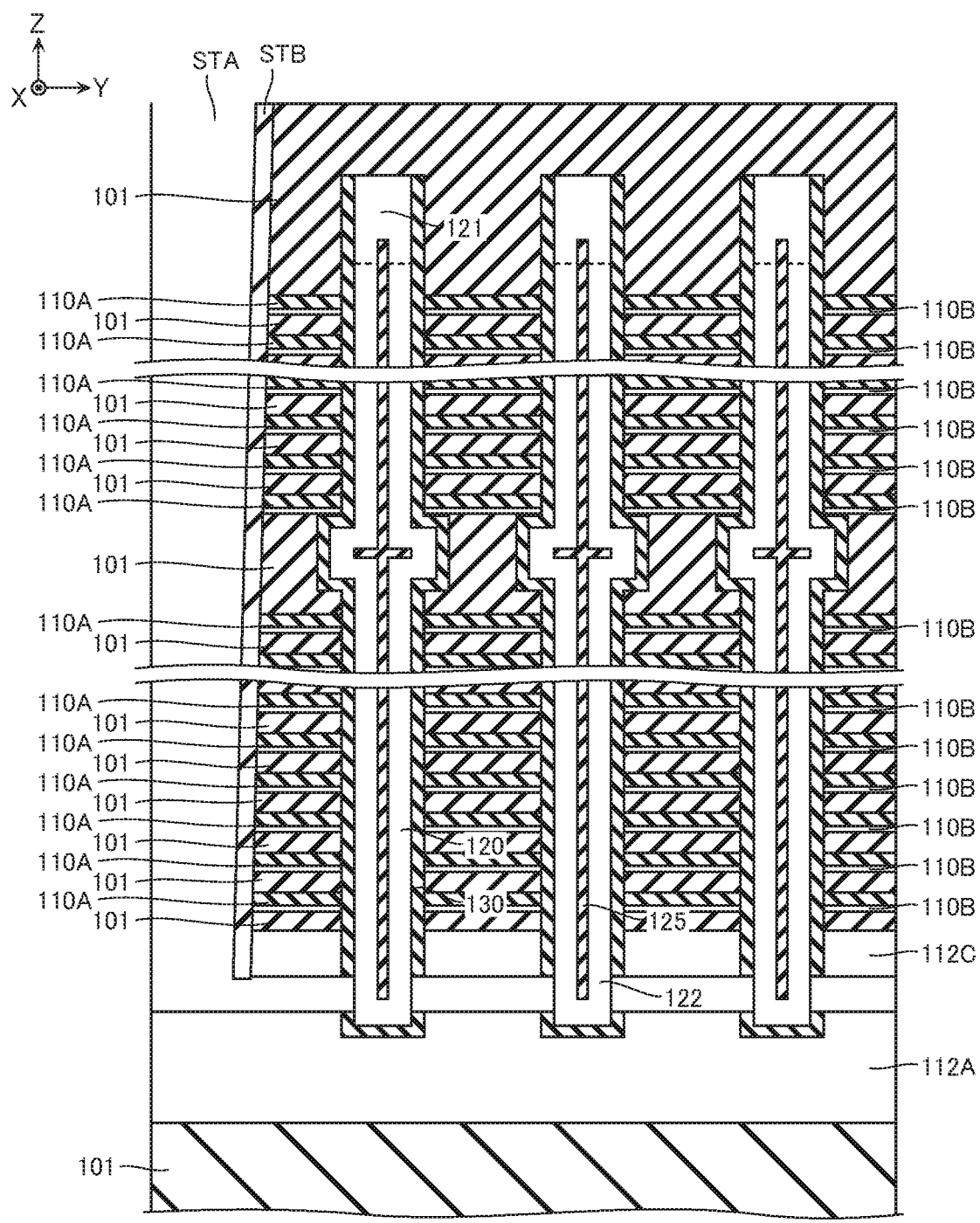
FIG. 30 is a schematic cross-sectional view for illustrating the manufacturing method.

Next, for example, as illustrated in FIG. 29 and FIG. 30, the sacrifice layer 112B and the gate insulating films 130 are partially removed to cause parts of the semiconductor layers 120 to be exposed. This process is performed by a method, such as wet etching or the like.

Figure 31:
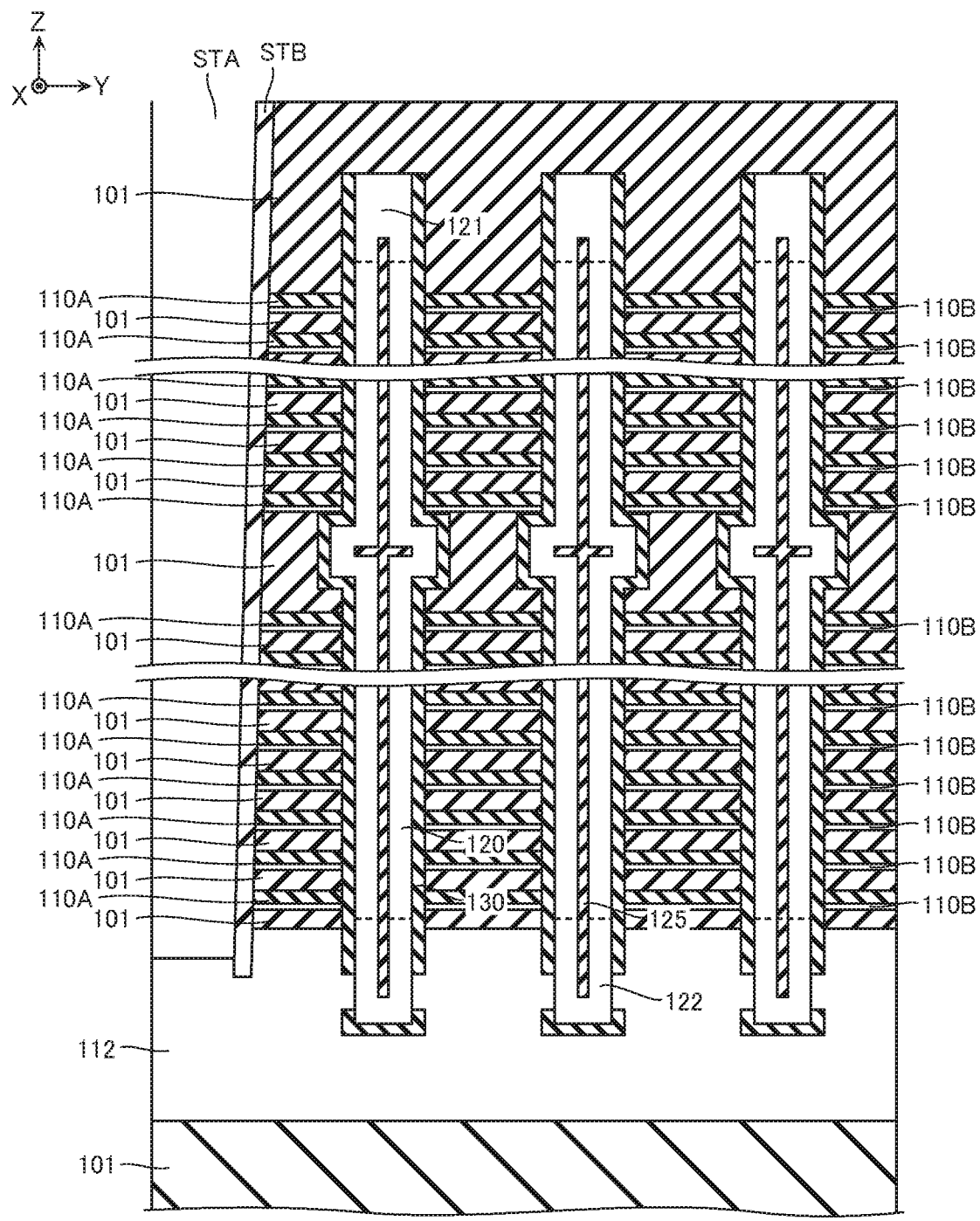
FIG. 31 is a schematic cross-sectional view for illustrating the manufacturing method.

Next, for example, as illustrated in FIG. 31, the semiconductor layer 112 is formed. This process is performed by a method, such as epitaxial growth method or the like.

Figure 32:
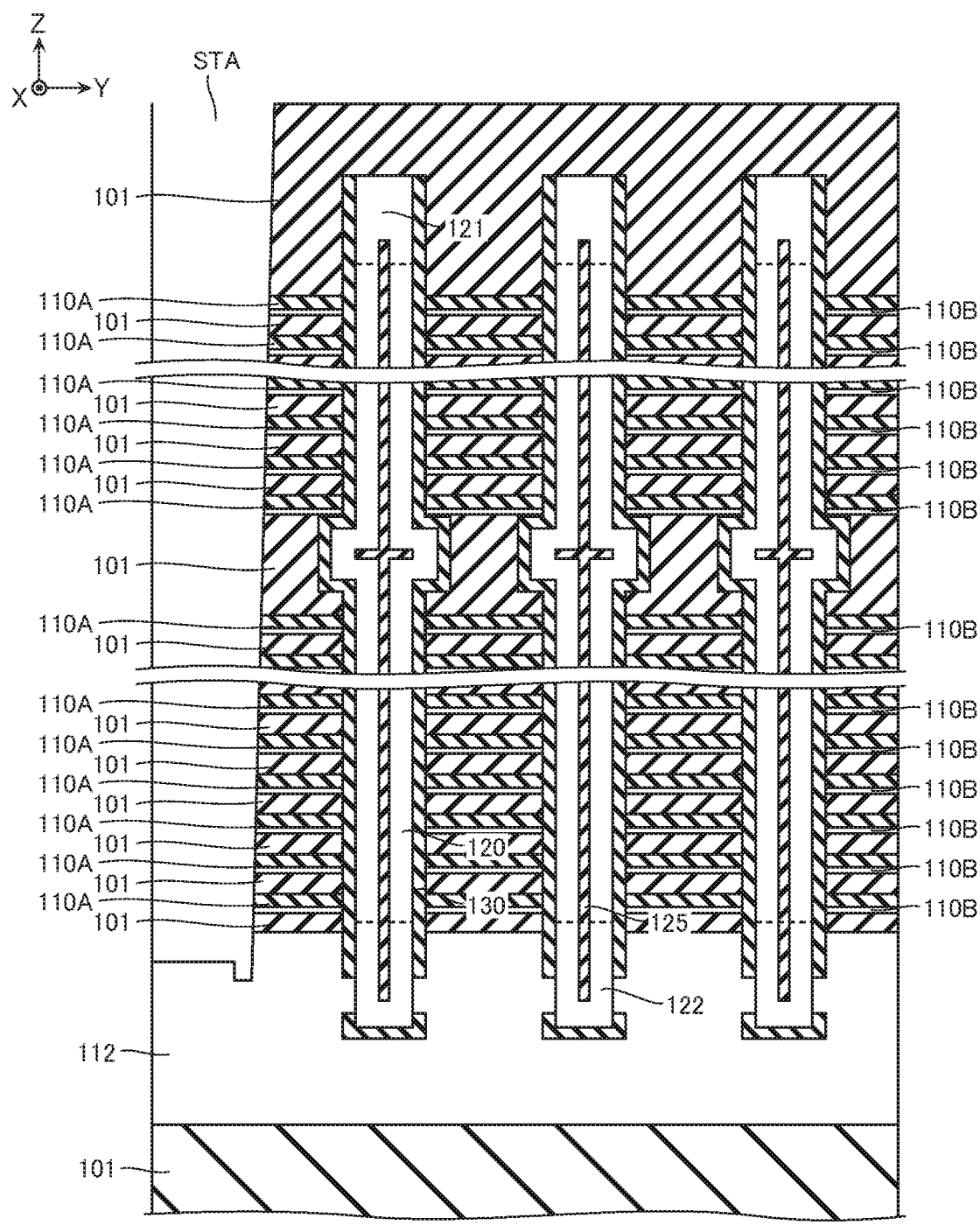
FIG. 32 is a schematic cross-sectional view for illustrating the manufacturing method.

Next, for example, as illustrated in FIG. 32, the protective films STB are removed. This process is performed by a method, such as wet etching or the like.

Figure 33:
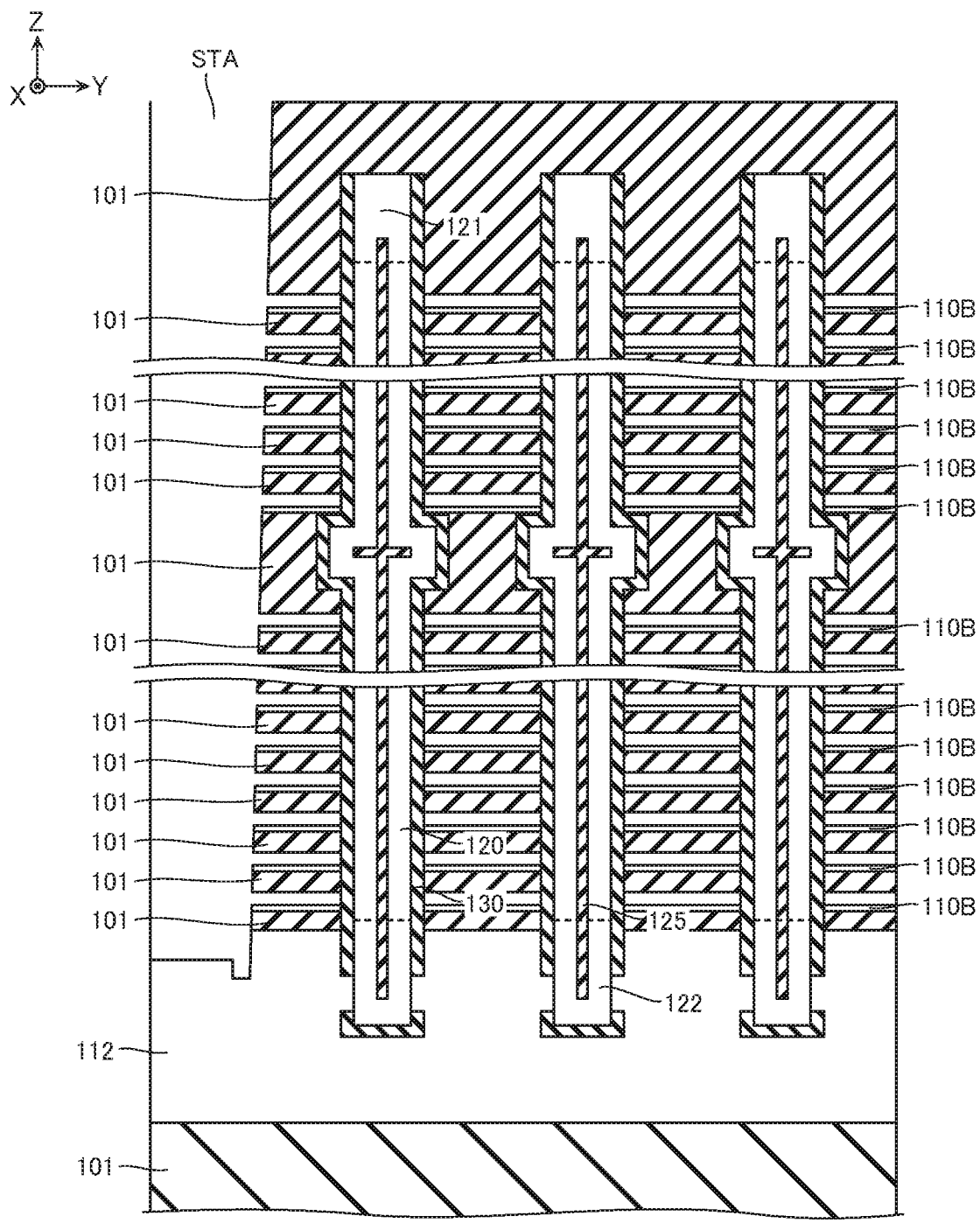
FIG. 33 is a schematic cross-sectional view for illustrating the manufacturing method.
Figure 34:
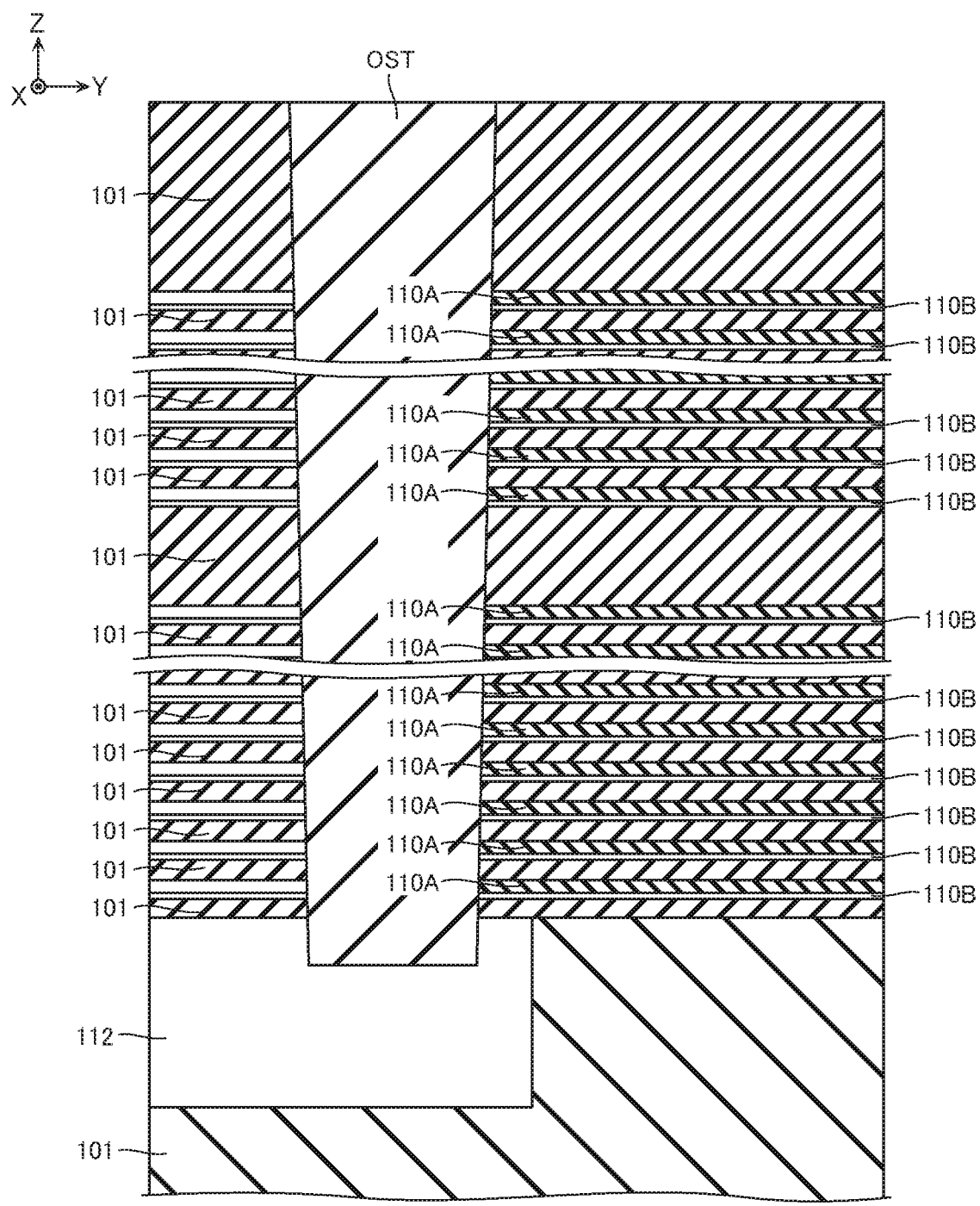
FIG. 34 is a schematic cross-sectional view for illustrating the manufacturing method.

Next, for example, as illustrated in FIG. 33 and FIG. 34, the insulating layers 110A are removed via the trench STA. Thus, a hollow wall structure including the plurality of interlayer insulating layers 101 arranged in the Z-direction and a structure inside the memory holes LMH, UMH (the semiconductor layer 120, the gate insulating film 130, and the insulating layer 125) supporting these interlayer insulating layers 101 are formed. Also, the lower surface of the interlayer insulating layer 101, the upper surface of the silicon layer 110B, and parts of the outer peripheral surface of the gate insulating films 130 are exposed. This process is performed by a method, such as wet etching or the like.

As illustrated in FIG. 34, in this process, the insulating layers 110A remain in the contact connection sub-region $r_{C4T}$. Although not illustrated, the insulating layers 110A remain in the contact connection region $R_{BLT}$ (See FIG. 12).

Figure 35:
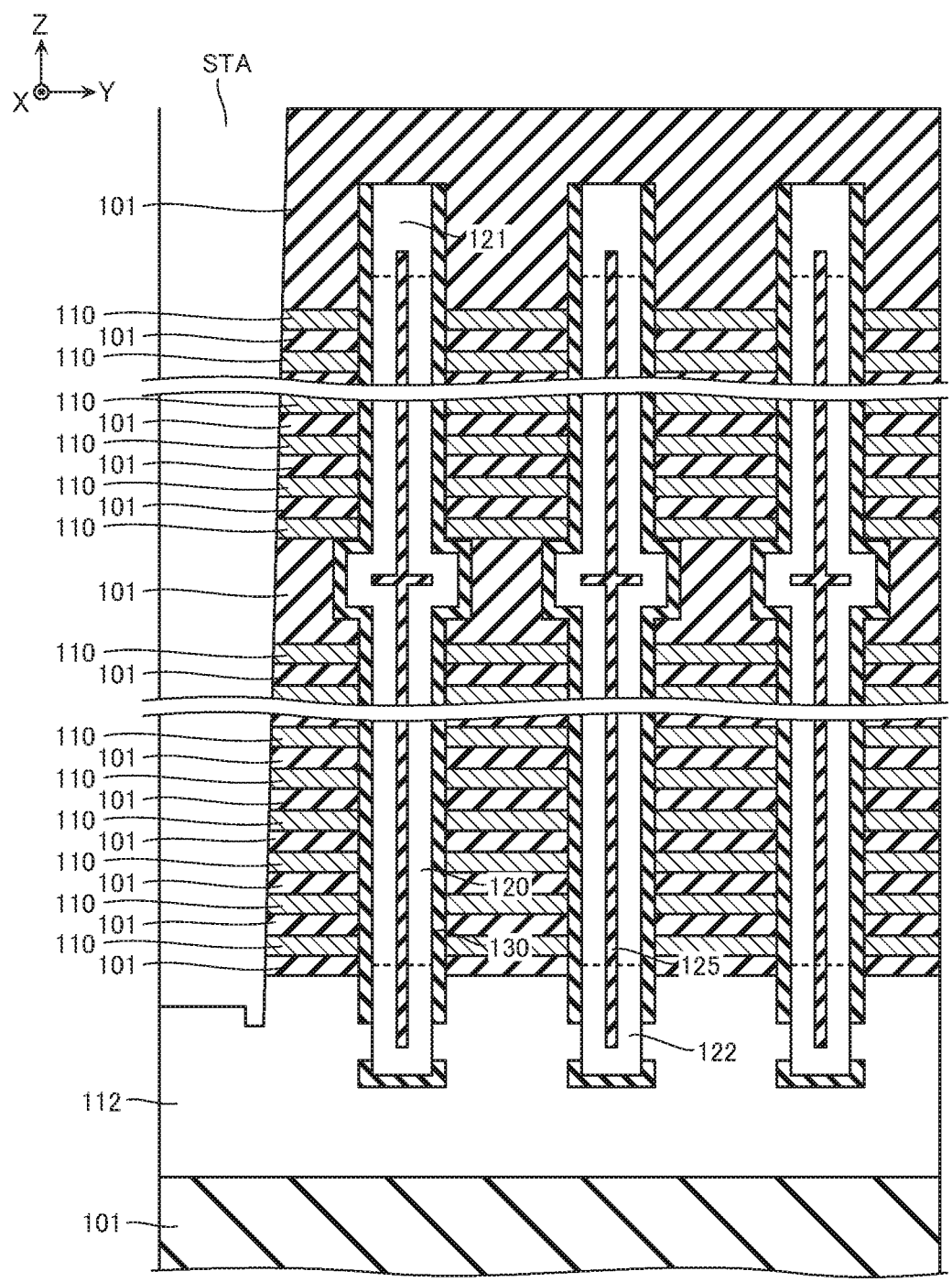
FIG. 35 is a schematic cross-sectional view for illustrating the manufacturing method.
Figure 36:
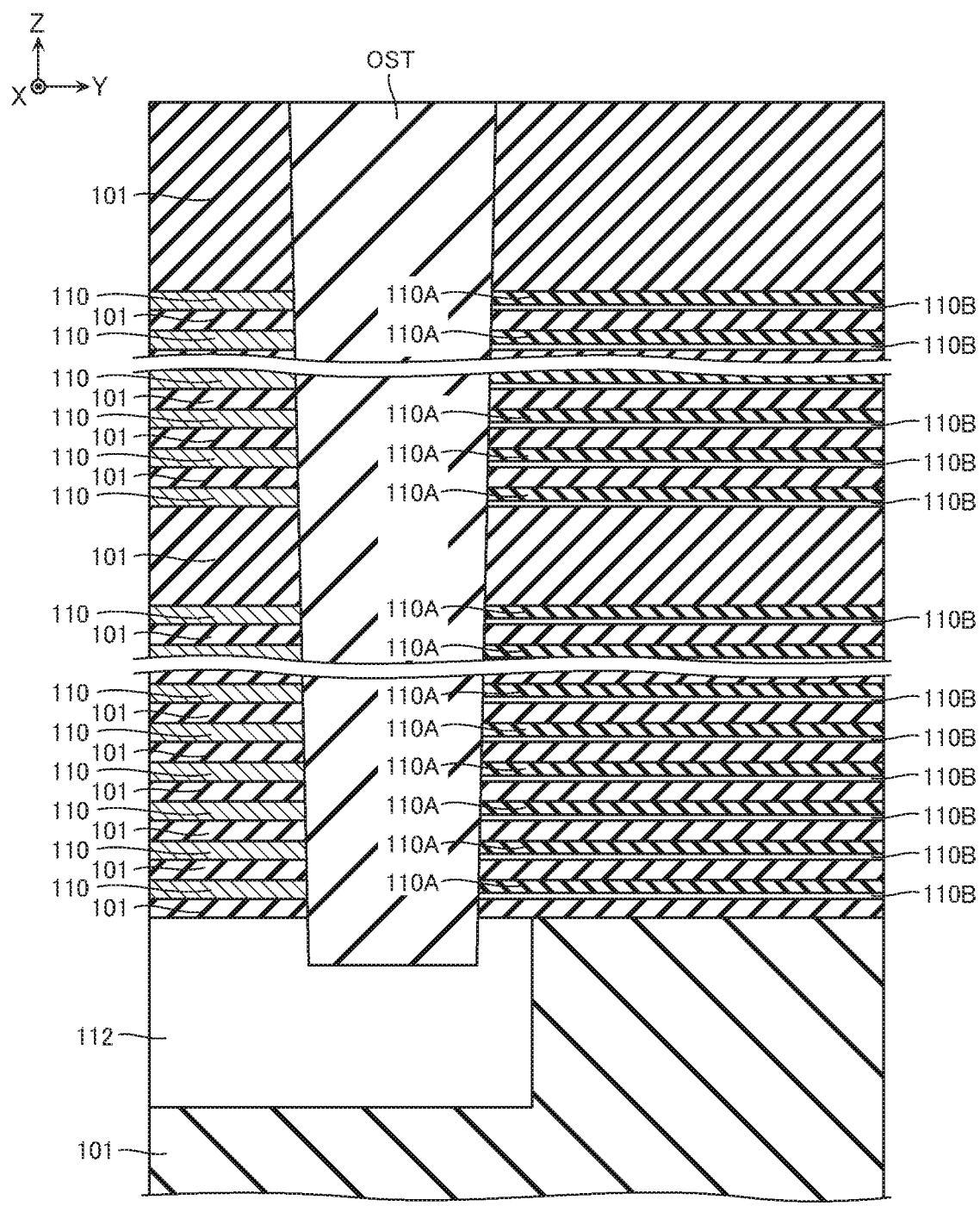
FIG. 36 is a schematic cross-sectional view for illustrating the manufacturing method.

Next, for example, as illustrated in FIG. 35 and FIG. 36, the conductive layers 110 are formed. This process is performed by a method, such as CVD or the like using a metal halide, such as tungsten hexafluoride ($WF_6$), tungsten hexachloride ($WCl_6$), tungsten hexabromide ($WBr_6$), molybdenum hexafluoride ($MoF_6$), molybdenum hexachloride ($MoCl_6$), molybdenum hexabromide ($MoBr_6$). For example, when tungsten hexafluoride ($WF_6$) is used, between the tungsten hexafluoride ($WF_6$) and the silicon layers 110B, a chemical reaction occurs as follows: $2WF_6$ (gas)+$3Si$ (solid)→$2W$ (solid)+$3SiF_4$ (gas). Accordingly, tungsten (W) is formed in a solid form on the upper surface and the lower surface of the interlayer insulating layer 101, and silicon (Si) and fluorine (F) are discharged in a gaseous form.

According to this embodiment, the silicon layers 110B are formed on the upper surfaces of the interlayer insulating layers 101. Such a method causes silicon (Si) in the silicon layers 110B to remain inside the conductive layers 110 even after forming the conductive layers 110 in some cases. As a result, for example, as described with reference to FIG. 6 to FIG. 8, the region $R_{WL3}$ in the vicinity of the lower surface of the conductive layer 110 has a higher silicon (Si) content than silicon (Si) contents in other regions of the conductive layer 110 in some cases.

Figure 37:
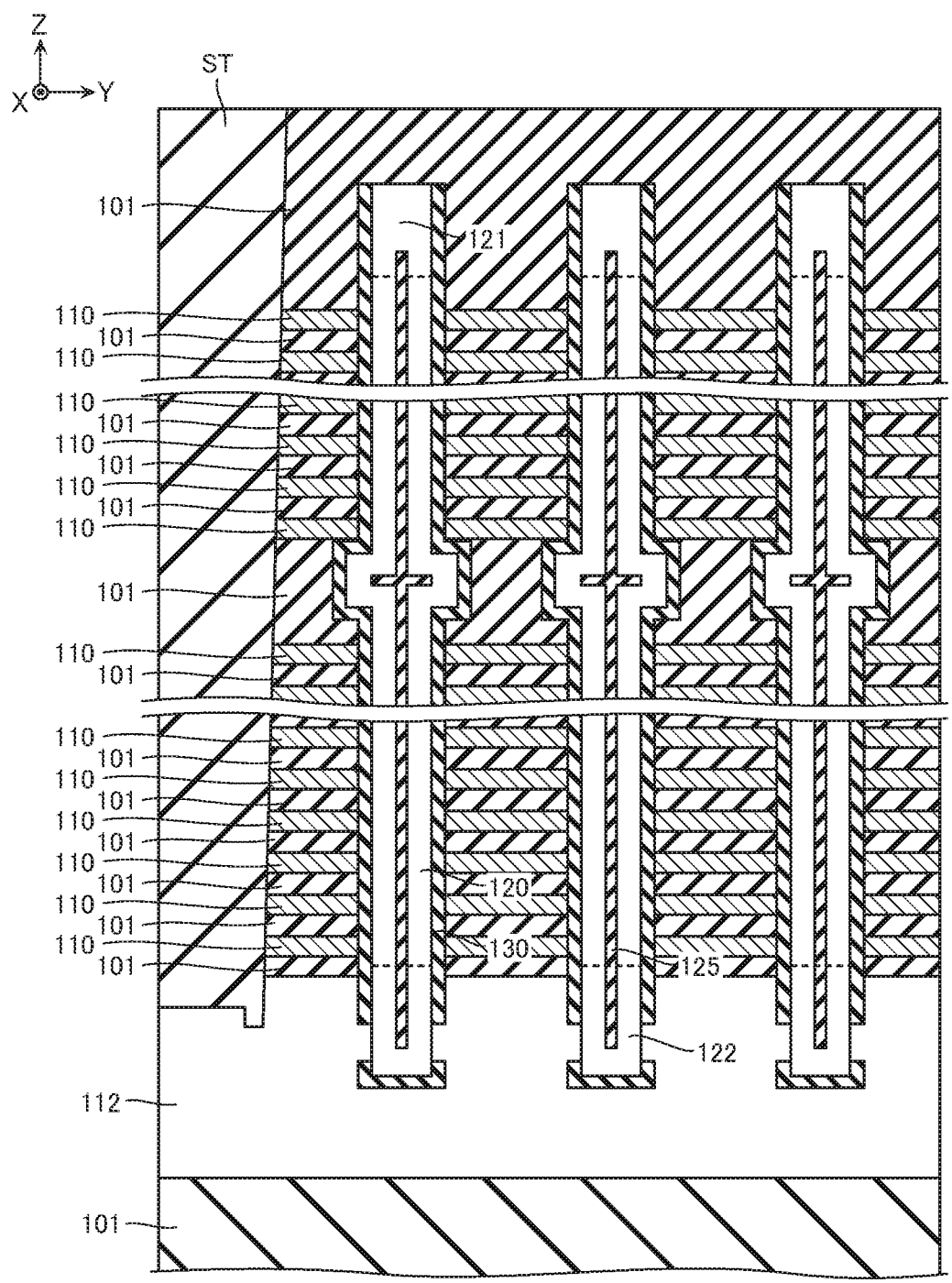
FIG. 37 is a schematic cross-sectional view for illustrating the manufacturing method.

Next, for example, as illustrated in FIG. 37, the inter-block insulating layer ST is formed within the trench STA. This process is performed by methods, such as CVD and, RIE, and the like.

Figure 38:
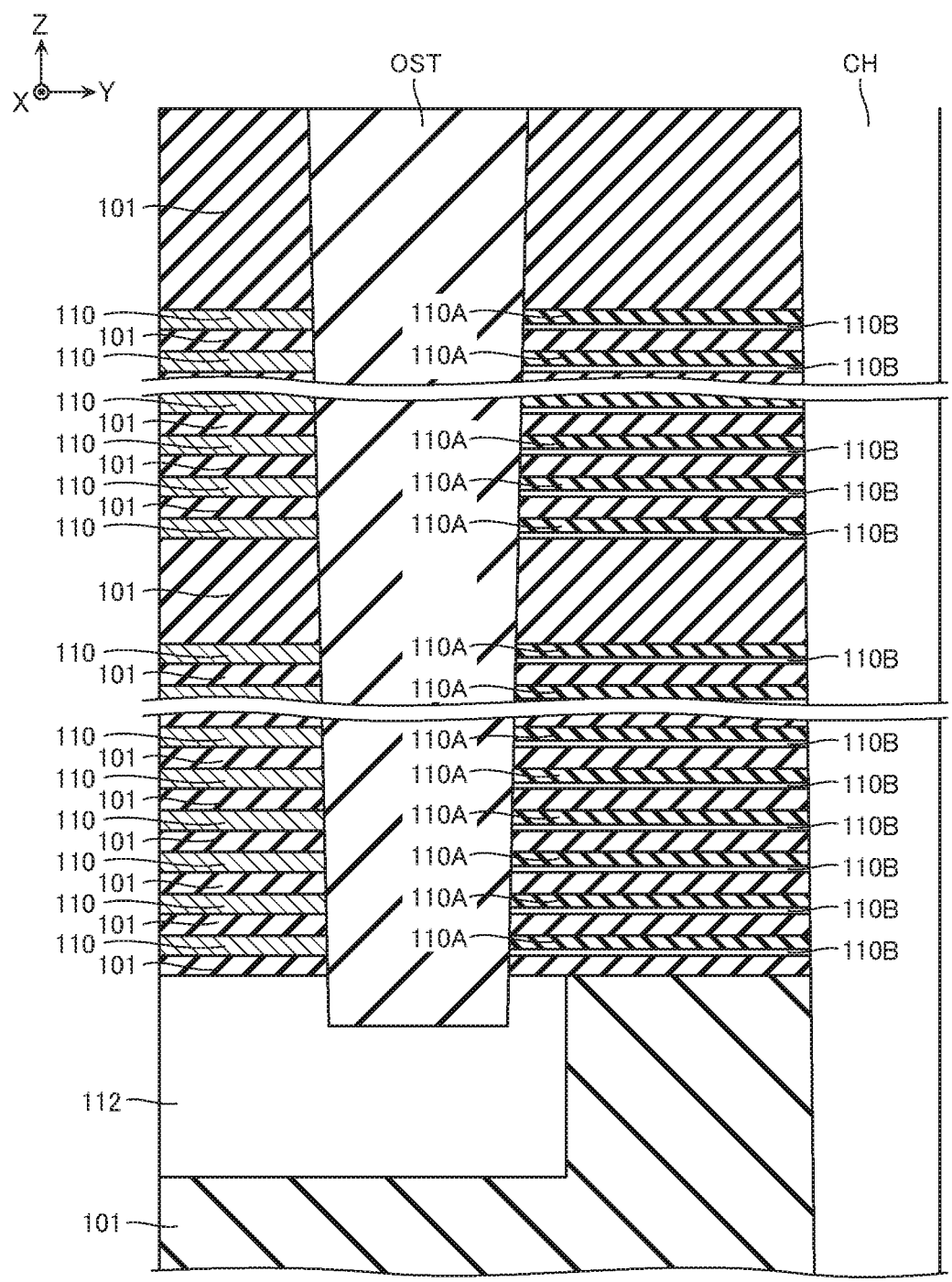
FIG. 38 is a schematic cross-sectional view for illustrating the manufacturing method.

Next, for example, as illustrated in FIG. 38, contact holes CH are formed at the positions corresponding to the contacts C4a. Also, although not illustrated, contact holes CH are also formed at positions corresponding to the contact C4b. The contact hole CH is a through-hole extending in the Z-direction, and passing through the interlayer insulating layers 101, the insulating layers 110A, and the silicon layers 110B. This process is performed by a method, such as RIE or the like.

Figure 39:
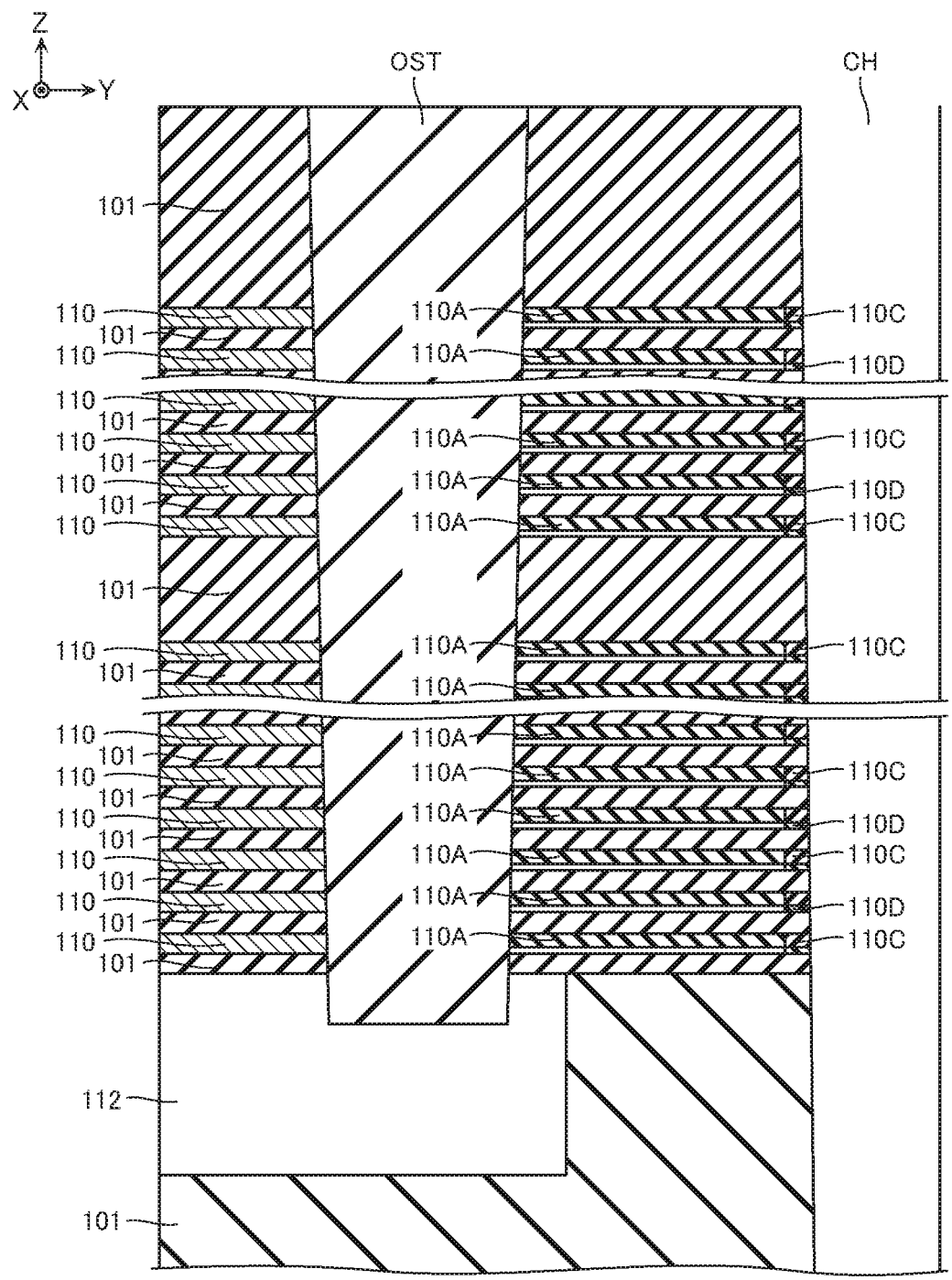
FIG. 39 is a schematic cross-sectional view for illustrating the manufacturing method.

Next, for example, as illustrated in FIG. 39, on the inner peripheral surface of the contact holes CH, the insulating layers 110C, 110D are formed. This process may be performed by, for example, oxidized treatment. Also, in this process, the insulating layers 110A and the silicon layers 110B may be partially and selectively removed by a method, such as the wet etching or the like and the insulating layers 110C, 110D may be formed by a method, such as CVD or the like on the parts from which the insulating layers 110A and the silicon layers 110B are removed.

Next, for example, as illustrated in FIG. 9 and FIG. 12, the contacts C4a, C4b are formed inside the contact holes CH. This process is performed by methods, such as CVD and RIE, and the like.

Subsequently, the memory die MD is formed by forming wiring or the like and by separating a wafer by dicing.

[Comparative Example]

Figure 40:
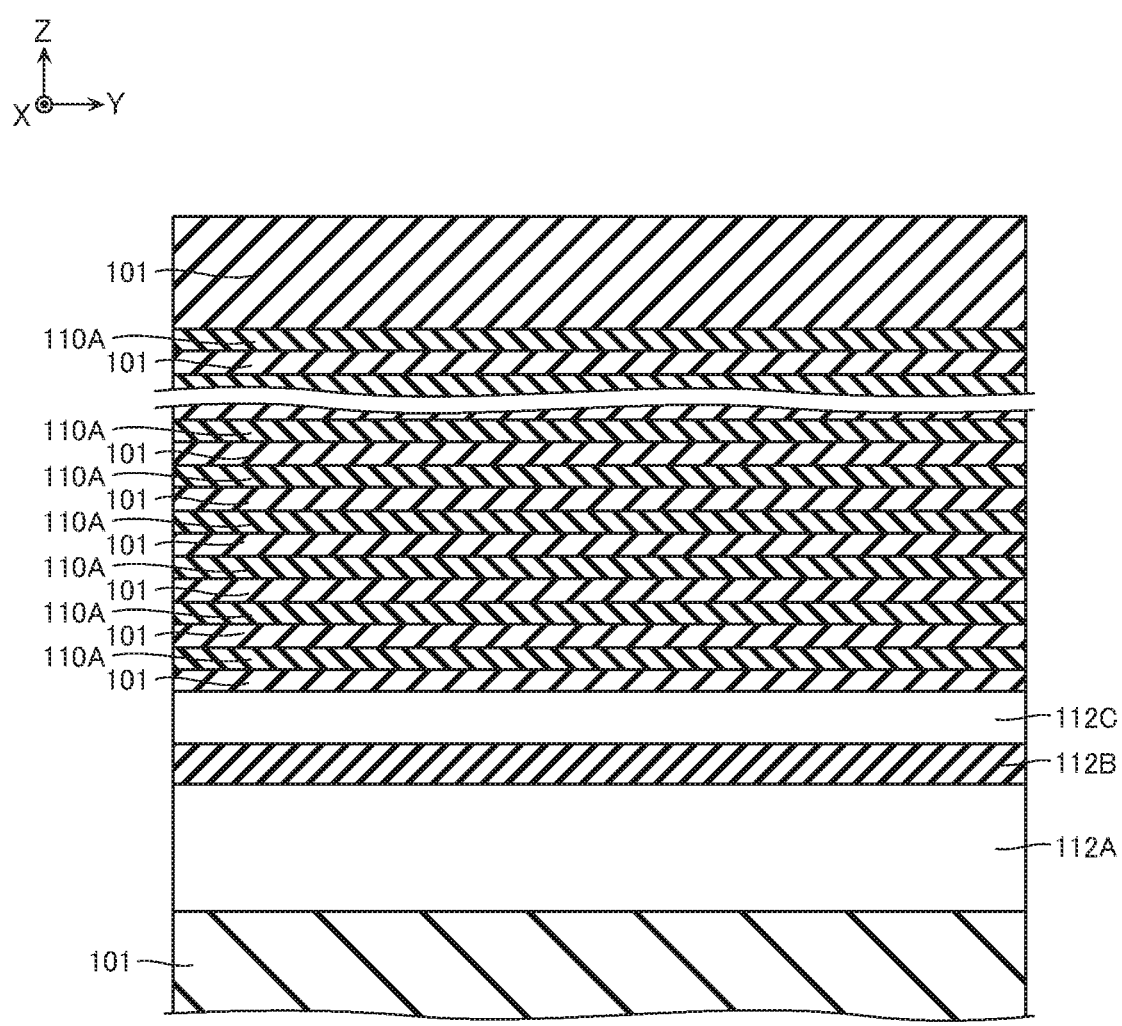
FIG. 40 is a schematic cross-sectional view illustrating a manufacturing method of a semiconductor memory device according to a comparative example.
Figure 41:
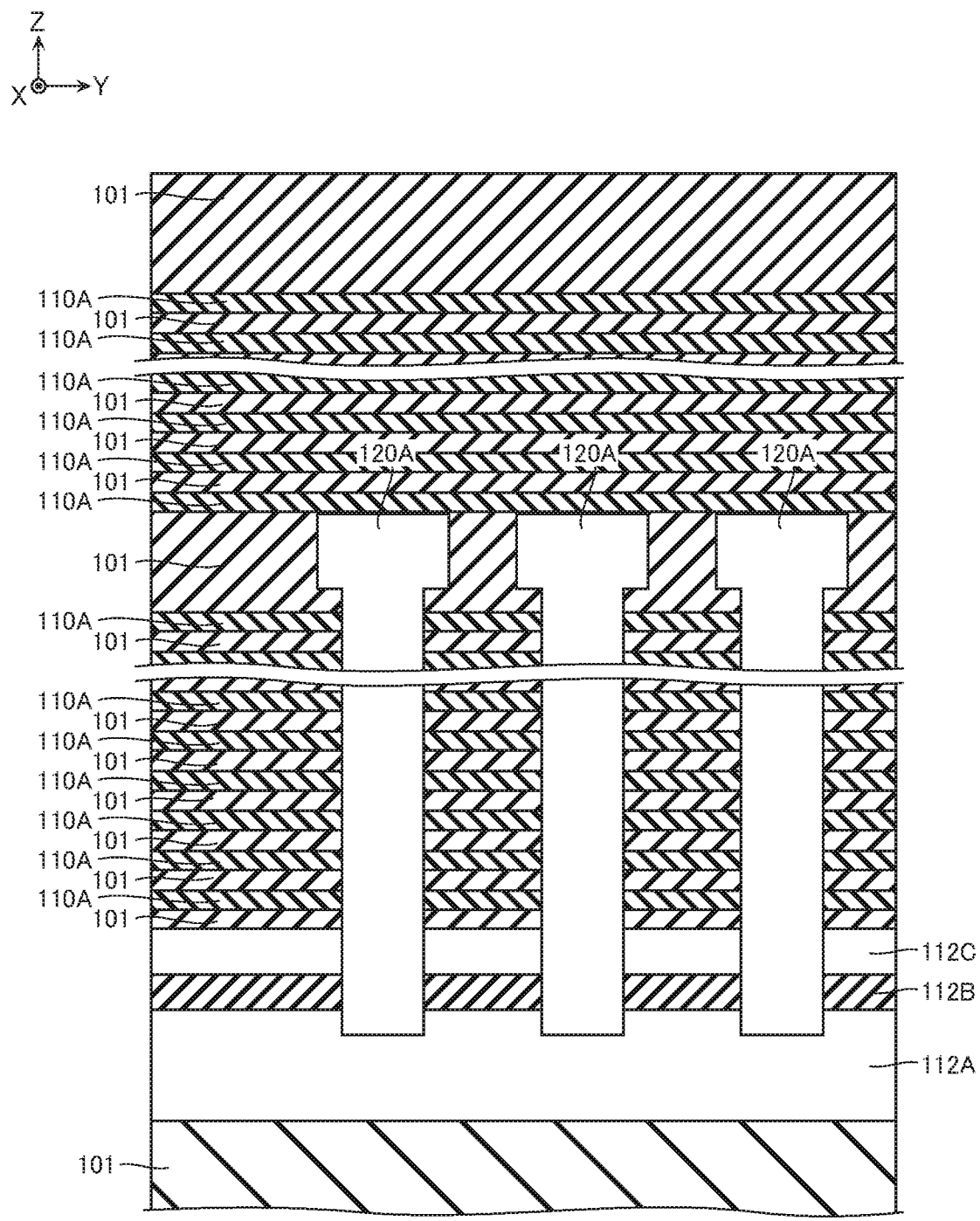
FIG. 41 is a schematic cross-sectional view for illustrating the manufacturing method.

Next, with reference to FIG. 40 and FIG. 41, the method of manufacturing the semiconductor memory device according to the comparative example is described. FIG. 40 and FIG. 41 are schematic cross-sectional views for describing the manufacturing method.

As illustrated in FIG. 40, in the process corresponding to FIG. 15, the silicon layers 110B are not formed by the method of manufacturing the semiconductor memory device according to the comparative example. Also, as illustrated in FIG. 41, in the process corresponding to FIG. 21, the silicon layers 110B are not formed.

In the process corresponding to FIG. 35 and FIG. 36, the conductive layers 110 are formed by the manufacturing method of the semiconductor memory device according to the comparative example. This process is performed by a method, such as CVD or the like using a metal halide, such as tungsten hexafluoride ($WF_6$). When the conductive layers 110 are formed by such methods, fluorine (F) remains inside the conductive layers 110 in some cases.

Here, the fluorine (F) inside the conductive layers 110 may diffuse into other structures in the subsequent heating process, which results in removing insulating films, such as silicon oxide ($SiO_2$), in some cases.

Figure 42:
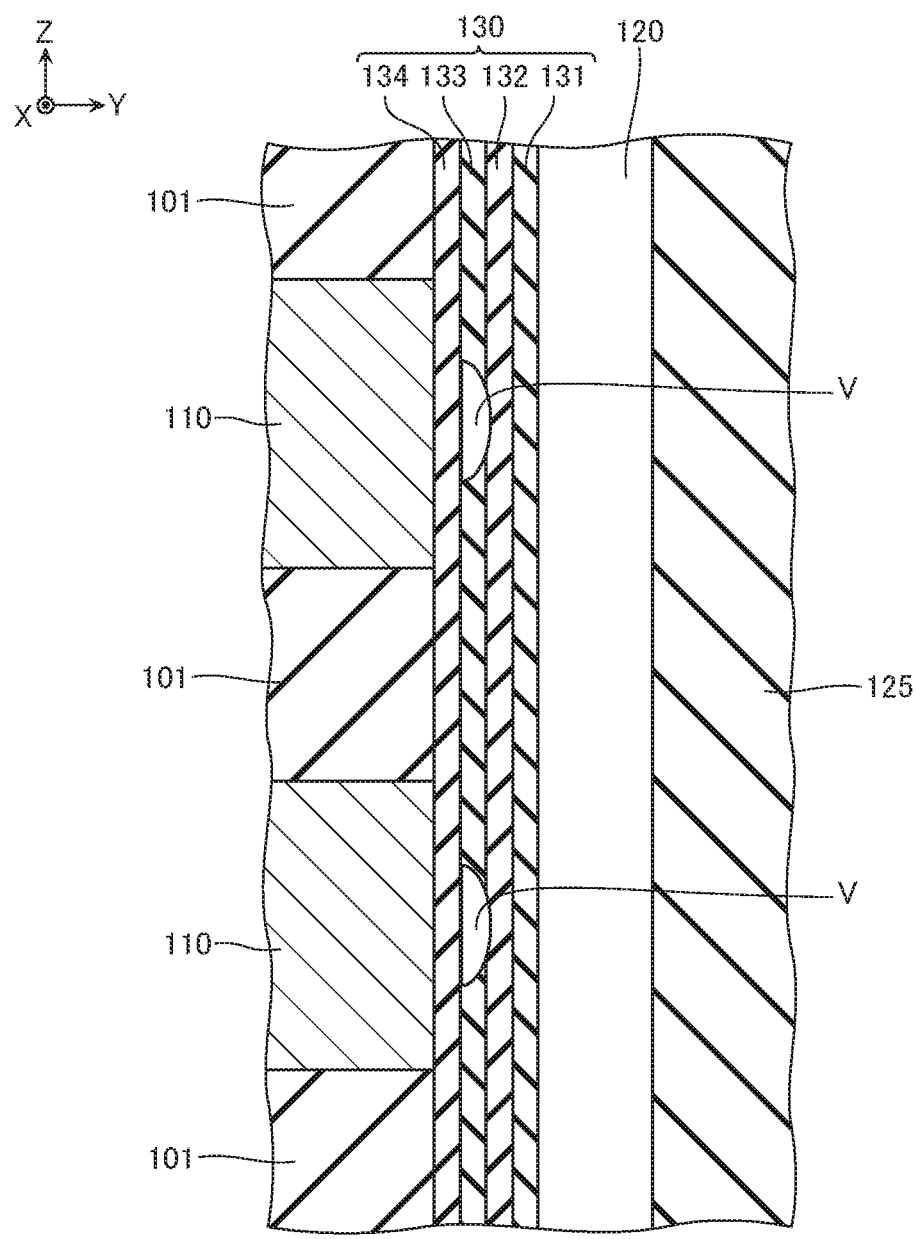
FIG. 42 is a schematic cross-sectional view illustrating a part of a configuration of the semiconductor memory device according to the comparative example.

For example, in the example of FIG. 42, the fluorine (F) in the conductive layers 110 reaches the block insulating film 133 through the high-dielectric-constant insulating film 134, resulting in partially removing the block insulating film 133 to form a void V. In such case, a leak current occurs between the semiconductor layer 120 and the conductive layers 110 in some cases.

Figure 43:
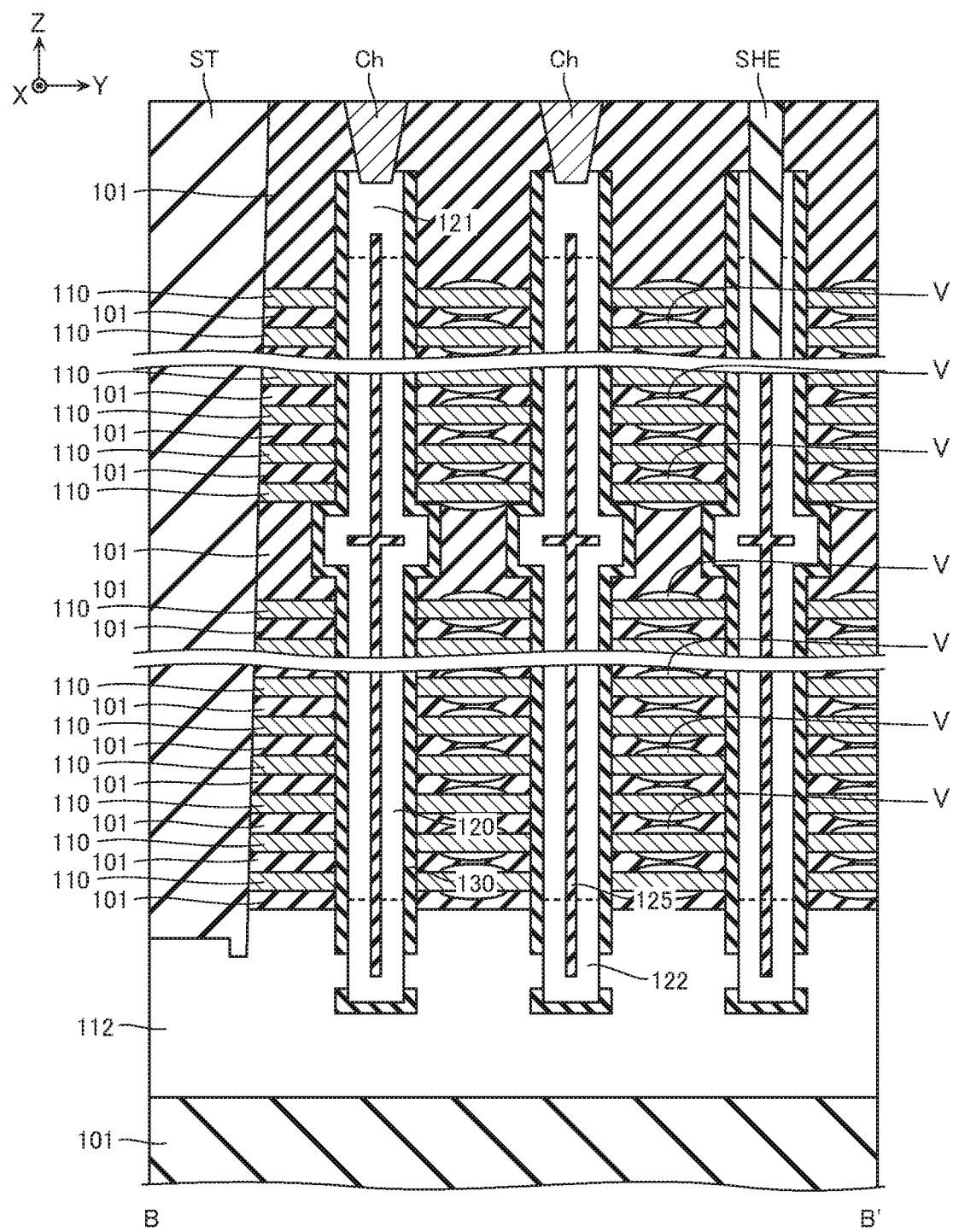
FIG. 43 is a schematic cross-sectional view illustrating a part of the configuration of the semiconductor memory device.

Also, for example, in the example of FIG. 43, the fluorine (F) in the conductive layers 110 reaches the interlayer insulating layers 101, resulting in partially removing the interlayer insulating layers 101 to form voids V. In such case, a leak current occurs between two conductive layers 110 adjacent in the Z-direction in some cases.

[Effects]

In the method of manufacturing the semiconductor memory device according to the embodiment, the silicon layers 110B are formed in the process described with reference to FIG. 15 and the process described with reference to FIG. 21. Thus, as described above, in the process corresponding to FIG. 35 and FIG. 36, the fluorine (F) or the like can be preferably discharged to reduce the occurrence of the above-described leak current.

Also, the semiconductor memory device manufactured by such methods, for example, as described with reference to FIG. 6 to FIG. 8, contains silicon (Si) in the conductive layers 110 in some cases.

Here, when the conductive layers 110 have a higher silicon (Si) content, the resistivities of the conductive layers 110 increase in some cases. Accordingly, for example, when the region $R_{WL1}$ (FIG. 6) in the YZ cross-section in the conductive layer 110 has a higher silicon (Si) content, the time needed for charge and discharge of the conductive layer 110 is increased in some cases. Also, for example, when the region $R_{WL2}$ (FIG. 6) in the vicinity of the gate insulating film 130 of the conductive layer 110 has a higher silicon (Si) content, an electric field is not preferably provided to the gate insulating film 130 in some cases.

Here, as described above, in the method of manufacturing the semiconductor memory device according to the embodiment, the silicon layers 110B are disposed on the upper surfaces of the interlayer insulating layers 101, and not disposed on the outer peripheral surfaces or the like of the gate insulating films 130, for example. Thus, it is possible not to contain silicon (Si) in the region $R_{WL1}$ in the vicinity of the center in the YZ cross-section of the conductive layer 110 or the region $R_{WL2}$ in the vicinity of the gate insulating film 130 of the conductive layer 110, and alternatively it is possible to have lower silicon (Si) contents in these regions $R_{WL1}$, $R_{WL2}$ than silicon (Si) contents in the other regions. Accordingly, this makes possible to provide the semiconductor memory device preferably that operates with the reduced occurrence of the leak current as described above.

Other Embodiments

The semiconductor memory device according to the first embodiment and the method of manufacturing thereof have been described above. However, the semiconductor memory device according to the first embodiment and the manufacturing methods thereof are merely examples, and specific configuration, method, and the like are adjustable as necessary.

Figure 44:
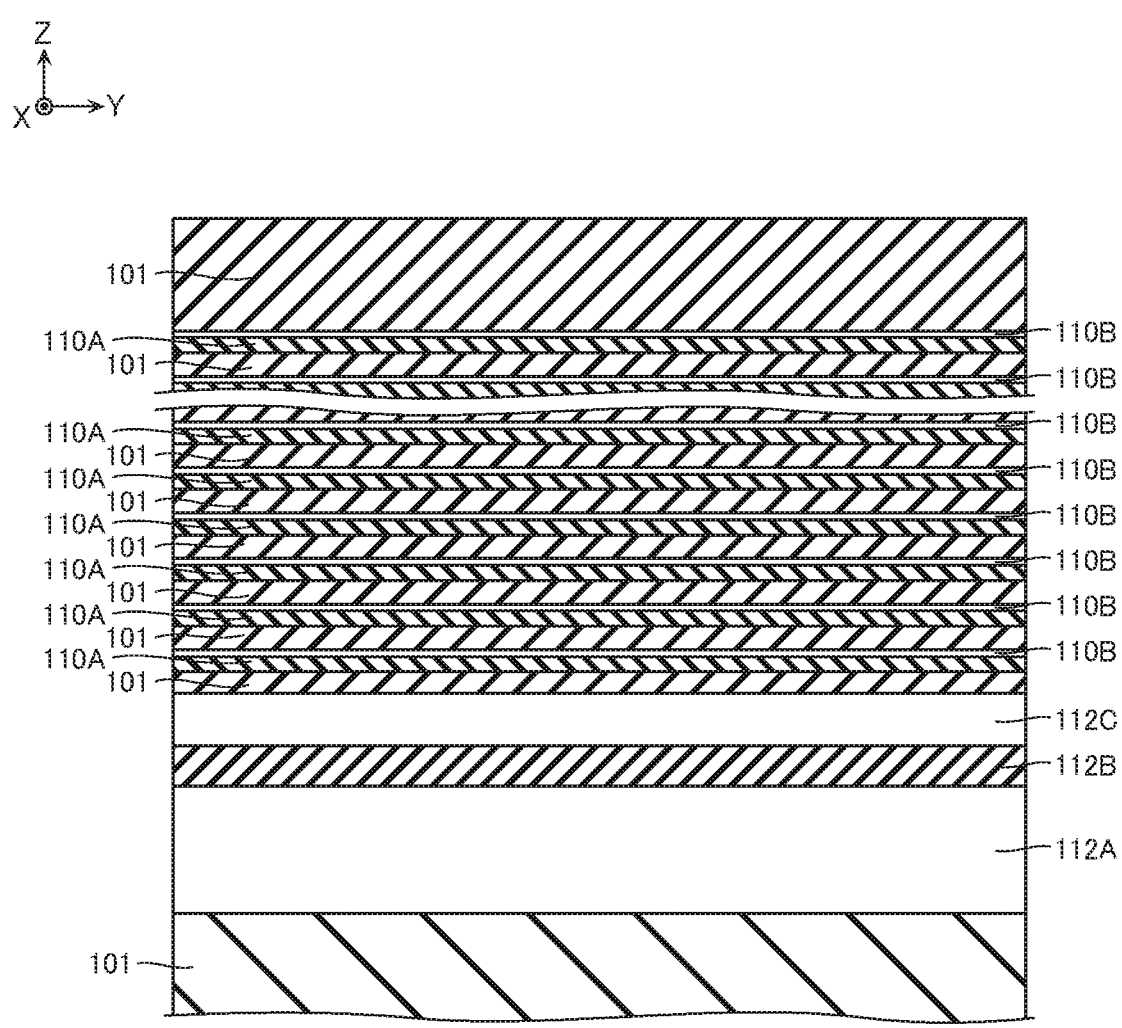
FIG. 44 is a schematic cross-sectional view illustrating a manufacturing method of a semiconductor memory device according to another embodiment.
Figure 45:
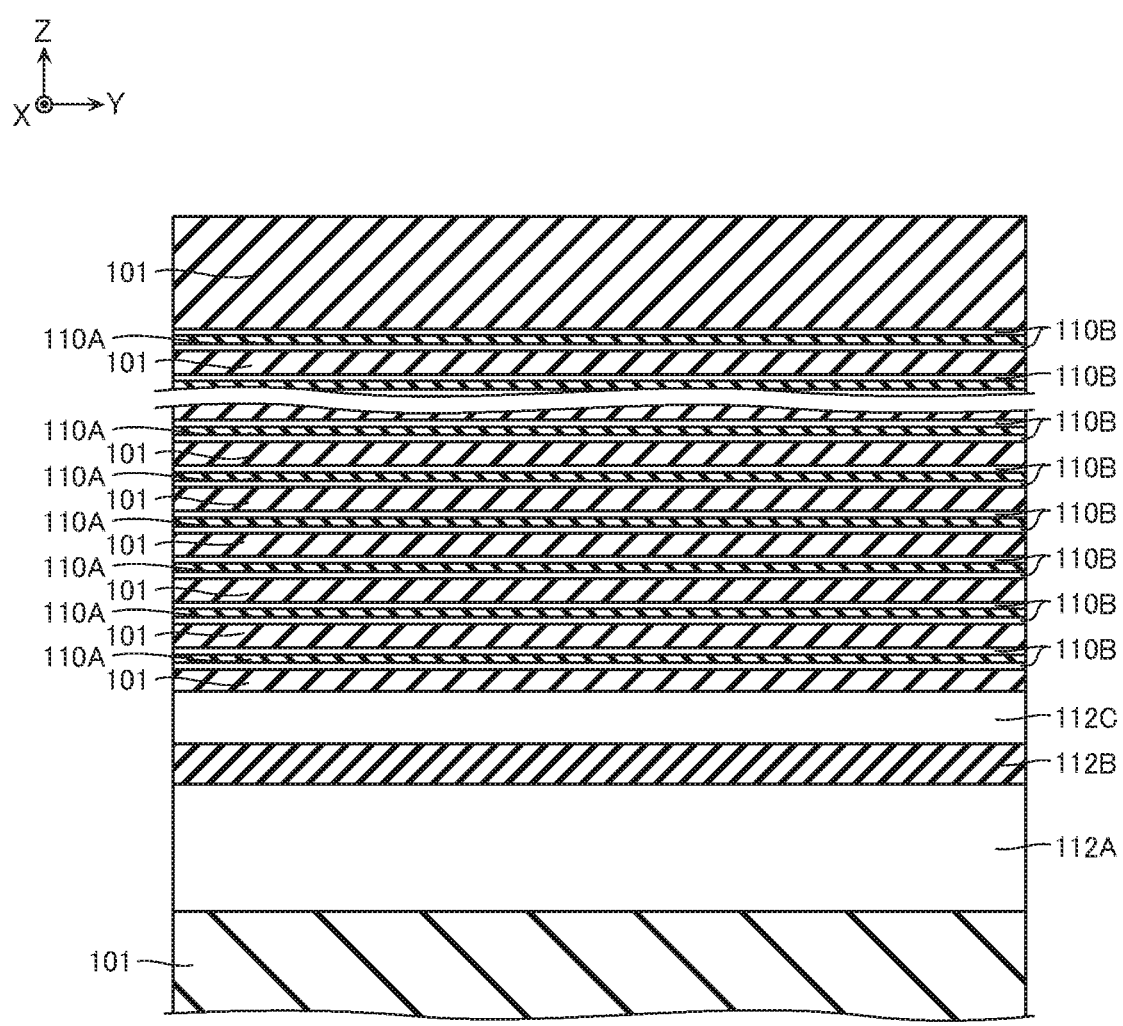
FIG. 45 is a schematic cross-sectional view illustrating a manufacturing method of a semiconductor memory device according to another embodiment.

For example, according to the first embodiment, in the process described with reference to FIG. 15 and the process described with reference to FIG. 21, the silicon layers 110B are formed at the positions in contact with the upper surfaces of the interlayer insulating layers 101 and the lower surfaces of the insulating layers 110A. However, in these processes, for example, as illustrated in FIG. 44 as an example, the silicon layers 110B can be formed at the positions in contact with the lower surfaces of the interlayer insulating layers 101 and the upper surfaces of the insulating layers 110A. Also, for example, as illustrated in FIG. 45 as an example, the silicon layers 110B can be disposed both at the positions in contact with the upper surfaces of the interlayer insulating layers 101 and the lower surfaces of the insulating layers 110A, and at the positions in contact with the lower surfaces of the interlayer insulating layers 101 and the upper surfaces of the insulating layers 110A.

Also, for example, in the examples shown above, in the process described with reference to FIG. 15, and the process described with reference to FIG. 21, the silicon layers 110B are formed on at least one of the upper surfaces and the lower surfaces of all the insulating layers 110A. However, in these processes, for example, as illustrated in FIG. 46 and FIG. 47, the silicon layers 110B can be formed on only the upper surfaces of a part of the insulating layers 110A, only the lower surfaces of a part of the insulating layers 110A, or only the upper and lower surfaces of a part of the insulating layers 110A.

Figure 46:
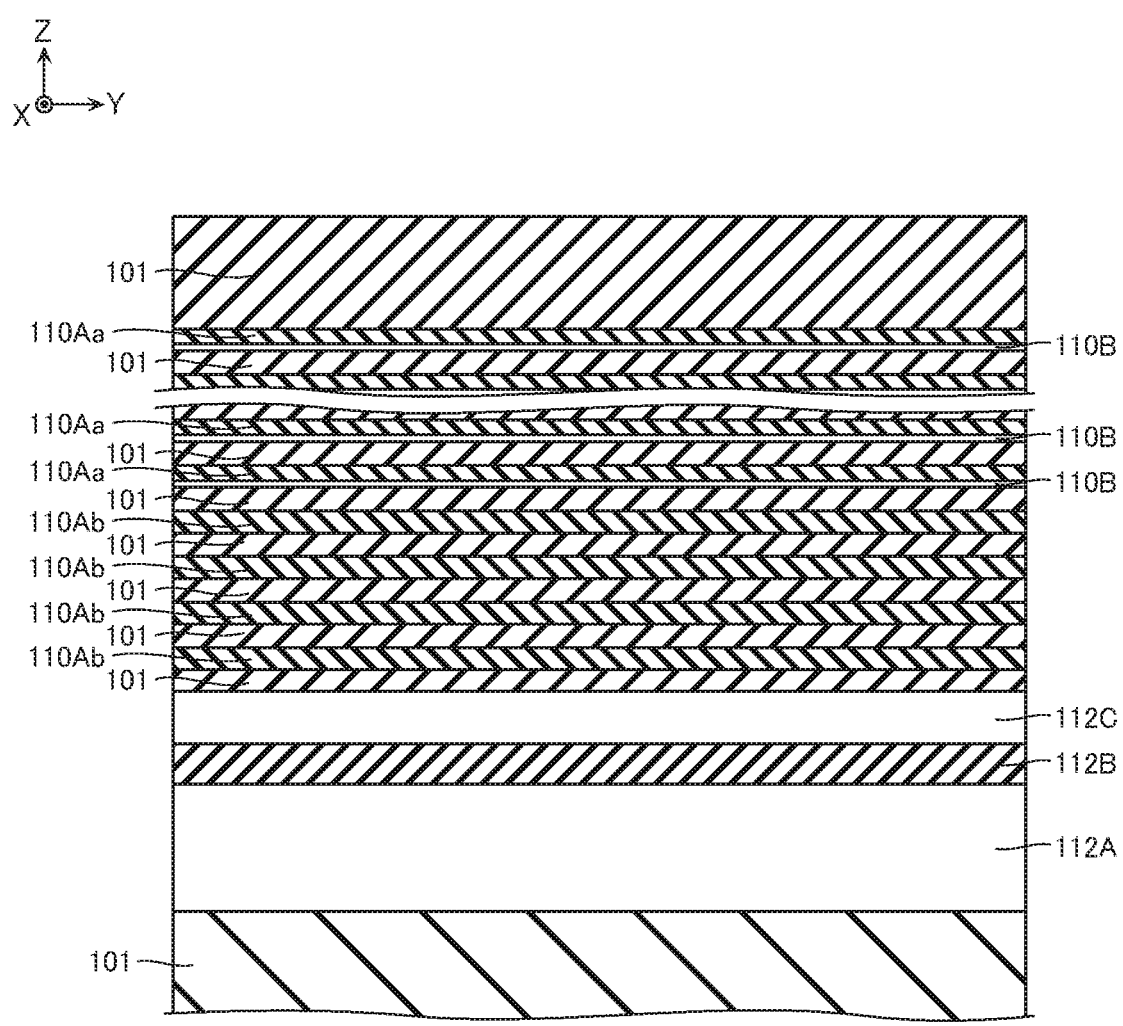
FIG. 46 is a schematic cross-sectional view illustrating a manufacturing method of a semiconductor memory device according to another embodiment.
Figure 47:
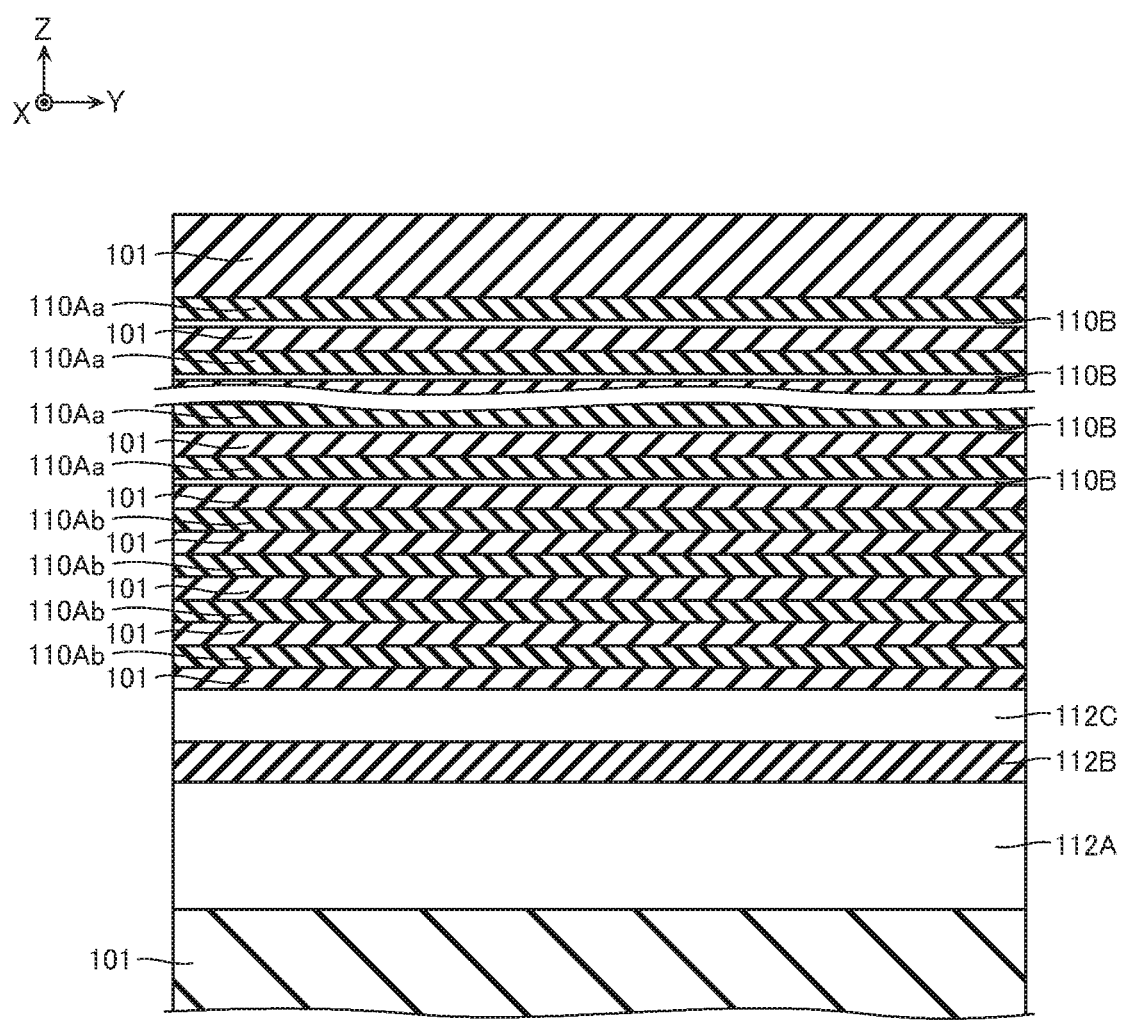
FIG. 47 is a schematic cross-sectional view illustrating the manufacturing method of the semiconductor memory device according to another embodiment.

In FIG. 46 and FIG. 47, the insulating layer 110A on which the silicon layer 110B is provided is indicated as an insulating layer 110Aa, and the insulating layer 110A on which the silicon layer 110B is not provided is indicated as an insulating layer 110Ab.

Also, in such cases, for example, as illustrated in FIG. 46, the thicknesses of the insulating layers 110A in the Z-direction may be adjusted such that the sum of the thicknesses of the insulating layer 110Aa and the silicon layer 110B in the Z-direction becomes approximately equal to the thickness of the insulating layer 110Ab in the Z-direction. Also, for example, as illustrated in FIG. 47, the thicknesses of the insulating layers 110A in the Z-direction may be adjusted such that the thickness of the insulating layer 110Aa in the Z-direction becomes approximately equal to the thickness of the insulating layer 110Ab in the Z-direction.

In the first embodiment, as described above, the silicon layers 110B are formed on the upper surfaces of the interlayer insulating layers 101. As a result, for example, as described with reference to FIG. 6 to FIG. 8, in some cases, the region $R_{WL3}$ in the vicinity of the lower surface of the conductive layer 110 had a higher silicon (Si) content than a silicon (Si) content in the other regions of the conductive layer 110.

Figure 48:
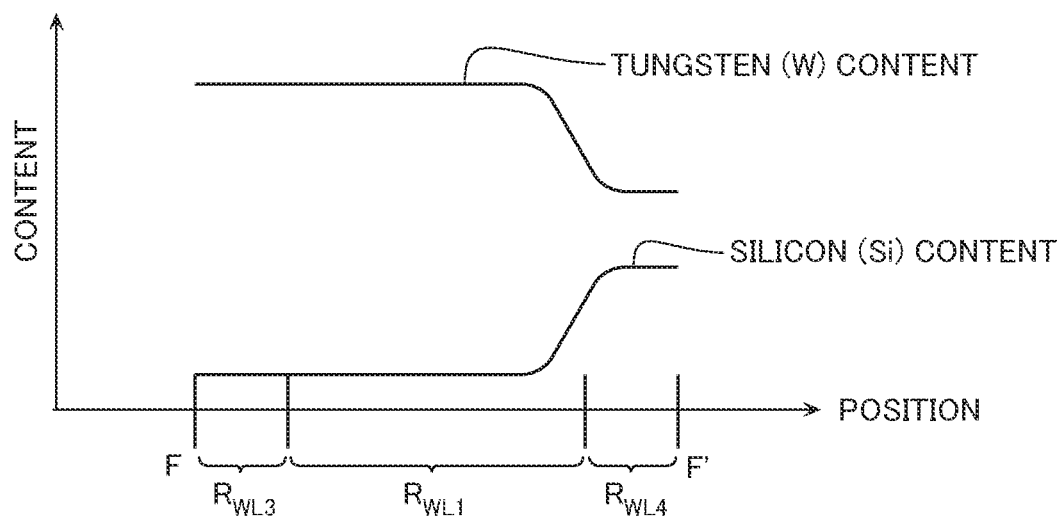
FIG. 48 is a schematic graph illustrating contents of components contained in a part of the semiconductor memory device according to another embodiment.

Here, for example, as described with reference to FIG. 44, when the silicon layers 110B are formed on the lower surfaces of the interlayer insulating layers 101, for example, as illustrated in FIG. 6, FIG. 8 and FIG. 48, the region $R_{WL4}$ in the vicinity of the upper surface of the conductive layer 110 has a higher silicon (Si) content than the silicon (Si) content in the other regions of the conductive layer 110 in some cases.

Figure 49:
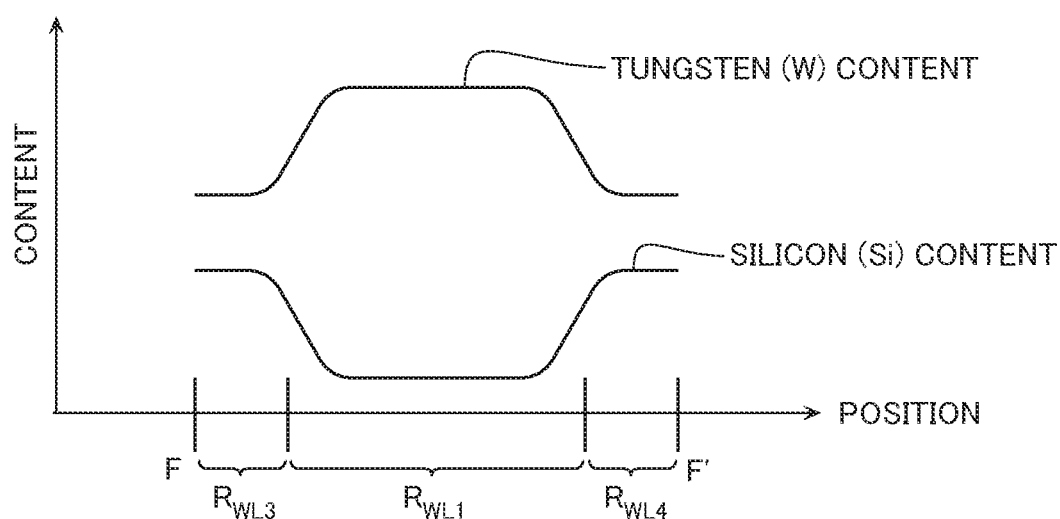
FIG. 49 is a schematic graph illustrating contents of the components contained in a part of the semiconductor memory device according to another embodiment.

Similarly, for example, as described with reference to FIG. 45, when the silicon layers 110B are formed on the upper surfaces and the lower surfaces of the interlayer insulating layers 101, for example, as illustrated in FIG. 6, FIG. 8, and FIG. 49, the region $R_{WL3}$ in the vicinity of the lower surface of the conductive layer 110 and the region $R_{WL4}$ in the vicinity of the upper surface of the conductive layer 110 have higher silicon (Si) contents than the silicon (Si) content in the other regions of the conductive layer 110 in some cases.

Figure 50:
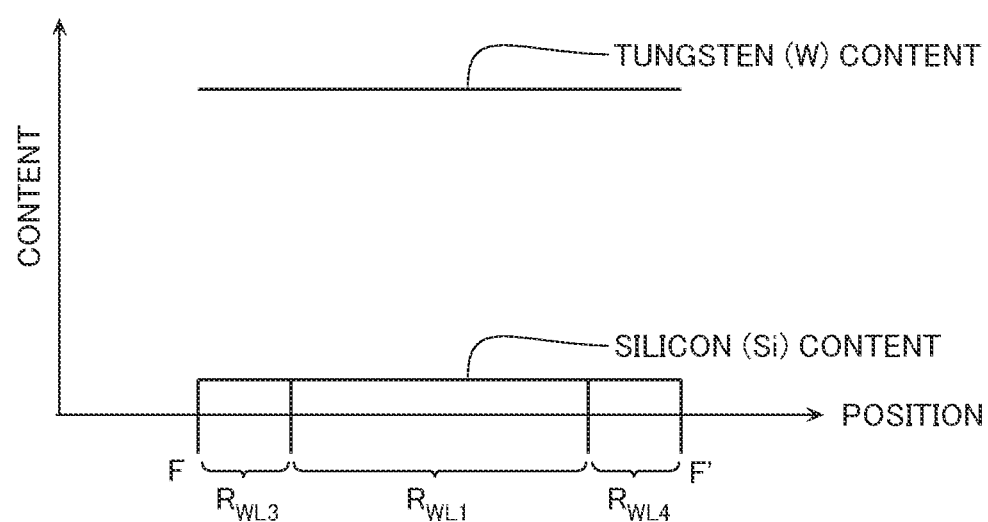
FIG. 50 is a schematic graph illustrating contents of the components contained in a part of the semiconductor memory device according to another embodiment.

Also, for example, when the method as described with reference to FIG. 46 and FIG. 47 is employed, a distribution of silicon (Si) content in the conductive layer 110 (hereinafter referred to as a "conductive layer 110a") corresponding to the insulating layer 110Aa becomes similar to the distribution described with reference to FIG. 6 and FIG. 8; and FIG. 7, FIG. 48, or FIG. 49 in some cases. On the other hand, a distribution of silicon (Si) content in the conductive layer 110 (hereinafter referred to as a "conductive layer 110b") corresponding to the insulating layer 110Ab becomes similar to the distribution as shown in FIG. 6, FIG. 8, and FIG. 50 in some cases. That is, the conductive layer 110b does not contain silicon (Si) in some cases. Also, the regions $R_{WL3}$, $R_{WL4}$ of the conductive layer 110b have lower silicon (Si) contents than silicon (Si) contents in the regions $R_{WL3}$, $R_{WL4}$ of the conductive layer 110a in some cases.

Also, as described above, the insulating layers 110A disposed in the memory hole region $R_{MH}$ are removed in the process as described with reference to FIG. 33 and FIG. 34. Also, in the process as described with reference to FIG. 35 and FIG. 36, the silicon layers 110B disposed in the memory hole region $R_{MH}$ are discharged in a gaseous form by a chemical reaction, or is included in the conductive layer 110. On the other hand, as described above, in the contact connection sub-region $r_{C4T}$ and the contact connection region $R_{BLT}$, the insulating layers 110A and the silicon layers 110B remain without being removed.

Figure 51:
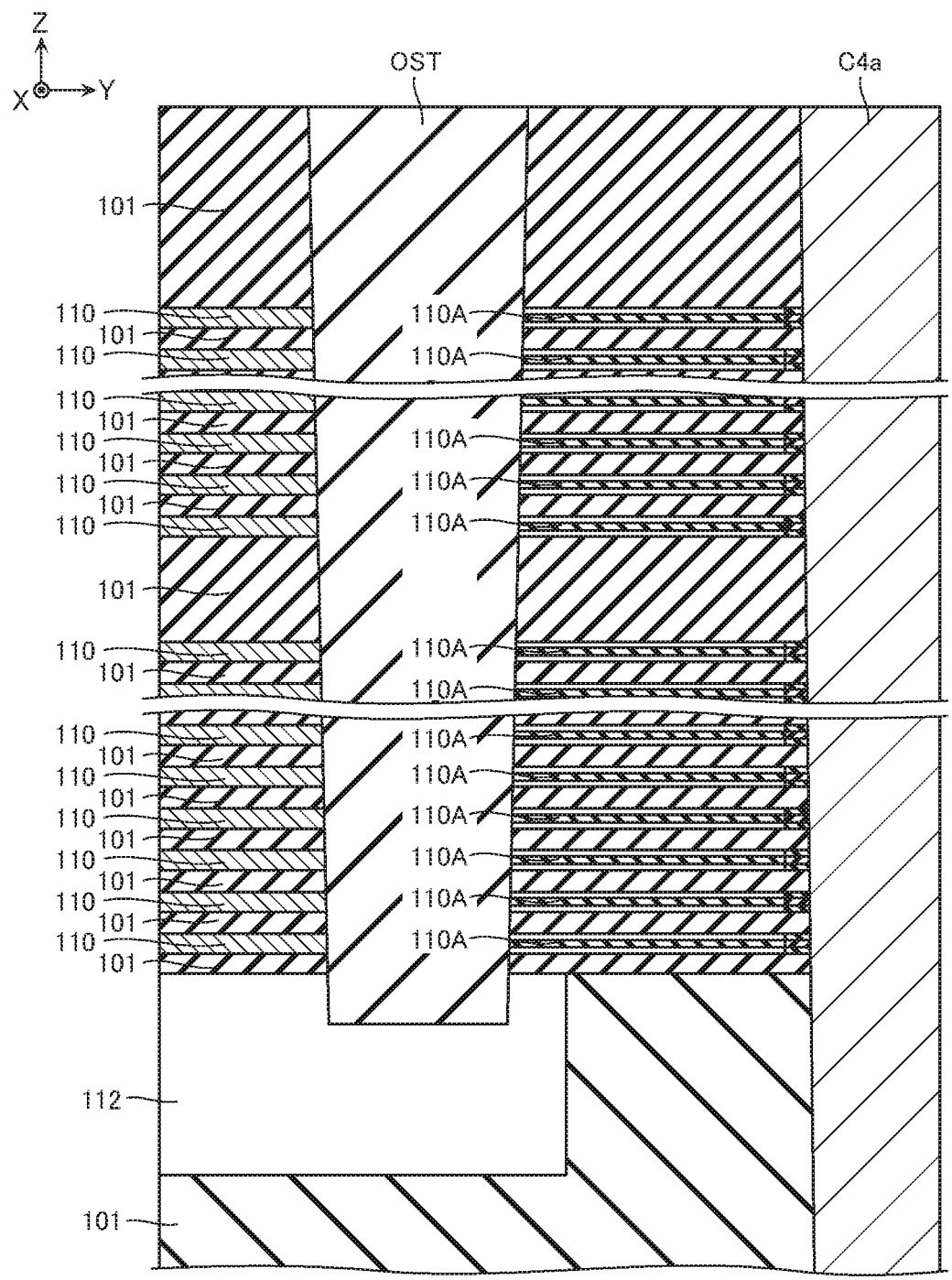
FIG. 51 is a schematic cross-sectional view illustrating a part of a configuration of a semiconductor memory device according to another embodiment.
Figure 52:
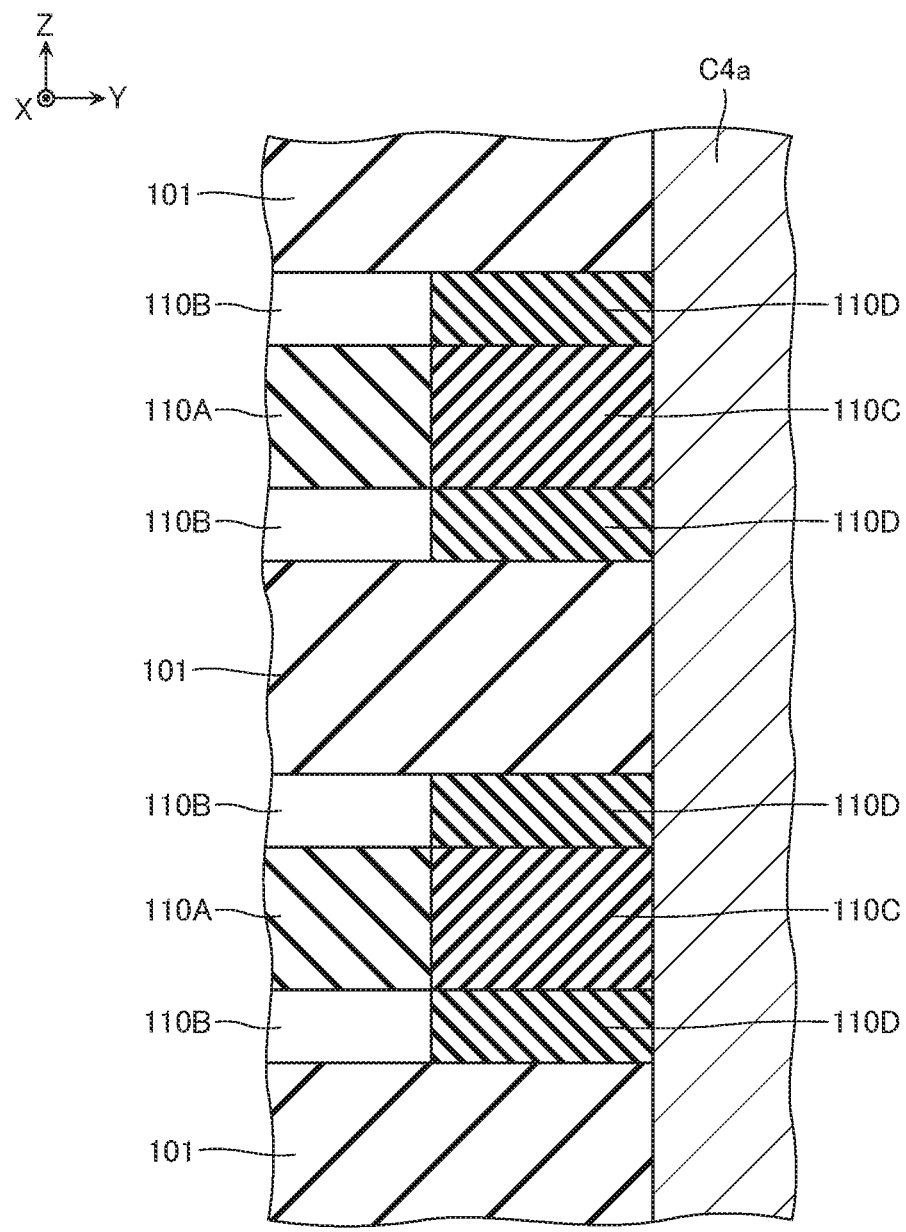
FIG. 52 is a schematic cross-sectional view illustrating a part of the configuration of the semiconductor memory device according to another embodiment.

Accordingly, for example, as described with reference to FIG. 45, when the silicon layers 110B are formed on the upper surface and the lower surface of the insulating layer 110A, for example, as illustrated in FIG. 51 and FIG. 52, the structure remains in the contact connection sub-region $r_{C4T}$ and the contact connection region $R_{BLT}$. The same applies in the case where the method as described with reference to FIG. 44, FIG. 46, or FIG. 47 is employed.

Figure 53:
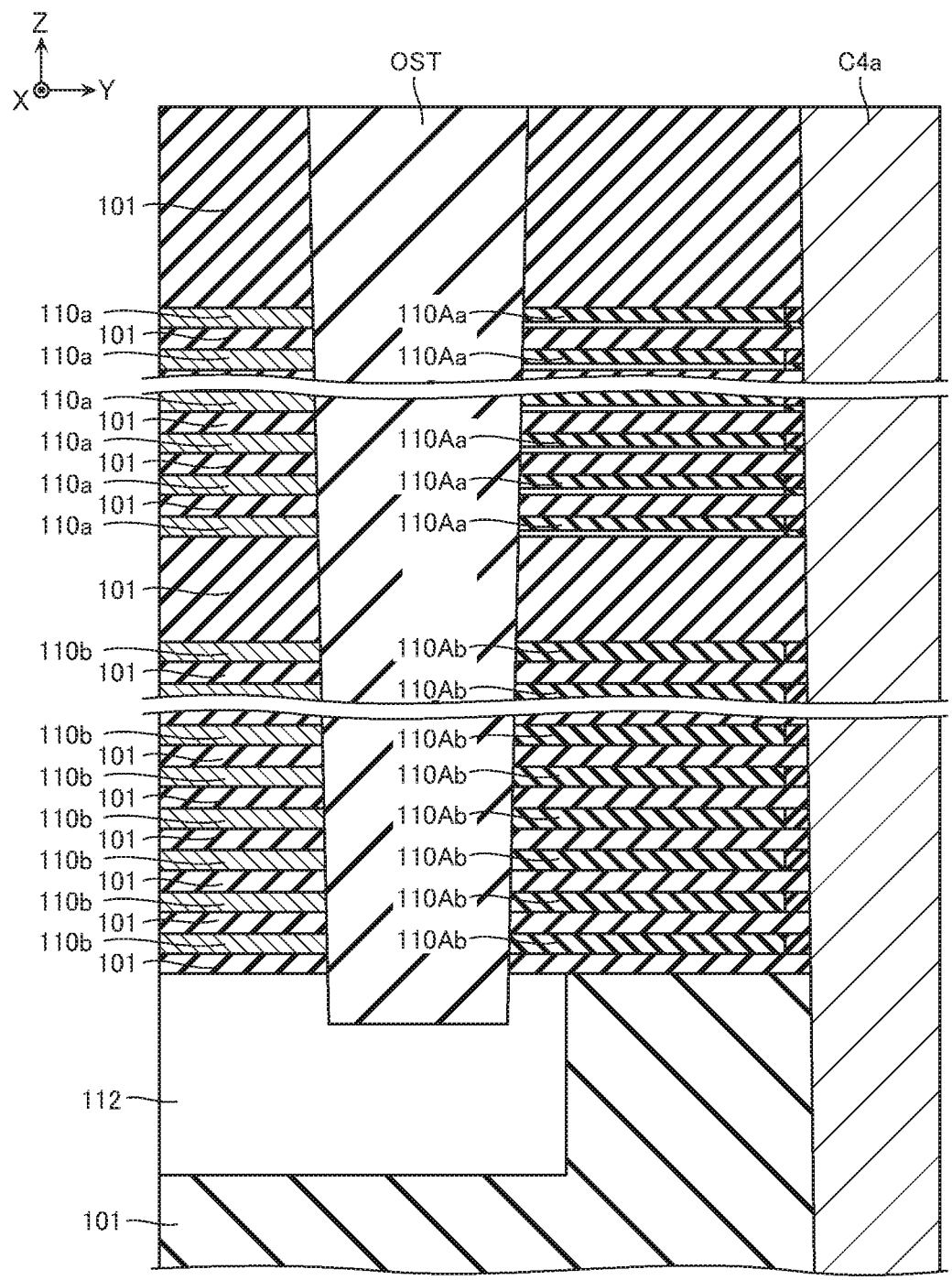
FIG. 53 is a schematic cross-sectional view illustrating a part of a configuration of a semiconductor memory device according to another embodiment.

Also, as described with reference to FIG. 46, for example, when the thicknesses of the insulating layers 110A in the Z-direction are adjusted such that the sum of the thicknesses of the insulating layer 110Aa and the silicon layer 110B in the Z-direction becomes approximately equal to the thickness of the insulating layer 110Ab in the Z-direction, the thicknesses of the conductive layers 110a, 110b in the Z-direction, which correspond to the insulating layers 110Aa, 110Ab, become approximately equal, for example as illustrated in FIG. 53.

Figure 54:
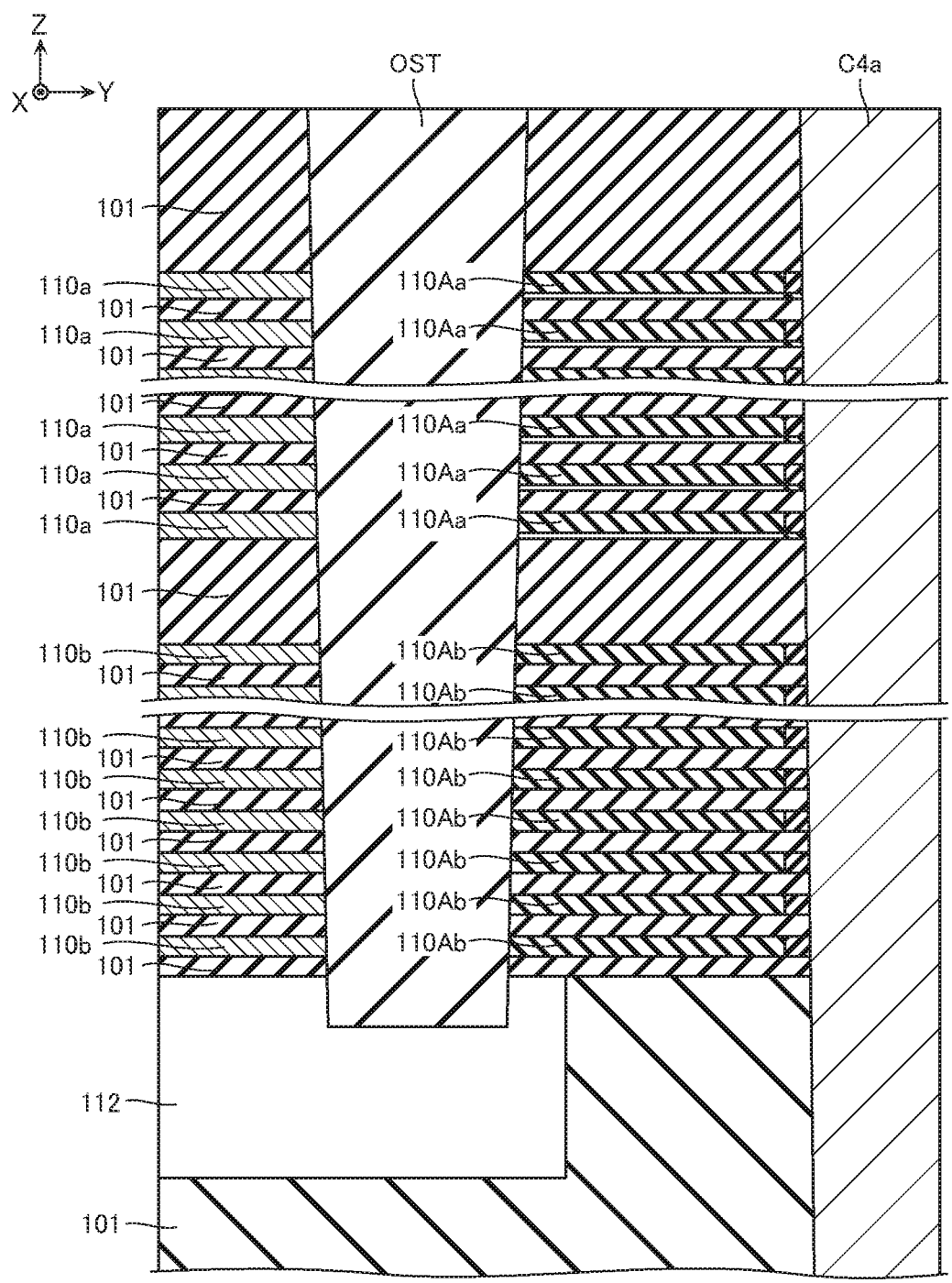
FIG. 54 is a schematic cross-sectional view illustrating a part of a configuration of a semiconductor memory device according to another embodiment.

On the other hand, as described with reference to FIG. 47, for example, when the thicknesses of the insulating layers 110A in the Z-direction are adjusted such that the thickness of the insulating layer 110Aa in the Z-direction become approximately equal to the thickness of the insulating layer 110Ab in the Z-direction, the thickness of the conductive layer 110a in the Z-direction corresponding to the insulating layer 110Aa becomes larger than the thickness of the conductive layer 110b in the Z-direction corresponding to the insulating layer 110Ab, as illustrated in FIG. 54, for example.

In the example as described above, the contact connection sub-regions $r_{C4T}$ and the contact connection regions $R_{BLT}$ are illustrated as the regions where the insulating layers 110A and the silicon layers 110B remain in the final structure. However, these regions are illustrative only and the regions where the insulating layers 110A and the silicon layers 110B remain in the final structure may be any regions in the memory die MD. Also, the memory die MD need not include such regions where the insulating layers 110A and the silicon layers 110B remain in the final structure.

[Others]
While certain embodiments have been described, these embodiments have been presented by way of example only, and are not intended to limit the scope of the inventions. Indeed, the novel methods and systems described herein may be embodied in a variety of other forms: furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:
1. A semiconductor memory device comprising:
a plurality of conductive layers and a plurality of interlayer insulating layers alternately arranged in a first direction;
a semiconductor layer extending in the first direction and being opposed to the plurality of conductive layers; and
a gate insulating film disposed between the plurality of conductive layers and the semiconductor layer, wherein
the plurality of interlayer insulating layers include a first interlayer insulating layer and a second interlayer insulating layer adjacent in the first direction, and
the plurality of conductive layers include a first conductive layer disposed between the first interlayer insulating layer and the second interlayer insulating layer, wherein
the first conductive layer includes:
a first region;
a second region disposed between the first region and the gate insulating film; and
a third region disposed between the first region and the first interlayer insulating layer, wherein
the first region to the third region contain a metal,
the third region contains silicon (Si),
the first region does not contain silicon (Si) or has a lower silicon (Si) content than a silicon (Si) content in the third region, and
the second region does not contain silicon (Si) or has a lower silicon (Si) content than the silicon (Si) content in the third region.

2. The semiconductor memory device according to claim 1, wherein
the first conductive layer includes a fourth region disposed between the first region and the second interlayer insulating layer,
the fourth region contains a metal and silicon (Si),
the first region does not contain silicon (Si) or has a lower silicon (Si) content than a silicon (Si) content in the fourth region, and
the second region does not contain silicon (Si) or has a lower silicon (Si) content than the silicon (Si) content in the fourth region.

3. The semiconductor memory device according to claim 1, wherein
the first conductive layer includes a fourth region disposed between the first region and the second interlayer insulating layer,
the fourth region contains a metal, and
the fourth region does not contain silicon (Si) or has a lower silicon (Si) content than a silicon (Si) content in the third region.

4. The semiconductor memory device according to claim 1, wherein
the plurality of interlayer insulating layers include a third interlayer insulating layer and a fourth interlayer insulating layer adjacent in the first direction, and the plurality of conductive layers include a second conductive layer disposed between the third interlayer insulating layer and the fourth interlayer insulating layer, wherein the second conductive layer includes:
   a fifth region;
   a sixth region disposed between the fifth region and the gate insulating film; and
   a seventh region disposed between the fifth region and the third interlayer insulating layer, wherein the fifth region to the seventh region contain a metal, the seventh region contains silicon (Si), the fifth region does not contain silicon (Si) or has a lower silicon (Si) content than a silicon (Si) content in the seventh region, and the sixth region does not contain silicon (Si) or has a lower silicon (Si) content than the silicon (Si) content in the seventh region.

5. The semiconductor memory device according to claim 4, wherein the second conductive layer includes an eighth region disposed between the fifth region and the fourth interlayer insulating layer, the eighth region contains a metal and silicon (Si), the fifth region does not contain silicon (Si) or has a lower silicon (Si) content than a silicon (Si) content in the eighth region, and the sixth region does not contain silicon (Si) or has a lower silicon (Si) content than the silicon (Si) content in the eighth region.

6. The semiconductor memory device according to claim 1, wherein the plurality of interlayer insulating layers include a fifth interlayer insulating layer and a sixth interlayer insulating layer adjacent in the first direction, and the plurality of conductive layers include a third conductive layer disposed between the fifth interlayer insulating layer and the sixth interlayer insulating layer, wherein the third conductive layer includes:
   a ninth region;
   a tenth region disposed between the ninth region and the gate insulating film, and
   an eleventh region disposed between the ninth region and the fifth interlayer insulating layer, wherein the ninth region to the eleventh region contain a metal;

the ninth region does not contain silicon (Si) or has a lower silicon (Si) content than the silicon (Si) content in the third region, the tenth region does not contain silicon (Si) or has a lower silicon (Si) content than the silicon (Si) content in the third region, and the eleventh region does not contain silicon (Si) or has a lower silicon (Si) content than the silicon (Si) content in the third region.

7. The semiconductor memory device according to claim 6, wherein the third conductive layer includes a twelfth region disposed between the ninth region and the sixth interlayer insulating layer, the twelfth region contains a metal, the twelfth region does not contain silicon (Si), or the twelfth region has a lower silicon (Si) content than the silicon (Si) content in the third region.

* * * * *